(12) United States Patent
Matsui

(10) Patent No.: US 7,155,627 B2
(45) Date of Patent: Dec. 26, 2006

(54) MEMORY SYSTEM AND DATA TRANSMISSION METHOD

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 84 days.

(21) Appl. No.: 10/647,157

(22) Filed: Aug. 22, 2003

(65) Prior Publication Data
US 2004/0105292 A1    Jun. 3, 2004

(30) Foreign Application Priority Data
Aug. 23, 2002  (JP) ............................. 2002-244322
Jun. 19, 2003  (JP) ............................. 2003-175431

(51) Int. Cl.
*G06F 13/14* (2006.01)

(52) U.S. Cl. ...................... 713/401; 713/400; 713/500; 713/501; 713/503; 713/600; 713/601

(58) Field of Classification Search .................. 365/52, 365/63, 194, 233, 230.03; 713/400–401, 713/500–503, 600–601
See application file for complete search history.

(56) References Cited

U.S. PATENT DOCUMENTS

| | | | | |
|---|---|---|---|---|
| 5,689,643 | A * | 11/1997 | O'Hanlan .................... | 370/520 |
| 5,923,193 | A * | 7/1999 | Bloch et al. ................. | 327/141 |
| 6,445,624 | B1 * | 9/2002 | Janzen et al. ................ | 365/191 |
| 6,625,687 | B1 * | 9/2003 | Halbert et al. ................ | 365/52 |
| 6,628,538 | B1 * | 9/2003 | Funaba et al. ................ | 365/63 |
| 6,643,787 | B1 * | 11/2003 | Zerbe et al. ................. | 713/400 |
| 6,654,270 | B1 * | 11/2003 | Osaka et al. .................. | 365/52 |
| 6,668,292 | B1 * | 12/2003 | Meyer et al. ................. | 710/61 |
| 6,762,962 | B1 * | 7/2004 | Nagashima ................... | 365/63 |
| 6,889,334 | B1 * | 5/2005 | Magro et al. ................ | 713/500 |
| 6,977,832 | B1 * | 12/2005 | Isa et al. ...................... | 365/51 |
| 7,012,956 | B1 * | 3/2006 | Thomsen et al. ........... | 375/224 |
| 7,043,652 | B1 * | 5/2006 | Matsui ........................ | 713/400 |
| 2004/0196080 | A1 * | 10/2004 | Akasaki et al. ............. | 327/161 |

FOREIGN PATENT DOCUMENTS

| | | |
|---|---|---|
| JP | 10-293635 | 11/1998 |
| JP | 2001-256772 | 9/2001 |
| KR | 1998-032834 | 7/1998 |
| WO | WO 02/23352 A2 | 3/2002 |

* cited by examiner

*Primary Examiner*—A. Elamin
(74) *Attorney, Agent, or Firm*—Scully, Scott, Murphy & Presser, P.C.

(57) ABSTRACT

A memory system of a high-speed operation can be realized by reducing an influence of reflection signals etc. caused by branching and impedance mismatching in various wirings between a memory controller and a memory module, and an influence due to transmission delays of data, command/address, and clocks in the memory module. To this end, a memory system comprises a memory controller and a memory module mounted with DRAMs. A buffer is mounted on the memory module. The buffer and the memory controller are connected to each other via data wiring, command/address wiring, and clock wiring. The DRAMs and the buffer on the memory module are connected to each other via internal data wiring, internal command/address wiring, and internal cock wiring. The data wiring, the command/address wiring, and the clock wiring may be connected to buffers of other memory modules in cascade. Between the DRAMs and the buffer on the memory module, high-speed data transmission is implemented using data phase signals synchronous with clocks.

11 Claims, 71 Drawing Sheets

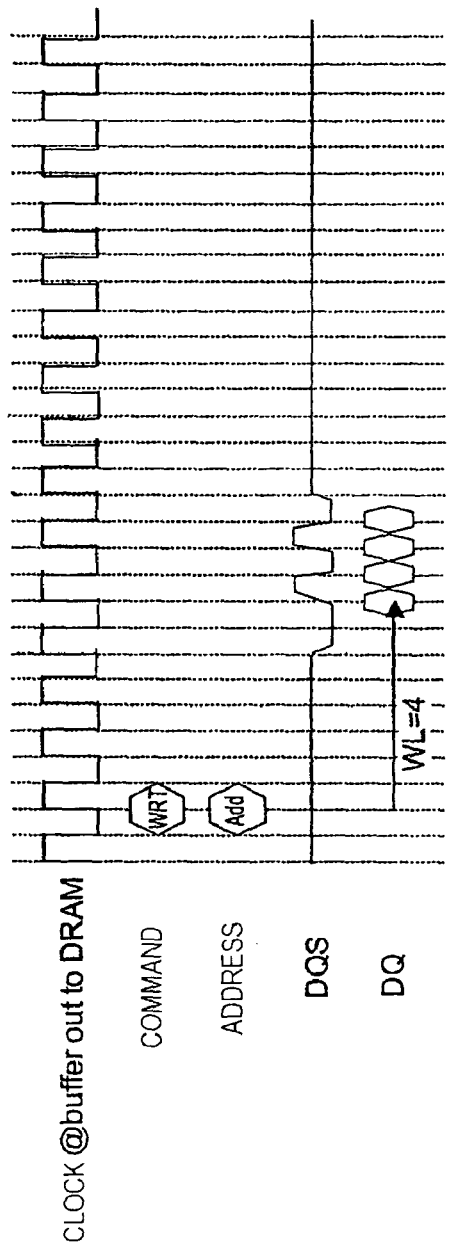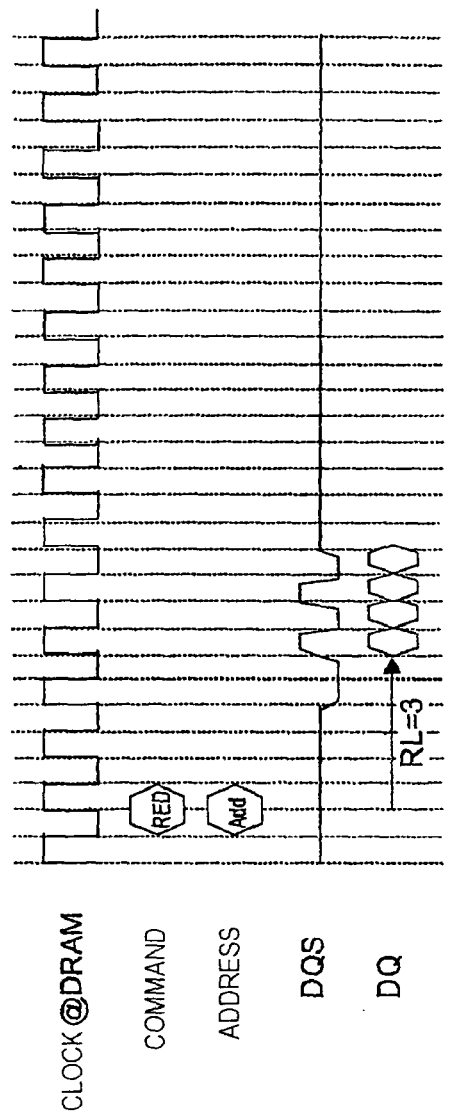
FIG. 17A
FIG. 17B

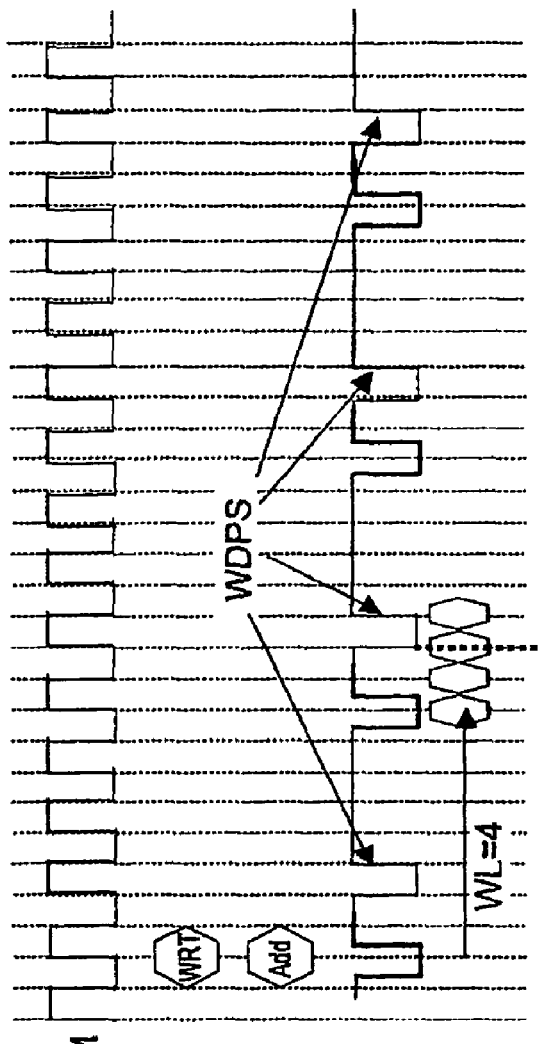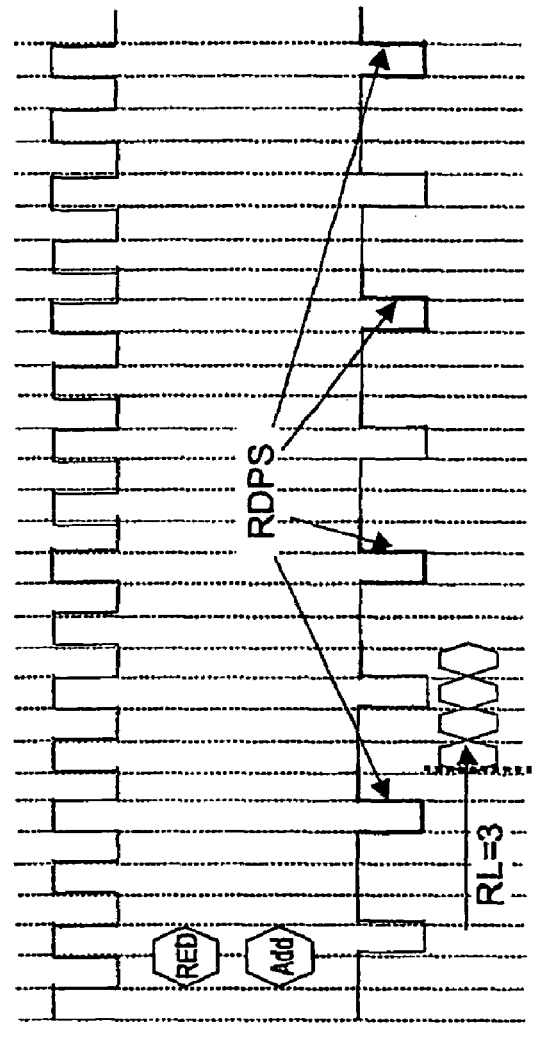
FIG. 21A
FIG. 21B

MEMORY SYSTEM AND DATA TRANSMISSION METHOD

BACKGROUND OF THE INVENTION

1. Field of the Invention

The present invention relates to a memory system having a configuration that enables high-speed operation, and further relates to a data transmission system that is used in the memory system.

2. Description of the Related Art

Conventionally, in the memory systems of this type, interfaces have been studies that enable operations at high speed and with low signal amplitude. As a standard for such interfaces, SSTL (Stub Series Terminated Transceiver Logic) has been proposed. Further, with respect to the memory systems having DRAMs as memory devices, there have been proposed such memory systems employing a DDR (Double Data Rate) system wherein a data transmission speed can be twice by inputting/outputting data synchronously with both edges of rise (leading edge) and fall (trailing edge) of clocks, thereby to operate the DRAMs at high speed.

Conventionally, as a memory system employing the foregoing SSTL and DDR, there has been proposed such a memory system wherein a plurality of memory modules are mounted on a mother board, and these memory modules are controlled by a memory controller called a chipset. In this case, a plurality of DRAMs are mounted on each memory module.

As a memory system of this type, JP-A-2001-256772 (hereinafter referred to as "Reference 1") discloses a memory system wherein a plurality of memory modules each mounted with a plurality of DRAMs are mounted on a mother board. The disclosed memory module comprises a plurality of DRAMs arranged on a rectangular memory module board in parallel in a longitudinal direction thereof, and a command/address buffer and a PLL chip for distributing clocks to the DRAMs, which are disposed between the DRAMs. Each DRAM on the memory module board is connected to module data wiring extending in a short-side direction of the module board, while the command/address buffer and the PLL chip are connected to module command/address wiring and module clock wiring extending in the short-side direction of the module board. Further, for distributing commands/addresses and clocks to the DRAMs from the command/address buffer and the PLL chip, module command/address distributing wiring and module clock distributing wiring are drawn out in the longitudinal direction of the module board.

In this configuration, data signals are directly given to the DRAMs on each memory module from a memory controller provided on the mother board, while command/address signals and clock signals are given to the DRAMs on each memory module from the memory controller via the command/address buffer and the PLL chip, respectively. In the memory system using the foregoing memory modules, when the single memory module is taken into consideration, it is hardly necessary to form branch wiring on the memory module relative to signal wiring on the mother board. Therefore, there is a merit that it is possible to reduce waveform distortion or disturbance due to undesirable signal reflection caused by branch wiring. Further, there is also a merit that access time can be shortened.

JP-A-H10-293635 (hereinafter referred to as "Reference 2") discloses a memory system wherein a memory controller and a plurality of memory modules are mounted on a mother board. The disclosed memory system ensures a setup time and a hold time of each memory module to enable high-speed signal transfer by matching propagation times of clock signals and data signals outputted from the memory controller. Further, Reference 2 also describes a method of stably feeding clocks. Specifically, clocks that have twice inputted clocks in frequency are produced, and signals and outputs of SDRAMs are controlled synchronously with the produced clocks in a memory module or memory LSI. In this connection, Reference 2, FIG. 28, shows a configuration wherein clocks having a frequency of 2θ are produced at the memory controller, and the clocks are divided to half in frequency so as to be clocks having a frequency of θ, then transmitted to the memory module.

Further, Reference 2, FIG. 34, shows a configuration wherein the clock frequency given from the memory controller is made twice and fed to memories in the memory module. Accordingly, Reference 2 discloses a technique wherein clocks of a predetermined frequency are transmitted/received between the memory controller and the memory module, and the frequency of the clocks is increased twice in the memories such as SDRAMs or the memory controller.

In other words, Reference 2 describes that the frequency lower than the clock frequency within the memory is transmitted/received between the memory module and the memory controller.

In Reference 1, the module data wiring extending in the short-side direction of the module board, and the module command/address distributing wiring and the module clock distributing wiring drawn out onto the DRAMs from the command/address buffer and the PLL chip have different lengths from each other. Therefore, data arrives at each DRAM at timing that differs from arrival timing of command/address and clock signals, and thus, it is difficult to adjust the timing therebetween.

On the other hand, in Reference 2, inasmuch as the clocks having the frequency lower than the clock frequency within the memory module are transmitted/received between the memory controller and the memory module, a data transfer time is prolonged. Further, in the configuration of Reference 2, since the transfer speed of data can not exceed the operation speed of the memory, there arises a limitation about the speedup and the number of memory modules that can be mounted. In addition, Reference 1 and 2 teaches nothing about a technique of transmitting data at high speed between the memory controller and the memory module.

SUMMARY OF THE INVENTION

Therefore, it is an object of the present invention to provide a memory system that can easily adjust timing between data signals, and command/address and clock signals in each memory module.

It is another object of the present invention to provide a memory system that can reduce reflection signals caused by branching and impedance mismatching and, as a result, that can operate at high speed.

It is still another object of the present invention to provide a data transfer method that can transfer data at high speed between two circuits provided in a module.

A specific object of the present invention is to provide a data transfer method that can transfer data at high speed between a buffer and DRAMs in a memory module.

According to the present invention, there is obtained a memory system wherein a buffer having a predetermined function is mounted on a memory module, and point-topoint connection is provided between a memory controller and a memory module and between memory modules. According to this configuration, signal quality at high frequencies can be improved. Further, signal wirings between the buffer and DRAMs on the memory module can be connected using wiring layout that includes only electrically ignorable branching and does not have electrically influential branching, which results in improvement of the signal quality.

Further, according to the present invention, a higher speed memory system can be realized by using a data transmission/reception system employing bidirectional data phase signals on each memory module.

Here, explanation will be given about a buffer according to the present invention. The buffer or buffers are provided on a memory module. Data wiring between a memory controller and a memory module or between memory modules is connected to a buffer on the memory module in a grouped fashion. In a memory system provided with a plurality of memory modules, buffers on the adjacent memory modules are connected to each other via data lines in a point-to-point fashion. In this case, a data signal is transferred on the data lines at a speed that is n times relative to a data frequency of a DRAM. Further, when compressed into packets and multiplexed, the number of data lines is reduced to about 1/n (not necessarily 1/n because there is actually an indivisible case or the like).

On the other hand, command/address wiring is connected to the memory controller and between the buffers of the memory modules per group of data wiring and, like the data wiring, is point-to-point connected between the memory controller and the memory module and between the memory modules. A command/address signal is transferred at a speed that is m times a command/address signal frequency of the DRAM and, when compressed into packets, the number of signal lines is reduced to about 1/m (also not necessarily 1/m because there is actually an indivisible case or the like).

The buffer provided on each memory module has a function of receiving a data signal or a command/address signal from the memory controller or the memory module of the prior stage, encoding packets of the data or command/address signal to provide the number of signals corresponding to the DRAMs on the subject memory module, and transmitting them to the DRAMs at a 1/n or 1/m times frequency. Further, the buffer also has a function of transferring or transmitting a command/address signal to the cascade-connected memory module of the next stage, and a function of bidirectionally transmitting/receiving a data signal relative to the next-stage memory module. The respective signals on the memory modules are connected with wiring layout having only such branching that can be electrically ignored. Identification of a packet transmission destination of the data or command/address signal is carried out using a module ID signal.

Characteristic aspects or modes of the present invention will be enumerated hereinbelow.

According to a first mode of the present invention, there is obtained a memory system having a module mounted with a plurality of memory circuits, and a controller for controlling the plurality of memory circuits, characterized in that the module is mounted with at least one buffer connected to the controller via data wiring for data transmission, and the buffer and the plurality of memory circuits are connected to each other via internal data wiring in the module.

According to a second mode of the present invention, there is obtained a memory system according to the first mode, wherein the module is mounted with a plurality of buffers, and the plurality of buffers are connected to the controller via the data wiring.

According to a third mode of the present invention, there is obtained a memory system according to the first or second mode, wherein the buffer is further connected to the controller via command/address wiring and clock wiring.

According to a fourth mode of the present invention, there is obtained a memory system according to the third mode, wherein the buffer is connected to the memory circuits via internal command/address wiring and internal clock wiring corresponding to the command/address wiring and the clock wiring, respectively.

According to a fifth mode of the present invention, there is obtained a memory system according to the fourth mode, wherein the internal command/address wiring and the internal clock wiring are commonly used for the memory circuits.

According to a sixth mode of the present invention, there is obtained a memory system according to any one of the first to fifth modes, wherein each of the memory circuits is a DRAM, and data is transmitted/received bidirectionally in the data wiring between the controller and the buffer.

According to a seventh mode of the present invention, there is obtained a memory system having a plurality of modules each mounted with a plurality of memory circuits, and a controller for controlling the memory circuits of the plurality of modules, characterized in that each of the modules is provided with at least one buffer, and the buffer of each module is connected to the buffer of another module and/or the controller via data wiring for data transmission.

According to an eighth mode of the present invention, there is obtained a memory system according to the seventh mode, wherein the buffer of each module is connected to the buffer of another module and/or the controller via command/address wiring and clock wiring.

According to a ninth mode of the present invention, there is obtained a memory system according to the seventh or eighth mode, wherein the data wiring forms a daisy chain by connecting the buffers of the plurality of modules and the controller in cascade.

According to a tenth mode of the present invention, there is obtained a memory system according to the seventh mode, wherein each of the buffers of the plurality of modules is directly connected to the controller via the data wiring.

According to an eleventh mode of the present invention, there is obtained a memory system according to the tenth mode, wherein each of the buffers of the plurality of modules is further directly connected to the controller via command/address wiring and clock wiring.

According to a twelfth mode of the present invention, there is obtained a memory system according to the eleventh mode, further comprising buffers provided on other modules and each connected to one of the buffers in cascade via data wiring, command/address wiring, and clock wiring.

According to a thirteenth mode of the present invention, there is obtained a memory system according to any one of the eighth to twelfth modes, wherein the memory circuits of each module are grouped into a plurality of ranks, and the memory circuits, belonging to the same rank, of the plurality of modules are simultaneously accessible.

According to a fourteenth mode of the present invention, there is obtained a memory system according to the twelfth or thirteenth mode, wherein a data transmission speed on the data wiring is higher than a data transmission speed on internal data wiring between the buffer and each of the memory circuits on each module.

According to a fifteenth mode of the present invention, there is obtained a memory system according to the fourteenth mode, wherein transmission speeds on the command/address wiring and the clock wiring are higher than transmission speeds on internal command/address wiring and internal clock wiring, corresponding to the command/address wiring and the clock wiring, between the buffer and the memory circuits on each module.

According to a sixteenth mode of the present invention, there is obtained a memory system according to the fourteenth mode, wherein data for the buffers of the plurality of modules are transmitted in the data wiring in the form of a packet, and the buffers separate the data in the form of the packet.

According to a seventeenth mode of the present invention, there is obtained a memory system according to the fifteenth mode, wherein commands/addresses and clocks for the buffers of the plurality of modules are transmitted in the command/address wiring and the clock wiring in the form of packets, and each of the buffers has a function of separating the commands/addresses and dividing the clocks in frequency.

According to an eighteenth mode of the present invention, there is obtained a memory system having a module mounted with a buffer and a memory circuit connected to the buffer, and a memory controller connected to the buffer on the module, characterized in that a transmission speed between the memory controller and the buffer is higher than a transmission speed between the buffer on the module and the memory circuit connected to the buffer.

According to a nineteenth mode of the present invention, there is obtained a memory system according to the eighteenth mode, wherein a plurality of modules each having the buffer and the memory circuit are provided, and the buffers of the respective modules are connected in turn in cascade relative to the memory controller via data wiring, command/address wiring, and clock wiring, and wherein the memory circuit and the buffer are connected to each other on each module via internal data wiring, internal command/address wiring, and internal clock wiring, and transmission speeds on the data wiring, the command/address wiring, and the clock wiring are higher than transmission speeds on the internal data wiring, the internal command/address wiring, and the internal clock wiring.

According to a twentieth mode of the present invention, there is obtained a memory system according to the nineteenth mode, wherein the memory circuit of each module is a DRAM, data phase signals are transmitted bidirectionally between the buffer and the DRAM on each module at timing that avoids collision therebetween, and each of the DRAM and the buffer produces internal clocks based on the received data phase signal and performs reception/transmission of data according to the internal clocks.

According to a twenty-first mode of the present invention, there is obtained a data transmission method for transmitting/receiving data bidirectionally between a first and a second device, the first device receiving data according to first internal clocks, and the second device receiving data according to second internal clocks, characterized in that a first and a second data phase signal are continuously transmitted bidirectionally on the same wiring between the first and second devices at timing that avoid collision therebetween, the first device refers to timing of the first data phase signal to thereby transmit data to the second device, while the second device refers to timing of the second data phase signal to thereby transit data to the first device.

According to a twenty-second mode of the present invention, there is obtained a data transmission method according to the twenty-first mode, wherein the second device produces the second internal clocks according to the received first data phase signal and receives the data from the first device according to the second internal clocks, while the first device produces the first internal clocks according to the received second data phase signal, produces the second data phase signal according to the first internal clocks, and receives the data from the second device according to the first internal clocks.

According to a twenty-third mode of the present invention, there is obtained a data transmission method according to the twenty-first or twenty-second mode, wherein the first device suppresses, of the first and second data phase signals transmitted bidirectionally, the first data phase signal outputted from the first device, while the second device suppresses, of the first and second data phase signals transmitted bidirectionally, the second data phase signal outputted from the second device.

According to a twenty-fourth mode of the present invention, there is obtained a data transmission method according to any one of the twenty-first to twenty-third modes, wherein the first and second devices are a buffer and a DRAM, respectively, and the DRAM is given external clocks and produces the second internal clocks based on the external clocks and the received first data phase signal.

According to a twenty-fifth mode of the present invention, there is obtained a data transmission method according to any one of the twenty-first to twenty-third modes, wherein the first and second devices produce the first and second internal clocks from the second and first data phase signals using DLLs.

According to a twenty-sixth mode of the present invention, there is obtained a data transmission system for transmitting/receiving data between a first and a second device, characterized in that a transmission side of the first and second devices has means for transmitting, upon transmission of the data, a data phase signal representing a predetermined phase of the data continuously irrespective of transmission of the data, and a reception side of the first and second devices has means for reproducing internal clocks of the reception side based on the data phase signal and receiving the data according to the reproduced internal clocks.

According to a twenty-seventh mode of the present invention, there is obtained a data transmission system for transmitting/receiving data bidirectionally between a first and a second device, characterized in that each of the first and second devices has transmission means for transmitting, upon transmission of the data, a data phase signal representing a predetermined phase of the data continuously irrespective of transmission of the data, and transmitting the data based on the data phase signal, and reception means for reproducing data reception internal clocks based on the data phase signal and receiving the data according to the reproduced internal clocks.

According to a twenty-eighth mode of the present invention, there is obtained a data transmission system according to the twenty-seventh mode, wherein the first and second devices are a buffer and a DRAM, respectively, transmission means of the buffer has means for outputting a write data phase signal to the DRAM as the data phase signal, reception means of the buffer has means for receiving a read data phase signal from the DRAM as the data phase signal, reception means of the DRAM has means for reproducing the data reception internal clocks from the write data phase signal, and means for receiving the data according to the reproduced internal clocks, and transmission means of the DRAM has means for outputting a read data phase signal as the data phase signal at timing relying on the received write data phase signal.

According to a twenty-ninth mode of the present invention, there is obtained a data transmission system according to the twenty-eighth mode, wherein the write data phase signal and the read data phase signal are bidirectionally transmitted onto the same signal line at mutually different timings.

According to a thirtieth mode of the present invention, there is obtained a data transmission system according to the twenty-eighth mode, wherein the write data phase signal and the read data phase signal are bidirectionally transmitted onto mutually different signal lines at mutually different timings.

According to a thirty-first mode of the present invention, there is obtained a data transmission system according to any one of the twenty-eighth to thirtieth modes, wherein the read data phase signal reception means of the buffer has means for reproducing data reception buffer internal clocks based on buffer internal clocks and the read data phase signal, and the read data phase signal output means of the DRAM has means for reproducing DRAM internal clocks for outputting the read data phase signal, based on external clocks and the write data phase signal.

When speeding up the foregoing memory systems, it is preferable to employ the following configurations taking into account a skew on each memory module.

Specifically, according to a mode of the present invention, there is obtained a memory module having a plurality of memory circuits and a buffer, wherein a command/address signal is transmitted from the buffer to the plurality of memory circuits, and data signals following the command/address signal are transmitted/received between the buffer and the plurality of memory circuits, characterized in that at least one of the plurality of memory circuits and the buffer has skew absorbing means for absorbing timing skews that are generated between the command/address signal and the data signals depending on mounting positions of the memory circuits. When each of the memory circuits is a DRAM, it is preferable that the command/address signal is outputted synchronously with buffer clocks outputted from the buffer to the memory circuits.

When employing such a configuration, it is preferable that the skew absorbing means are provided in the plurality of memory circuits and the buffer, respectively, and that the data signals are transmitted/received between the plurality of DRAMs and the buffer synchronously with data phase signals representing phases of the data signals.

Here, it is preferable that each of the DRAMs is given a command/address signal from the buffer synchronously with the buffer clocks and further given a write data phase signal (WDPS) from the buffer as the data phase signal, and the skew absorbing means of the DRAM has means for producing a plurality of phase clocks for receiving the command/address signal according to the buffer clocks, means for producing data reception DRAM internal phase clocks from the WDPS, and means for domain-crossing the command/address signal received synchronously with the phase clocks, to the data reception DRAM internal phase clocks.

On the other hand, the DRAM outputs a read data phase signal (RDPS) to the buffer as the data phase signal, and the skew absorbing means of the buffer has means for producing data reception buffer internal phase clocks from the RDPS received from the DRAM, means for producing buffer internal phase clocks based on the WDPS, and means for causing a read data signal inputted synchronously with the RDPS, to match with the buffer internal phase clocks.

According to another mode of the present invention, there is obtained a memory module, wherein the DRAM is given a write data phase signal (WDPS) from the buffer as the data phase signal, and inputted with a data signal synchronously with the WDPS, and the skew absorbing means of the DRAM has means for producing data reception DRAM internal phase clocks from the WDPS, means for producing a plurality of phase clocks from the buffer clocks, and means for domain-crossing a data signal received synchronously with the data reception DRAM internal phase clocks, to the plurality of phase clocks.

Here, it is preferable that the DRAM outputs a read data phase signal (RDPS) based on buffer clocks, and the skew absorbing means of the buffer has means for producing data reception buffer internal phase clocks based on the RDPS, means for producing buffer internal phase clocks based on global clocks, and means for causing a data signal read from the DRAM and received according to the data reception buffer internal phase clocks, to match with the buffer internal phase clocks, thereby to perform domain crossing.

According to still another mode of the present invention, there is obtained a memory module having a plurality of memory circuits and a buffer, wherein a command/address signal is transmitted from the buffer to the plurality of memory circuits, and data signals following the command/address signal are transmitted/received between the buffer and the plurality of memory circuits, characterized in that the data signals are transmitted/received between the plurality of memory circuits and the buffer synchronously with data phase signals transmitted onto the same signal line alternately from the memory circuits and the buffer, and the buffer has means for outputting a control signal for defining a transmission time of the data phase signal in each of the memory circuits and the buffer.

BRIEF DESCRIPTION OF THE DRAWINGS

FIG. 17A is a time chart for explaining a write operation in the transmission system of FIG. 16;

FIG. 17B is a time chart for explaining a read operation in the transmission system of FIG. 16;

FIG. 21A is a time chart for explaining a write operation when the transmission system of FIG. 20 is employed;

FIG. 21B is a time chart for explaining a read operation when the transmission system of FIG. 20 is employed;

DESCRIPTION OF THE PREFERRED EMBODIMENT

Figure 1:
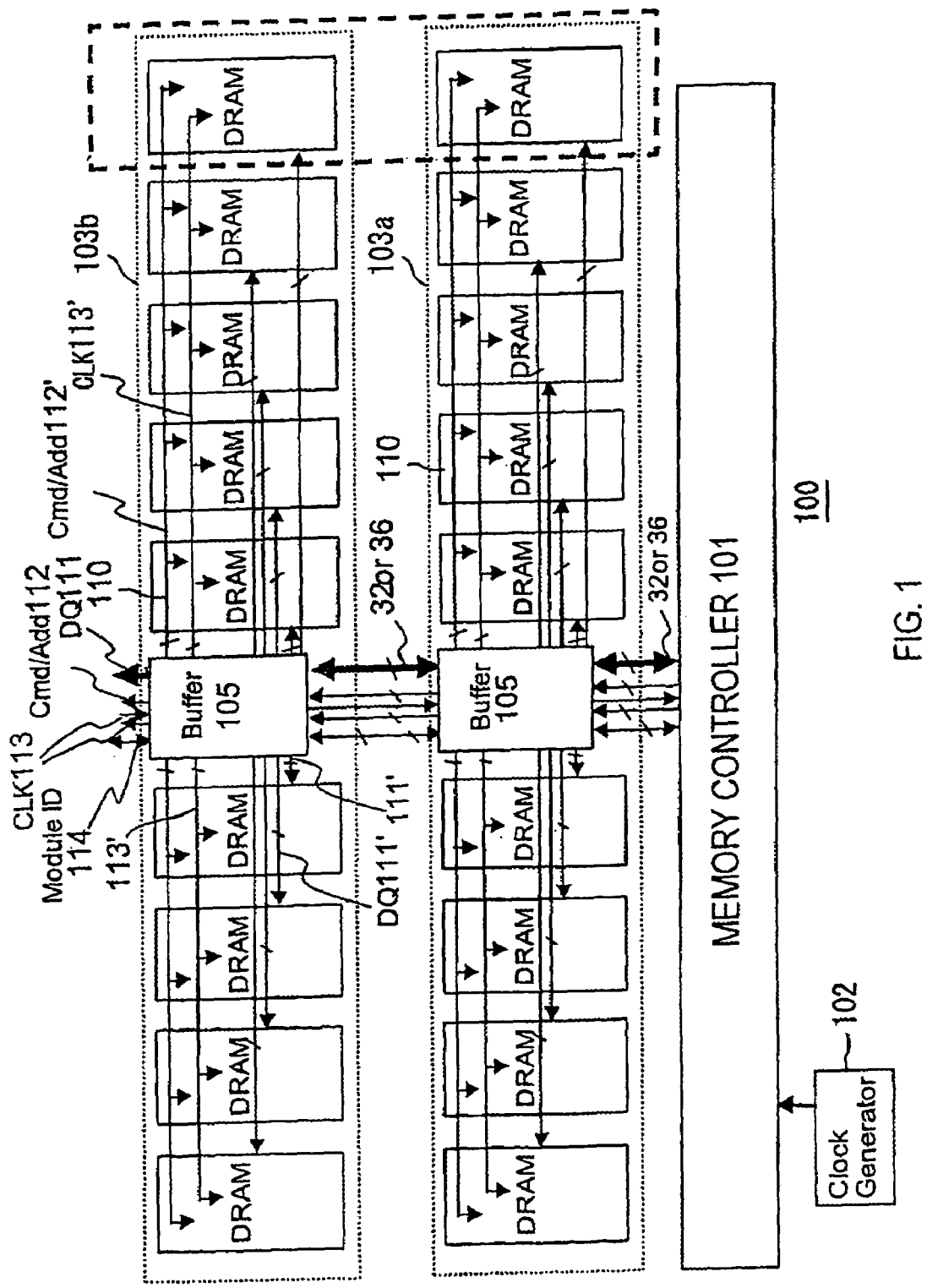
FIG. 1 is a block diagram for explaining a memory system according to a first preferred embodiment of the present invention.
Figure 2:
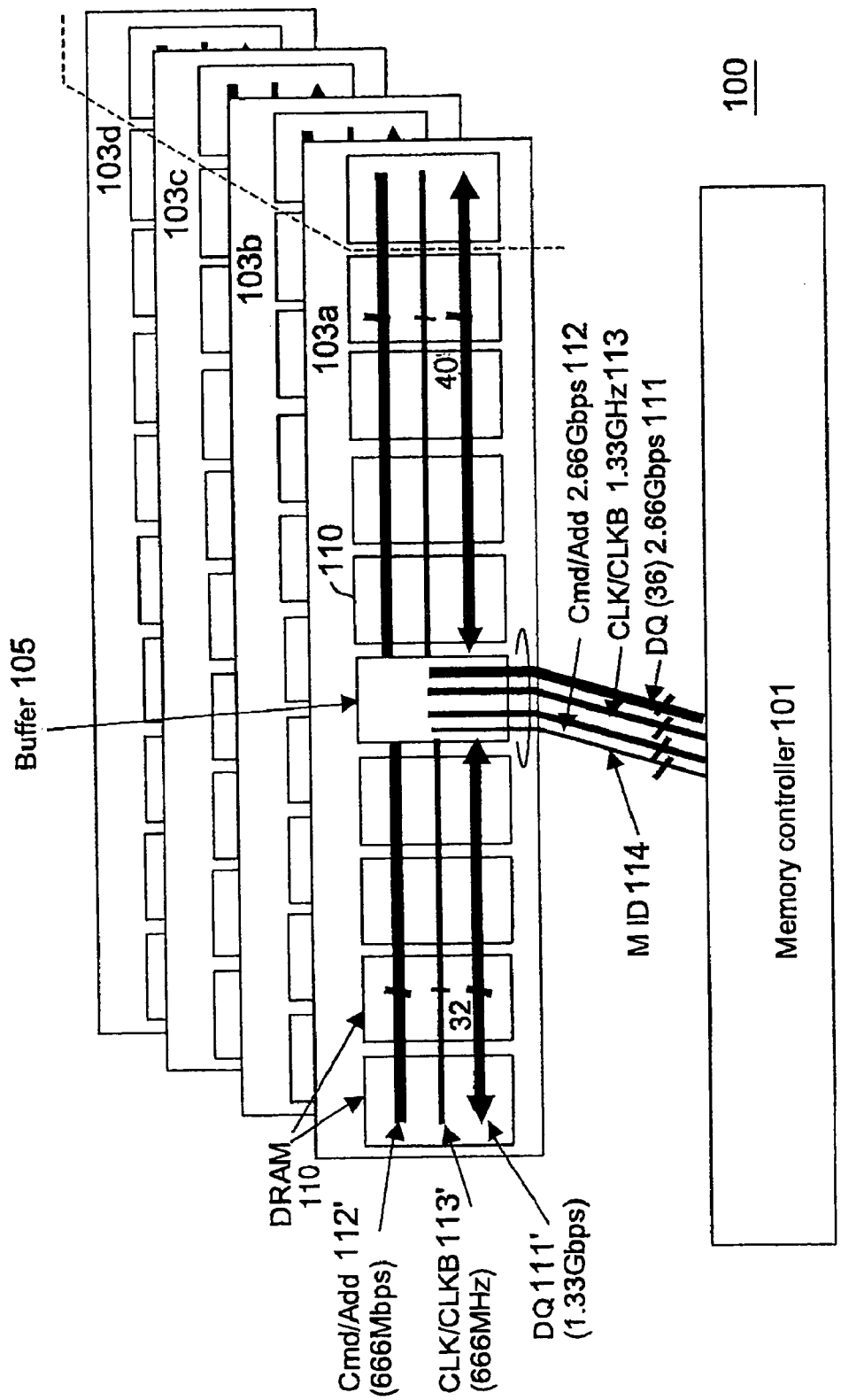
FIG. 2 is a schematic stereoscopic wiring diagram for explaining an actual configuration of the memory system shown in FIG. 1.

Referring to FIGS. 1 and 2, there are respectively shown a wiring diagram and a stereoscopic diagram of a memory system according to a first preferred embodiment of the present invention. Further, FIG. 3 is a partial sectional view of the memory system for explaining the wiring at a portion of FIGS. 1 and 2 in detail.

As seen from the figures, the memory system according to the first preferred embodiment of the present invention comprises a memory controller 101 and a clock generator 102 (FIG. 1) that are mounted on a mother board 100. Further, on the mother board 100, a plurality of memory modules 103 (four memory modules 103a, 103b, 103c, and 103d in FIGS. 2 and 3) are mounted via module connectors 104 (FIG. 3).

Each memory module 103 (subscript omitted) is provided on a module board thereof with a buffer 105 and, as shown in FIGS. 1 and 2, a plurality of DRAMs 110. In the shown example, each memory module 103 has one buffer 105, and the memory controller 101 and the buffers 105 are connected together via data wiring (DQ) 111, command/address wiring (Cmd/Add) 112, and clock wiring (CLK/CLKB) 113. As clear from this, the data wiring 111 shown in FIGS. 1 and 2 is directly connected to the memory controller 101 via the buffers 105, i.e. not connected to the respective DRAMs 110.

Figure 3:
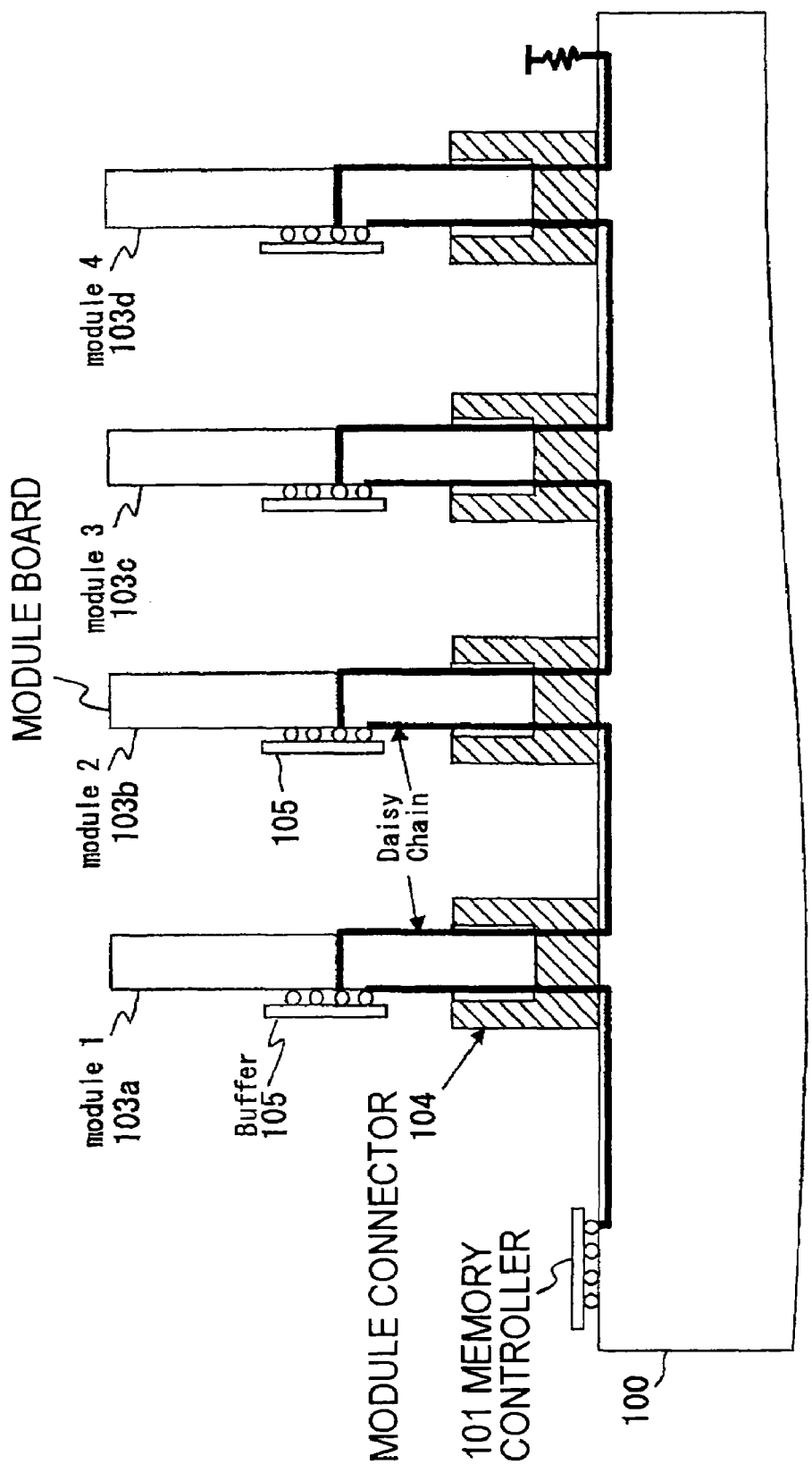
FIG. 3 is a sectional view for explaining the wiring of the memory system shown in FIGS. 1 and 2 more specifically.

As shown in FIG. 3, the data wiring 111, the command/address wiring 112, and the clock wiring (CLK/CLKB) 113 are connected from the memory controller 101 to the buffer 105 of the memory module 103a, then connected therefrom to the buffer 105 of the memory module 103b of the next stage. Likewise, these wirings are connected to the buffers 105 of the subsequent memory modules 103c and 103d in order and terminated at their termination ends with terminating resistances, thereby forming a daisy chain. In other words, the wirings such as the data wiring 111 are connected to the buffers 105 between the memory controller 101 and the memory module 103a, between the memory modules 103a and 103b, between the memory modules 103b and 103c, and between the memory modules 103c and 103d, and further, connected point-to-point relative to the buffers 105 of the prior and subsequent stages in cascade.

As shown in FIG. 2, the data wiring (DQ) 111, the command/address wiring (Cmd/Add) 112, and the clock wiring 113 can be respectively parceled into wiring portions on the mother board and module wiring portions in the memory modules. Further, in the shown memory system, module identification wiring 114 for transmitting a module identifying signal MID that identifies one of the memory modules 103a to 103d is also disposed between the memory controller 101 and the buffer 105 and between the buffers 105.

As shown in FIG. 1, the buffer 105 in each memory module 103 and the DRAMs 110 mounted in the subject memory module 103 are connected together via internal data wiring 111', internal command/address wiring 112', and internal clock wiring 113'. Herein, the internal data wiring 111' is connected individually to the respective DRAMs 110 on the memory module 103, while the internal command/address wiring 112' and the internal clock wiring 113' are respectively provided so as to be common to the DRAMs 110 disposed on the left side or the right side of the buffer 105.

Assuming that the shown DRAM 110 is a DRAM of a x-8 configuration that can write and read data per 8 bits, data transmission/reception is performed on the unit of 8 bits between each DRAM 110 and the buffer 105 in each memory module 103.

Description will be given about the shown memory system in more detail. Each of the memory modules 103a and 103b has eight DRAMs 110, wherein four of them are placed on each of the left and right sides of the buffer 105. Further, the data wiring 111 between the memory controller 101 and the buffer 105 and between the buffers 105 has a 32-bit width. When either one of the memory modules 103a and 103b is selected by a command/address signal and a module identifying signal MID, the eight DRAMs 110 on the selected memory module 103a, for example, are activated to thereby set the state wherein data of a 64-bit width in total can be transmitted/received between the eight DRAMs 110 and the buffer 105.

On the other hand, when a DRAM 110 denoted by a broken line in FIGS. 1 and 2 is added to each memory module 103, four DRAMs 110 are arranged on the left side of the buffer 105, while five DRAMs 110 are arranged on the right side thereof, and the data wiring 111 between the memory controller 101 and the buffer 105 and between the buffers 105 has a 36-bit width. In this configuration, when either one of the memory modules 103a and 103b is selected by a command/address signal and a module identifying signal MID, the nine DRAMs 110 on the selected memory module 103a, for example, are activated to thereby set the state wherein data of a 72-bit width in total can be transmitted/received between the nine DRAMs 110 and the buffer 105.

As described above, it is seen that the eight or nine DRAMs 110 on each of the memory modules 103a and 103b form a simultaneously accessible rank in the memory system shown in FIGS. 1 and 2.

Now, referring to FIGS. 1 and 2, further description will be given about the wiring between the memory controller 101 and the memory module 103a and the wiring between the adjacent memory modules 103. First, the data wiring 111 will be described. Although data of a 64-bit or 72-bit width are transmitted/received via the internal wiring 111' between the buffer 105 and the DRAMs 110, the data wiring 111 between the memory controller 101 and the buffer 105 and between the buffers 105 has a 32-bit width or a 36-bit width as shown in FIGS. 1 and 2.

This means that a data signal, multiplexed or compressed into packets, is transmitted/received on the data wiring 111 at a transmission speed higher than a data frequency, i.e. an operation speed, of the DRAM 110. In the shown example, data is transferred on the data wiring 111 at a speed that is n (n is a positive integer) times the operation speed of the DRAM 110. Accordingly, when compressed into packets, the number of data lines is reduced to about 1/n (not necessarily 1/n because there is actually an indivisible case or the like).

Like the data wiring 111, the command/address wiring 112 is connected point-to-point between the memory controller 101 and the memory module 103 and between the adjacent memory modules 103. In the command/address wiring 112, a command/address signal is transferred at a speed that is m (m is a positive integer) times a command/address signal frequency of the DRAM 110 and, when compressed into packets, the number of signal lines is reduced to about 1/m (also not necessarily 1/m because there is actually an indivisible case or the like).

The buffer 105 provided on each memory module 103 has a function of receiving a data signal or a command/address signal from the memory controller 101 or the memory module 103 of the prior stage and encoding packets of the data or command/address signal to provide the number of signals corresponding to the DRAMs on the subject memory module 103. Further, the buffer 105 has a function of dividing a frequency of the encoded data or command/address signals into 1/n or 1/m times the frequency and sending them to the DRAMs 110.

Furthermore, the buffer 105 also has a function of transferring or transmitting a command/address signal to the cascade-connected memory module 103 of the next stage, a function of bidirectionally transmitting/receiving a data signal relative to the next-stage memory module, and a function of identifying a module identifying signal MID representing a packet destination of a data or command/address signal. Inasmuch as the functions of dividing, identification, etc. in the buffer 105 can be easily realized using the usual techniques, details thereof are not given here. In any case, the respective wirings on the memory modules 103 are connected with wiring layout having only such branching that can be electrically ignored.

Now, referring to FIG. 2, description will be given about transmission speeds in the respective wirings. First, it is assumed that the DRAMs 110 on each memory module 103 are SDRAMs and employ the DDR (Double Data Rate) system that performs input/output of data synchronously with both leading and trailing edges of a clock. Further, assuming that an internal clock frequency of 666 MHz is given to the internal clock wiring 113' between the buffer 105 and the DRAMs 110 in each memory module 103, data is transferred in the internal data wiring 111' at a data transmission speed of 1.33 Gbps, i.e. at a data frequency of 1.33 GHz, and a command/address signal of 666 Mbps is supplied from the buffer 105 in the internal command/address wiring 112'.

In this example, it is assumed that the clock wiring 113 disposed on the mother board 100 is given, from the memory controller 101, clocks having a clock frequency of 1.33 GHz that is twice the internal clock frequency. As shown in FIG. 2, the data wiring 111 and the command/address wiring 112 are fed with data and command/address signals at a transmission speed of 2.66 Gbps that is twice the clock frequency, while transmission speeds of the internal data wiring 111' and the internal command/address wiring 112' are 1.33 Gbps and 666 Mbps, respectively. Therefore, it is seen that n=2 and m=4 in the shown example.

As described above, by multiplexing the signals on the mother board to implement high-frequency transmission, the number of the lines on the mother board can be reduced. The data wiring 111 can be reduced to ½ by duplexing the signal, while the command/address wiring 112 can be reduced to ¼ by quadplexing the signal. Further, by duplexing data, a memory system with data wiring of a 32-bit width (or data wiring of a 36-bit width) can be operated as a memory system of a 64-bit (or 72-bit) configuration.

The memory system shown in FIGS. 1 to 3 requires a layout configuration for inputting/outputting a data signal of a 32-bit or 36-bit width from the module connector 104 (FIG. 3) to the buffer 105. As described before, the internal data wiring 111' and the internal clock wiring 113' and command/address wiring 112' on the memory module 103 are connected with the wiring layout having only electrically ignorable branching. However, since the number of the DRAMs connected to the internal data wiring 111' and the number of the DRAMs connected to the internal clock wiring 113' and command/address wiring 112' differ from each other, it can be considered that a difference in signal propagation time caused by a difference in load may be a problem upon high-frequency operation. Further, as clear from FIGS. 1 and 2, inasmuch as the clocks and the command/address signals are given to all the DRAMs 110 on each memory module 103, the total input load is large, and therefore, it can be considered that a problem may be raised upon high-frequency operation.

Figure 4:
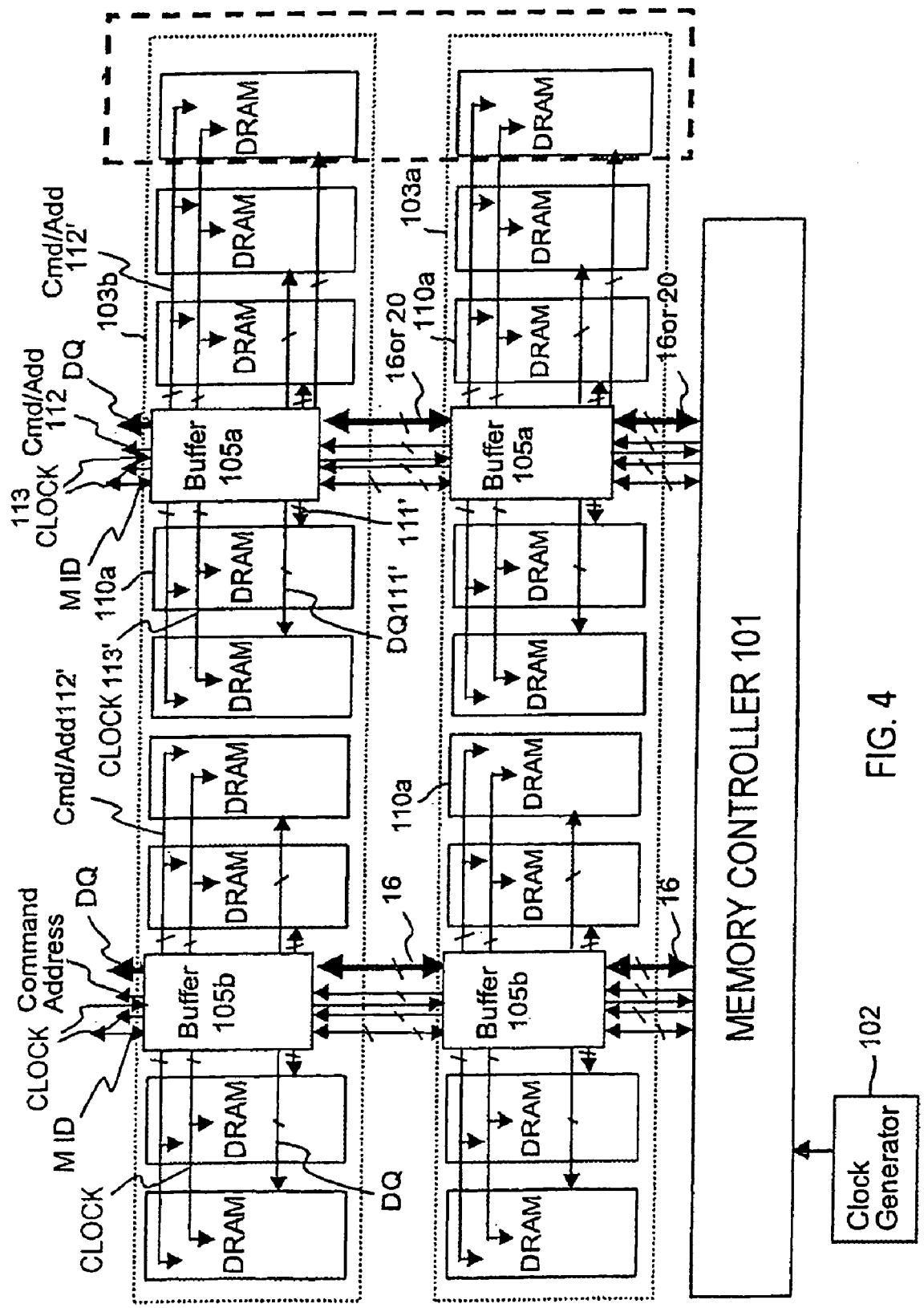
FIG. 4 is a block diagram showing a memory system according to a second preferred embodiment of the present invention.
Figure 5:
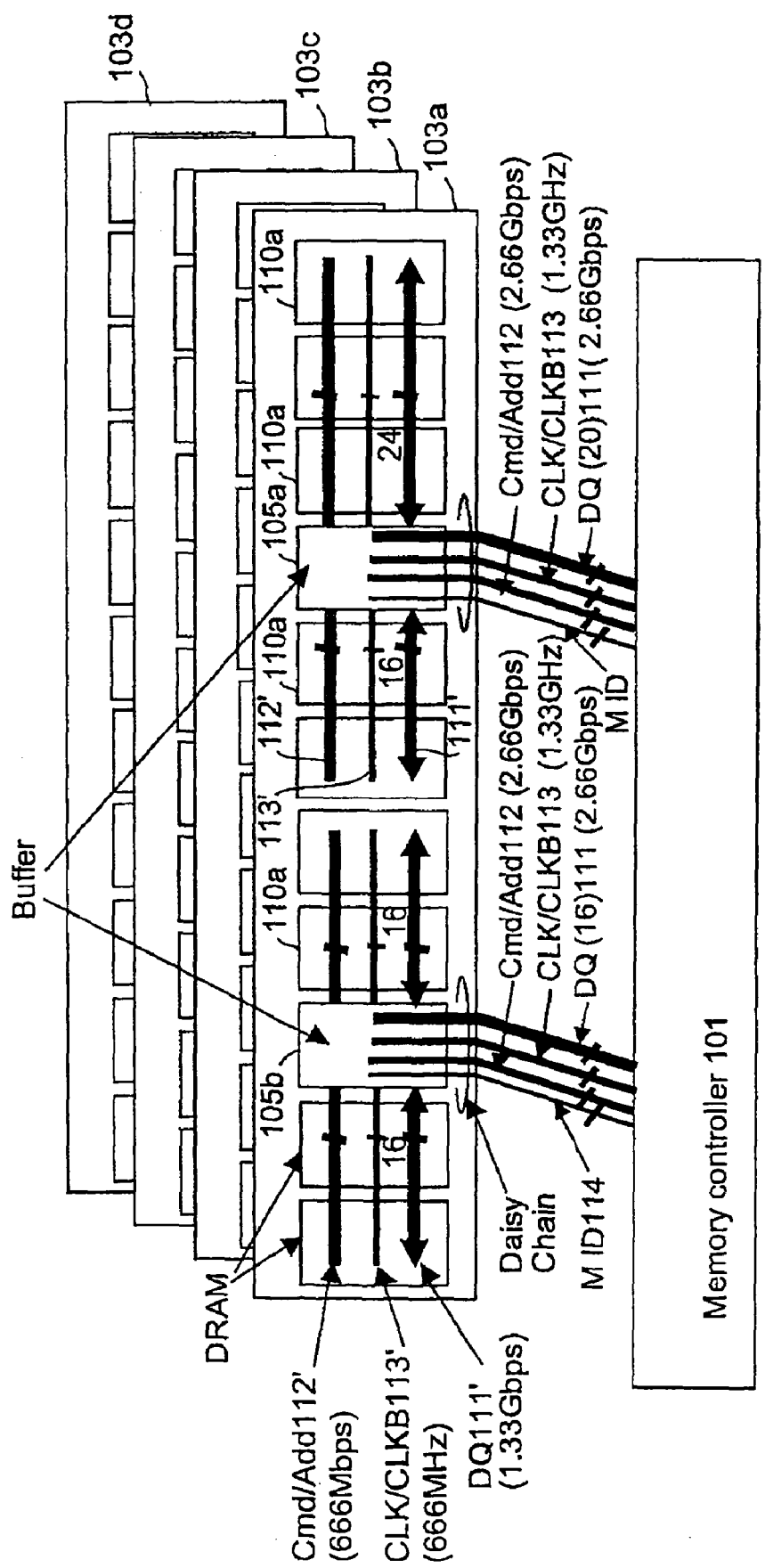
FIG. 5 is a schematic stereoscopic wiring diagram showing the memory system shown in FIG. 4.

Referring to FIGS. 4 and 5, a memory system according to a second preferred embodiment of the present invention has a configuration that can reduce the foregoing problems associated with the first preferred embodiment. The shown memory system differs from the memory system according to the first preferred embodiment in that each of memory modules 103a to 103d (FIG. 5) is provided with two buffers 105a and 105b. Specifically, each of the buffers 105a and 105b of each of the memory modules 103a and 103b is connected to a plurality of DRAMs 110a arranged on both left and right sides thereof via internal data wiring (DQ) 111', internal command/address wiring 112', and internal clock wiring 113'.

In the shown example, the DRAMs 110a within each memory module 103 are individually connected to the buffer 105a or 105b via the internal data wiring (DQ) 111', and further, commonly connected to the left or right side of the buffer 105a or 105b via the internal command/address wiring 112' and the internal clock wiring 113'.

Further, like in the first embodiment, the buffers 105a and 105b within each memory module 103 are connected to a memory controller 101 or the memory module of the next stage via data wirings 111, command/address wirings 112, and clock wirings 113. This configuration is the same as the connection relationship shown in FIG. 3 and, as a result, the buffers 105a and 105b of each memory module 103 are connected point-to-point to the buffers 105a and 105b of other memory modules 103. That is, the data wirings 111, the command/address wirings 112, and the clock wirings 113 are connected to the buffers 105a and 105b of the subsequent stages in cascade in order, thereby forming daisy chains.

In the example shown in FIG. 5, x-8 configuration DRAMs 110a each inputting/outputting data per 8 bits are mounted on each memory module 103, and each DRAM 110a performs an input/output operation according to clocks having a clock frequency of 666 MHz given via the internal clock wiring 113'. As a result, a command/address signal and data are transmitted in the internal command/address wiring 112' and the internal data wiring 111' at transmission speeds of 666 MHz and 1.33 GHz, respectively.

On the other hand, the memory controller 101 and the buffers 105a and 105b of the memory module 103a are connected together via the data wirings 111, the command/address wirings 112, the clock wirings 113, and module identification wirings 114. Further, these wirings extend to the buffers 105a and 105b of the memory module 103b of the next stage, and are further connected to the buffers 105a and 105b of the memory modules 103c and 103d that are shown behind the memory module 103b in FIG. 5. In this manner, the data wirings 111, along with the command/address wirings 112 and the clock wirings 113, are connected to the two buffers 105a and 105b concentrically, i.e. in groups.

In FIG. 5, clocks having a frequency of 1.33 GHz are given on the clock wirings 113, and a command/address signal and data are inputted/outputted on the command/address wirings 112 and the data wirings 111 at a transmission speed of 2.66 Gbps. Therefore, it is seen that each of the buffers 105a and 105b can produce internal clocks, internal command/address signals, and internal data by converting the clocks, the command/address signal, and the data from the memory controller 101 into two or four parallel signals.

In this configuration, by simultaneously operating the buffers 105a and 105b of each memory module 103, it is possible to construct a memory system that inputs/outputs data at a 32-bit or 36-bit width, like in the first preferred embodiment. In case of the memory system for transmitting/receiving data of a 32-bit width, the two x-8 configuration DRAMs 110a are placed on each side of each of the buffers 105a and 105b. When each memory module 103 is selected, the eight DRAMs 110a on each memory module 103 are activated by both buffers 105a and 105b so that data of a 64-bit width can be transmitted/received between the buffers 105a and 105b and the eight DRAMs 110a. In the shown example, the memory controller 101 and each of the buffers 105a and 105b are connected by the data wiring 111 of a 16-bit width, and these data wirings 111 are also connected to the buffers of the memory modules of the subsequent stages. As clear from this, multiplexed data is transmitted on the data wirings 111 like in the first preferred embodiment.

On the other hand, in case of the memory system for transmitting/receiving data of a 36-bit width, data of a 72-bit width can be transmitted/received between the nine DRAMs 110a and the buffers 105a and 105b on each memory module 103. In the example shown in FIG. 5, data of a 40-bit width is transmitted/received between the buffer 105a and the five DRAMs 110a disposed on both sides of the buffer 105a, while data of a 32-bit width is transmitted/received between the buffer 105b and the four DRAMs 110a disposed on both sides of the buffer 105b.

In this case, the data wiring 111 between the memory controller 101 and the buffer 105a has a 20-bit width, while the data wiring 111 between the memory controller 101 and the buffer 105b has a 16-bit width and, like in the first preferred embodiment, data and command/address signals that are multiplexed, i.e. compressed into packets, are transmitted/received on the data wirings 111 and the command/address wirings 112, respectively.

In the shown memory system, the number of the DRAMs 110a driven by each of the buffers 105a and 105b can be reduced to half as compared with the first preferred embodiment, and therefore, the number of lines in each of the buffers 105a and 105b on the memory module 103 can be reduced and the wiring length can be shortened. Further, inasmuch as the number of the DRAMs 110a, forming loads, of each of the buffers 105a and 105b can be reduced, a difference in input load at the internal data wiring 111', and the internal command/address wiring 112' and the internal clock wiring 113' can be reduced so that the memory system suitable for high-frequency operation can be constructed.

In the memory system shown in FIG. 4, in case of the memory system for transmitting/receiving the data of the 36-bit width between the memory controller 101 and the buffers 105a and 105b, it is readily understood that the DRAM 110a surrounded by a broken line in FIG. 4 is connected in each memory module 103, which is also clear from FIG. 5.

The memory system according to the second preferred embodiment shown in FIGS. 4 and 5 can be applied with various modifications. For example, instead of the x-8 configuration DRAMs, x-4 configuration DRAMs each inputting/outputting data per 4 bits, or x-16 configuration DRAMs each transmitting/receiving data per 16 bits may be disposed on both sides of the two buffers. Further, the present invention is applicable not only to a memory system having DRAMs arranged on only one side of a module board of each memory module, but also to a memory system having DRAMs arranged on both front and back sides thereof. Moreover, the present invention is likewise applicable to a system in which a plurality of DRAMs arranged on each memory module are classified into a plurality of ranks.

In the memory system according to the foregoing preferred embodiment, a command/address signal given to each memory module is given individually to a plurality of buffers, and therefore, the number of command/address signal pins is increased by a multiple of the number of the buffers. However, inasmuch as the command/address signal is multiplexed, the increase is not so large.

Figure 6:
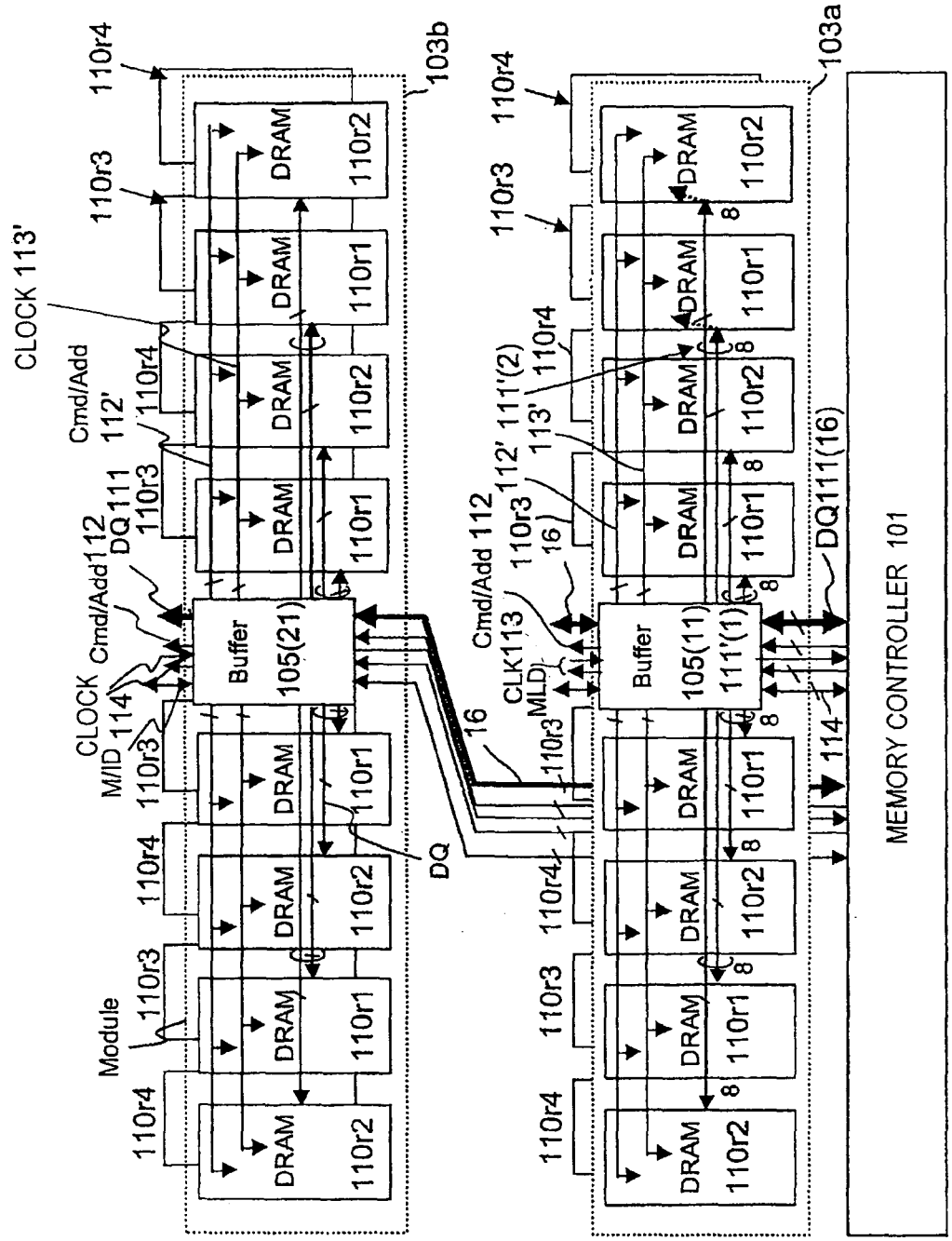
FIG. 6 is a block diagram showing a memory system according to a third preferred embodiment of the present invention.

Referring to FIG. 6, there is shown one example of a memory system according to a third preferred embodiment of the present invention. The shown memory system has a configuration that can reduce the number of internal data lines between the module connector 104 (FIG. 3) and a buffer without increasing the number of buffers in each memory module. Specifically, the memory system shown in FIG. 6 comprises a memory controller 101 and a plurality of memory modules 103 (only 103a and 103b are shown in the figure), wherein 16 DRAMs 110 (subscript omitted) are mounted on the front and back sides of each memory module 103. It is assumed that the shown DRAM 110 is a x-8 configuration DRAM that performs write/read per 8 bits. At the centers of the memory modules 103a and 103b, buffers 105(11) and 105(21) are disposed, respectively. The buffer 105(11) is connected with 16-bit width data wiring (DQ) 111, command/address wiring (Cmd/Add) 112, clock wiring (CLK) 113, and module identifying wiring (MID) 114, and the buffer 105(21) is likewise connected with 16-bit width data wiring (DQ) 111, command/address wiring (Cmd/Add) 112, clock wiring (CLK) 113, and module identifying wiring (MID) 114. These wirings of each of the buffers 105(11) and 105(21) are connected to buffers of non-shown memory modules to thereby form a daisy chain.

In this embodiment, the total 32 DRAMs 110 of the two memory modules 103a and 103b are classified into four groups each including eight DRAMs, which operate as ranks 1 to 4. In this connection, wiring from the buffer 105(11), 105(21) to the DRAMs 110 in the memory module 103a, 103b is such that the wiring is common to the corresponding DRAMs 110 on the front and back sides of the memory module 103a, 103b and connected together through vias within the memory module 103a, 103b, and connected to the same DQ terminal of the buffer 105(11), 105(21). Specifically, the DRAMs 110 used in the rank 1 and the rank 3 are located in corresponding positions on the front and back sides of each of the memory modules 103a and 103b, while the DRAMs 110 used in the rank 2 and the rank 4 are likewise located in corresponding positions on the front and back sides of each of the memory modules 103a and 103b, and the DRAMs of the same rank are activated by the use of address bits for selecting the rank. Taking this into consideration, in FIG. 6, the DRAMs 110 belonging to the rank 1 are assigned a subscript r1 and, likewise, the DRAMs 110 of the ranks 2 to 4 are featured by r2 to r4.

In this configuration, in case of operating the DRAMs 110 of the rank 1, when the four DRAMs 110r1 of each of the memory modules 103a and 103b are selected, the state is set wherein data of a 32-bit width is transmitted/received via internal data wiring 111' between each of the buffers 105(11) and 105(21) of the memory modules 103a and 103b and the DRAMs 110r1. In this state, the buffers 105(11) and 105(21) are respectively connected to the memory controller 101 via the data wirings 111 each having a 16-bit width, and therefore, perform transmission/reception of data relative to the memory controller 101 as 32-bit data wiring in total.

In this manner, the four ranks are formed by using the two memory modules 103a and 103b as a pair, so that the wiring of the ranks 1 and 3 can be made common and the wiring of the ranks 2 and 4 can be likewise made common in each of the memory modules 103a and 103b to thereby reduce the number of lines in the memory modules 103a and 103b.

Here, the memory system shown in FIG. 6 differs from the memory system according to the first preferred embodiment in that each of the buffers 105(11) and 103(21) is directly connected to the memory controller 101, and further differs from the memory system according to the second preferred embodiment in that the single buffer 105(11), 105(21) of the memory module 103a, 103b is connected via the data wiring 111 of the 16-bit width.

In the configuration shown in FIG. 6, a chip select signal (CS) is used for identifying the ranks 1 to 4. However, bits for identifying the ranks 1 to 4 may be added separately.

Now, description will be given about an operation of the memory system shown in FIG. 6. When one command/address signal is outputted from the memory controller 101, this command/address signal is, in this example, fed to the two memory modules 103a and 103b. In this event, it is needless to say that the command/address signal is outputted from the memory controller 101 synchronously with the clocks. The command/address signal activates the eight DRAMs of the same rank in the two memory modules 103a and 103b, for example, the DRAMs 110r1 of the rank 1, so that a write/read operation of data is implemented between the activated eight DRAMs 110r1 and the buffers 105(11) and 105(21) in the memory modules 103a and 103b. In this case, the four DRAMs 110r1 on the memory module 103a are activated so that 32-bit width data can be transmitted/received relative to the buffer 105(11), while the four DRAMs 110r1 on the memory module 103b are activated so that 32-bit width data can be transmitted/received relative to the buffer 105(21) likewise.

Inasmuch as the buffers 105(11) and 105(21) are connected to the memory controller 101 via the 16-bit width data wirings 111, respectively, multiplexed data is transmitted between the memory controller 101 and the buffers 105(11) and 105(21), which is the same as the foregoing preferred embodiments.

The buffers 105(11) and 105(21) of the memory modules 103a and 103b may be connected to buffers of non-shown other memory modules, respectively, to thereby form daisy chains. Therefore, the buffers of the shown memory system may be expressed by 105(12~1k) and 105(22~2k) (k is a positive integer equal to 3 or greater). As clear from this, memory modules of the shown memory system may be increased if necessary.

In the memory system according to the third preferred embodiment shown in FIG. 6, if the same DRAMs 110 as those in the memory system according to the first preferred embodiment are provided, the number of ranks of the DRAMs 110 is increased from two to four. There is a merit in this embodiment that since the wiring in each memory module can be made common by providing the rank configuration of the DRAMs in each memory module, the degree of freedom of layout on each memory module 103 can be enhanced, and further, the number of buffer chips can be reduced as compared with the second preferred embodiment. Further, as shown in FIG. 6, inasmuch as data from the memory controller 101 to the memory module 103b is given to the buffer 105(21) of the memory module 103b directly, i.e. without passing through another buffer, a logic delay due to the buffer can be reduced as compared with the memory systems according to the first and second preferred embodiments in which data is transmitted/received via the two buffers 105.

Figure 7:
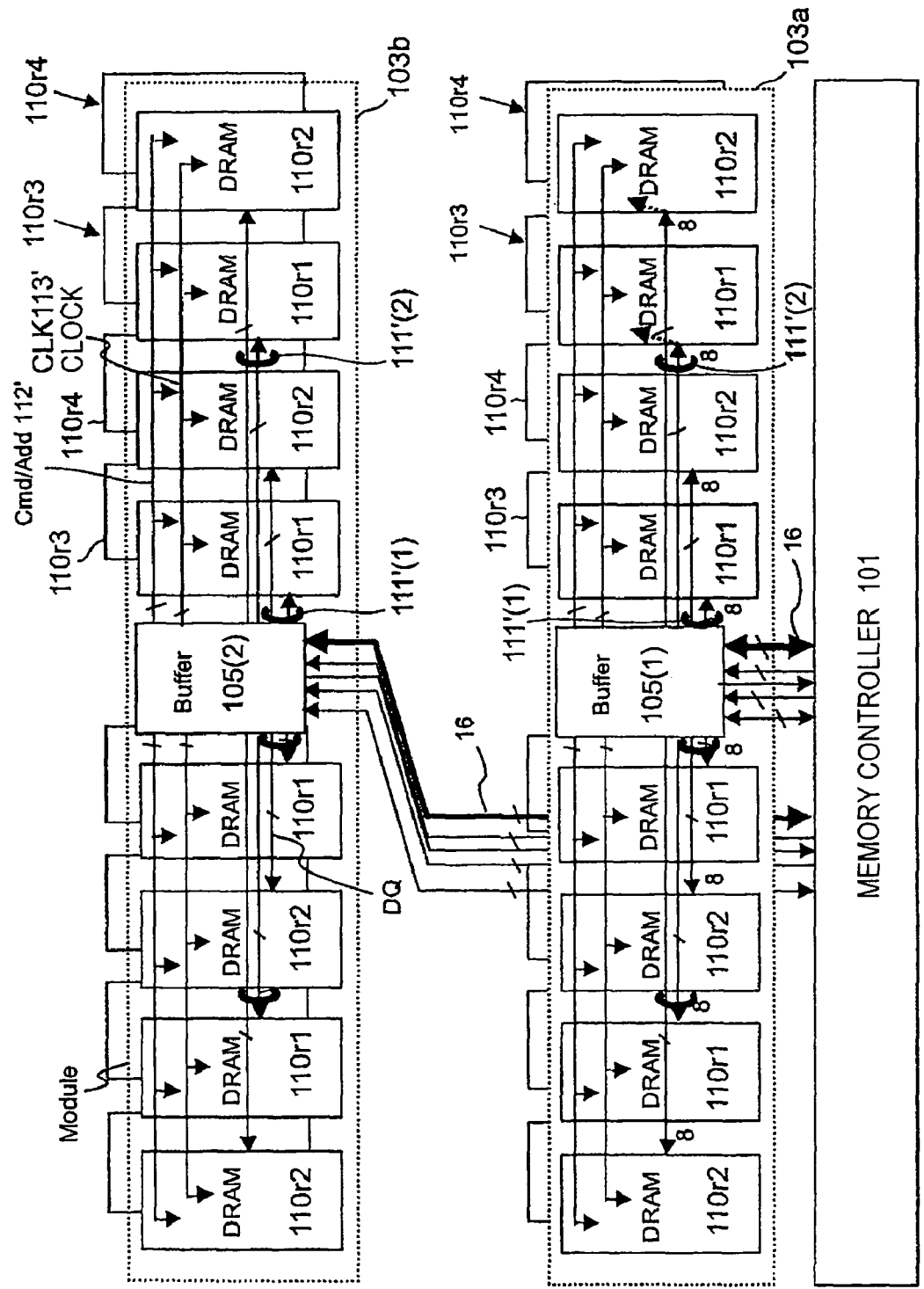
FIG. 7 is a block diagram showing a first modification of the memory system according to the third preferred embodiment of the present invention.

Referring to FIG. 7, there is shown a modification of the memory system according to the third preferred embodiment of the present invention. This memory system comprises only two memory modules 103a and 103b, and is a memory system that does not take into consideration the increase of memory modules. In this example, buffers 105 respectively provided in the memory modules 103a and 103b do not form a daisy chain relative to other memory modules, but are terminated with terminating resistances. In other words, in the shown example, inasmuch as there are no other memory modules that are connected in cascade, the buffers of the memory modules 103a and 103b are represented by reference numerals 105(1) and 105(2), respectively, in FIG. 7. On the other hand, 16 DRAMs 110 provided on the front and back sides of each of the memory modules 103a and 103b are grouped into four ranks, and wiring of the rank 1 and the rank 3 is made common and wiring of the rank 2 and the rank 4 is likewise made common in each of the memory modules 103a and 103b, which is the same as FIG. 6.

Figure 8:
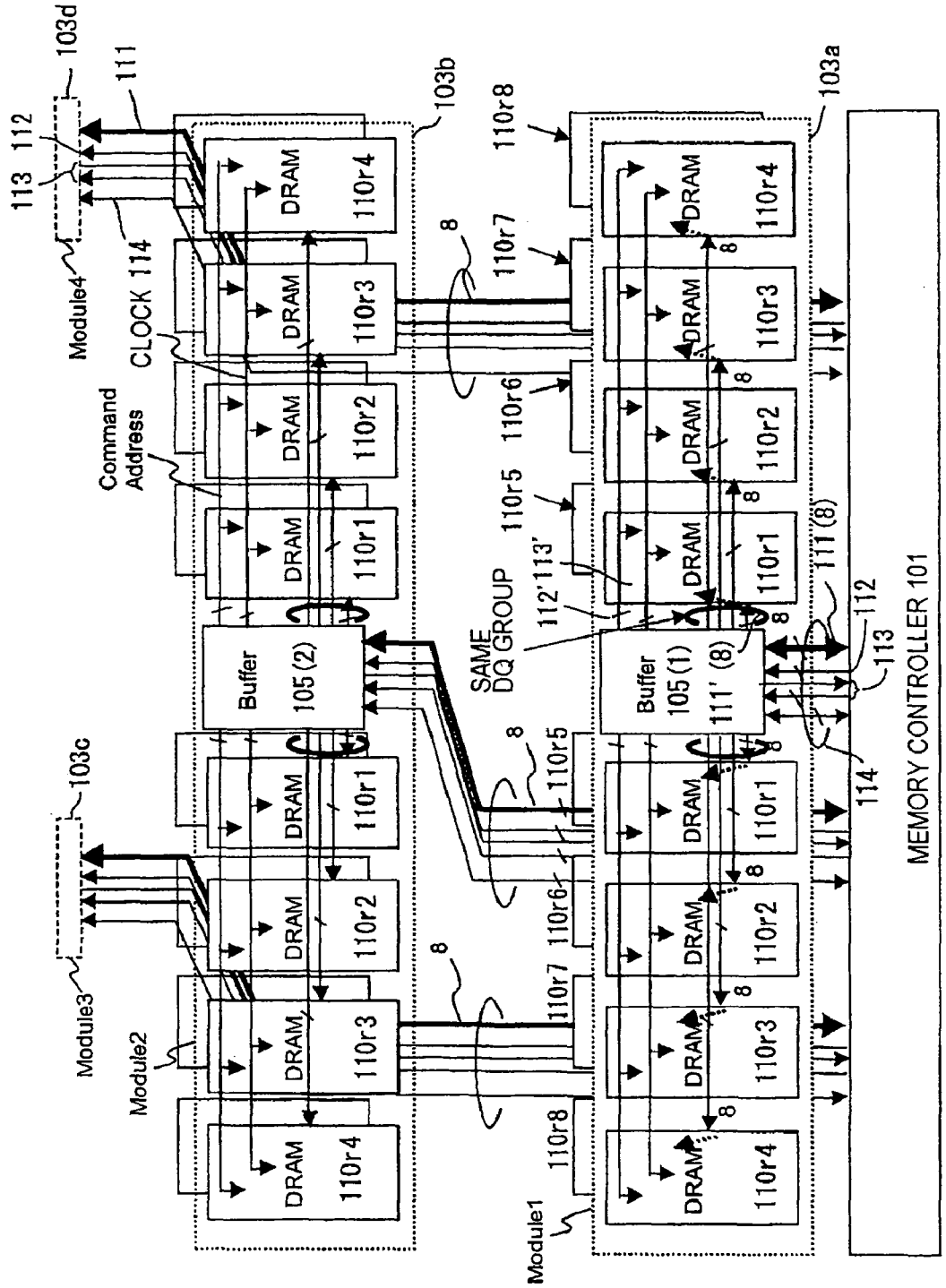
FIG. 8 is a block diagram showing a second modification of the memory system according to the third preferred embodiment of the present invention.

Referring to FIG. 8, there is shown another modification of the memory system according to the third preferred embodiment of the present invention. This modification comprises four memory modules 103a to 103d each having a single buffer 105, and the buffers 105(1) to 105(4) (buffers 105(3) and 105(4) are not shown) of these memory modules are directly connected to the memory controller 101, which differs from the memory systems of FIGS. 6 and 7. Accordingly, each buffer 105 of the memory system shown in FIG. 8 is connected to the memory controller 101 with the number of data lines corresponding to a quarter of a 32-bit width, and x-8 configuration DRAMs 110 on each of the memory modules 103*a* to 103*d* are classified into eight ranks, thereby improving the degree of freedom of layout of each of the memory modules 103*a* to 103*d*.

As described above, in this embodiment, the 8-rank configuration is formed by using the four memory modules 103*a* to 103*d* as a set. The 16 DRAMs 110 are mounted in each of the memory modules 103*a* to 103*d*, wherein the four DRAMs arranged on the right on the front side of each memory module are classified into the ranks 1 to 4, the four DRAMs arranged on the right on the back side of each memory module are classified into the ranks 5 to 8, the four DRAMs arranged on the left on the front side of each memory module are classified into the ranks 1 to 4, and the four DRAMs arranged on the left on the back side of each memory module are classified into the ranks 5 to 8. The rank 1 and the rank 5, the rank 2 and the rank 6, the rank 3 and the rank 7, and the rank 4 and the rank 8 are located in corresponding positions on the front and back sides of each memory module, and wiring from each of the buffers 105(1) to 105(4) to the DRAMs of those ranks is made common and connected through vias. The memory system shown in FIG. 8 differs from that shown in FIG. 6 in that each of data wirings to the memory modules 103(*a*) to 103(*d*) is 8 bits in the memory system of FIG. 8 to thereby form 32-bit data wiring over the whole memory system.

As described before, the DRAMs 110 of each of the memory modules 103*a* and 103*b* are classified into the eight ranks and, for clarifying this, the DRAMs 110 of the ranks 1 to 8 are represented by reference symbols 110*r*1 to 110*r*8, respectively, in FIG. 8.

In this configuration, when an address signal is given from the memory controller 101 as a command/address signal (Cmd/Add), the two DRAMs of the same rank in each of the memory modules 103*a* to 103*d*, for example, the two DRAMs 110*r*1 of the rank 1 in each memory module, are activated, and therefore, the state is set wherein 16-bit width data can be transmitted/received relative to each of the buffers 105(1) to 105(4) so that 64-bit width data in total can be transmitted/received over the four buffers 105(1) to 105(4). As shown in the figure, data wiring 111 of each of the memory modules 103*a* to 103*d* is 8 bits, and multiplexed data is transmitted/received between the memory controller 101 and each of the buffers 105(1) to 105(4) on the data line 111 of each of the memory modules 103*a* to 103*d*.

Figure 9:
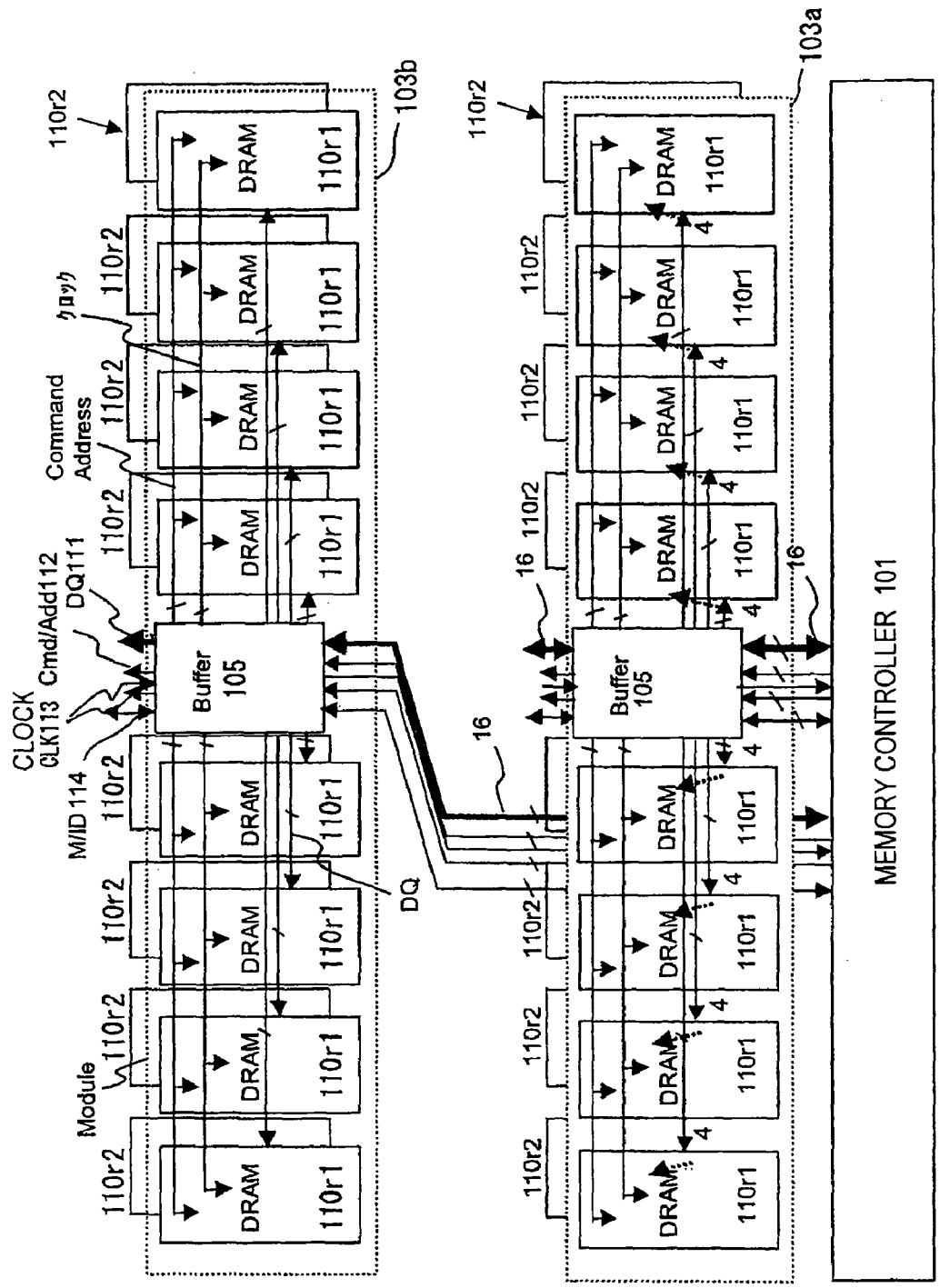
FIG. 9 is a block diagram showing a third modification of the memory system according to the third preferred embodiment of the present invention.

Referring to FIG. 9, there is shown still another modification of the memory system according to the third preferred embodiment of the present invention, wherein a 2-rank memory system is formed by using two memory modules 103*a* and 103*b* as a pair. The memory system of FIG. 9 differs from that of FIG. 6 in that 16 DRAMs disposed on the front side of the two memory modules 103*a* and 103*b* form a rank 1, while 16 DRAMs on the back side thereof form a rank 2, and each DRAM 110 is a x-4 configuration DRAM. Further, in FIG. 9, the eight DRAMs 110 mounted on the front side of each of the memory modules 103*a* and 103*b* form the rank 1, while the eight DRAMs 110 mounted on the back side thereof form the rank 2. In this connection, in FIG. 9, the 16 DRAMs 110 belonging to the rank 1 and arranged in the memory modules 103*a* and 103*b* are denoted by reference symbol 110*r*1, while the 16 DRAMs 110 belonging to the rank 2 are denoted by reference symbol 110*r*2. Further, the DRAMs 110*r*1 and 110*r*2 of the ranks 1 and 2 arranged on the front and back sides of each of the memory modules 103*a* and 103*b* are commonly connected to each other via internal data wiring of a 4-bit width.

On the other hand, a buffer 105 of each of the memory modules 103*a* and 103*b* is connected to the memory controller 101 via 16-bit width data wiring 111, and multiplexed data is transmitted on each of the data wirings 111, which is the same as the other examples. Even with this configuration, like the memory system shown in FIG. 6, 32-bit width data is transmitted between the eight DRAMs 110*r*1, 110*r*2 of the memory module 103*a*, 103*b* and the buffer 105, and further, multiplexed data of a 16-bit width is transmitted between each buffer 105 and the memory controller 101.

Figure 10:
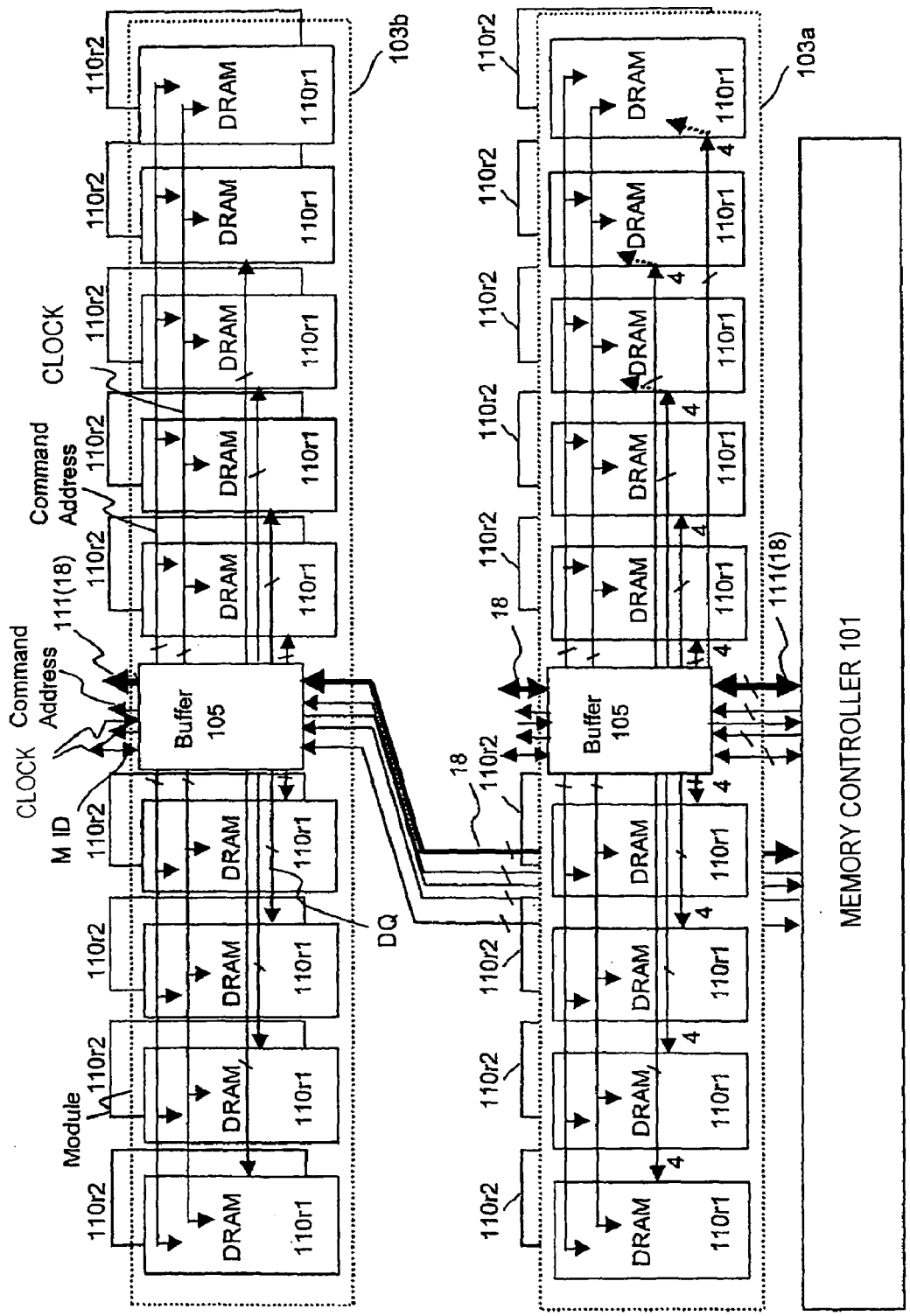
FIG. 10 is a block diagram showing a fourth modification of the memory system according to the third preferred embodiment of the present invention.

Referring to FIG. 10, there is shown an example having a 36-bit bus width with parity bits, as still another modification of the memory system according to the third preferred embodiment of the present invention.

This example differs from the memory system shown in FIG. 9 in that nine x-4 configuration DRAMs 110 are mounted on each of the front and back sides of each of memory modules 103*a* and 103*b*, and data wiring 111 between a buffer 105 of each of the memory modules 103*a* and 103*b* and the memory controller 101 has an 18-bit width. Specifically, in each of the memory modules 103*a* and 103*b* shown in FIG. 10, four DRAMs 110 are arranged on the left on each of the front and back sides of the buffer 105, while five DRAMs 110 are arranged on the right of each of the front and back sides of the buffer 105. Here, it is assumed that the DRAM 110 placed on the rightmost on each of the front and back sides of each of the memory modules 103*a* and 103*b* is used as a DRAM for parity.

Like FIG. 9, this example is also a 2-rank memory system using the two memory modules 103*a* and 103*b* as a pair. Further, the 18 DRAMs 110 arranged on the front side of the two memory modules 103*a* and 103*b* form a rank 1, while the 18 DRAMs 110 arranged on the back side thereof form a rank 2. In this connection, the DRAMs of the ranks 1 and 2 are denoted by reference symbols 110*r*1 and 110*r*2, respectively. Further, internal data wiring of the DRAMs 110*r*1 and 110*r*2 of the ranks 1 and 2 arranged on the front and back sides of each memory module is common, which is also the same as FIG. 9.

Further, the buffer 105 of each of the memory modules 103*a* and 103*b* is connected to the memory controller 101 via data wiring 111 corresponding to an 18-bit width, and is connected to buffers of non-shown memory modules in cascade to thereby form a daisy chain.

In this configuration, multiplexed data with parity is transmitted/received between the memory controller 101 and the memory module 103*a* or 103*b*.

Comparison will be made between the first and second preferred embodiments and the third preferred embodiment. In the first and second preferred embodiments, since transmission/reception of data between the DRAMs on the cascade-connected second memory module and the memory controller is carried out via two buffer chips, a logic delay necessary for reception/transmission processing at the buffer chips becomes twice the third preferred embodiment. On the other hand, in the third preferred embodiment, although there is the merit of reducing the number of buffers to be passed through, it is necessary to increase the number of ranks of the DRAMs on the memory module.

Figure 11:
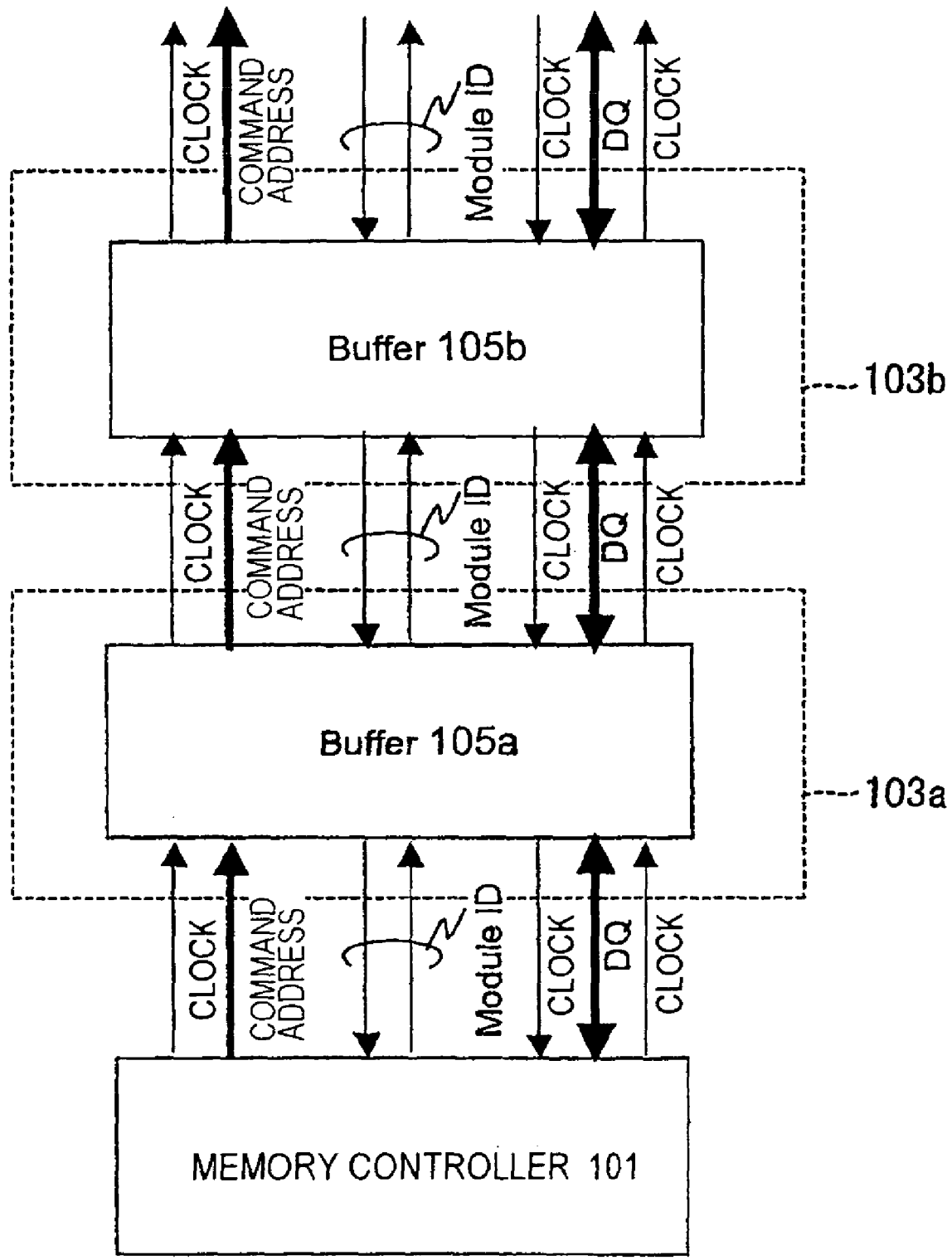
FIG. 11 is a block diagram for explaining a transmission system between a memory controller and a buffer in the first to third preferred embodiments of the present invention.

Referring to FIG. 11, more detailed description will be given about the signal transmission system between the memory controller (MC) 101 and each memory module 103 in the foregoing memory systems. In the shown example, it is assumed for simplifying the description that buffers 105*a* and 105*b* of memory modules 103*a* and 103*b* are connected in cascade. In this system, the memory controller 101 transmits a command/address signal (CA) synchronously with a clock signal, and these command/address signal (CA)

and the clock signal are received at the buffers 105*a* and 105*b* of the memory modules 103*a* and 103*b* in order.

On the other hand, data (DQ) signals are transmitted/received at the buffers 105*a* and 105*b* and the memory controller 101 synchronously with a plurality of pairs of bidirectional clock signals (complementary) CLK and CLKB. Specifically, when writing data into the DRAMs of the memory modules 103*a* and 103*b* from the memory controller 101, the data is transmitted to the buffers 105*a* and 105*b* synchronously with clocks outputted from the memory controller 101, while, when reading data from the DRAMs of the memory modules 103*a* and 103*b*, the buffers 105*a* and 105*b* of the memory modules 103*a* and 103*b* produce clocks from internal clocks of the DRAMs and output read data from the DRAMs to the memory controller 101 synchronously with the produced clocks. Upon packet transmission of a command/address signal and a data signal, a module identifying signal MID is transmitted from the memory controller 101 simultaneously with these command/address signal and data signal, and the buffers 105*a* and 105*b* identify effective head data of the signals and a reception/transmission destination memory module using the signal MID.

Figure 12:
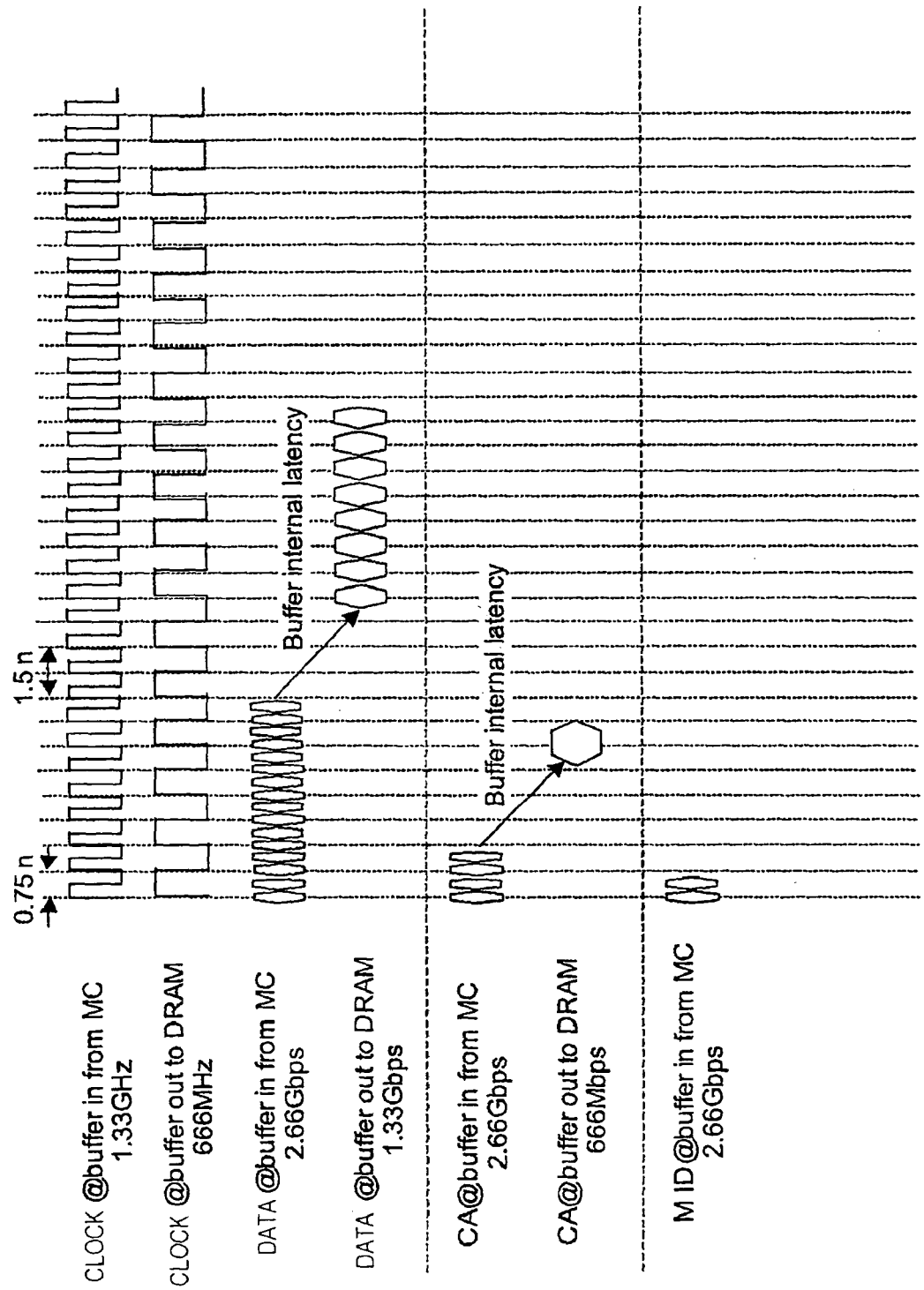
FIG. 12 is a time chart for explaining an operation of the transmission system shown in FIG. 11.

Referring to FIG. 12, there is shown a timing relationship in the system shown in FIG. 11. In the shown example, clocks having a frequency of 1.33 GHz (i.e. period of 0.75 ns) are produced from the memory controller (MC) 101 (see the first line in FIG. 12) and, synchronously with leading and trailing edges of the clocks, data is transmitted from the memory controller (MC) 101 to the buffers (see the third line). As a result, the data is transmitted to the buffers 105*a* and 105*b* from the memory controller (MC) 101 at a transmission speed of 2.66 Gbps.

On the other hand, internal clocks having a frequency of 666 MHz (period of 1.5 ns) are produced from the buffers 105*a* and 105*b* relative to the DRAMs (see the second line) and, with a lapse of a buffer internal latency time, the data received at the buffers are written into the DRAMs at a transmission speed of 1.33 Gbps synchronously with leading and trailing edges of the internal clocks (see the fourth line).

Then, synchronously with leading and trailing edges of the clocks having a frequency of 1.33 GHz, a command/address signal (CA) is outputted to the buffers 105*a* and 105*b* from the memory controller (MC) 101 (see the fifth line). After a lapse of a buffer internal latency time, the command/address signal (CA) is outputted to the DRAMs from the buffers synchronously with leading edges of the internal clocks (see the sixth line). Therefore, the command/address signal is outputted from the memory controller (MC) to the buffers 105*a* and 105*b* at a transmission speed of 2.66 Gbps and outputted from the buffers to the DRAMs at a transmission speed of 666 Mbps. Further, a module identifying signal MID is outputted from the memory controller (MC) to the buffers at a transmission speed of 2.66 Gbps synchronously with leading and trailing edges of the clocks of 1.33 GHz.

As clear from this, between the memory controller (MC) 101 and the buffers 105*a* and 105*b*, the data is transferred at a frequency twice the data frequency of the DRAMs, while the command/address signal (CA) is transferred at a four-times frequency. Therefore, the buffer on each memory module reduces the frequencies of the data and the command/address signal to ½ and ¼, respectively, by the use of a frequency divider or the like, and transmits them to the DRAMs.

Here, it is assumed that the memory system processes 8-bit continuous data (burst). Specifically, it is assumed that 16-bit continuous data is outputted on a 32-bit data bus at a transmission speed of 2.66 Gbps from the memory controller (MC) 101 to the buffers, and each buffer outputs the 16-bit continuous data alternately to two DQ pins of the DRAMs as 8-bit continuous data at a transmission speed of 1.33 Gbps.

Further, the command/address signal is outputted at a transmission speed of 2.66 Gbps from the memory controller (MC) to the buffers, and 4-bit data, for example, of one command/address signal line is distributed to four command/address signal lines at the buffer, thereby to be fed to the DRAMs at a transmission speed of 666 Mbps.

Figure 13:
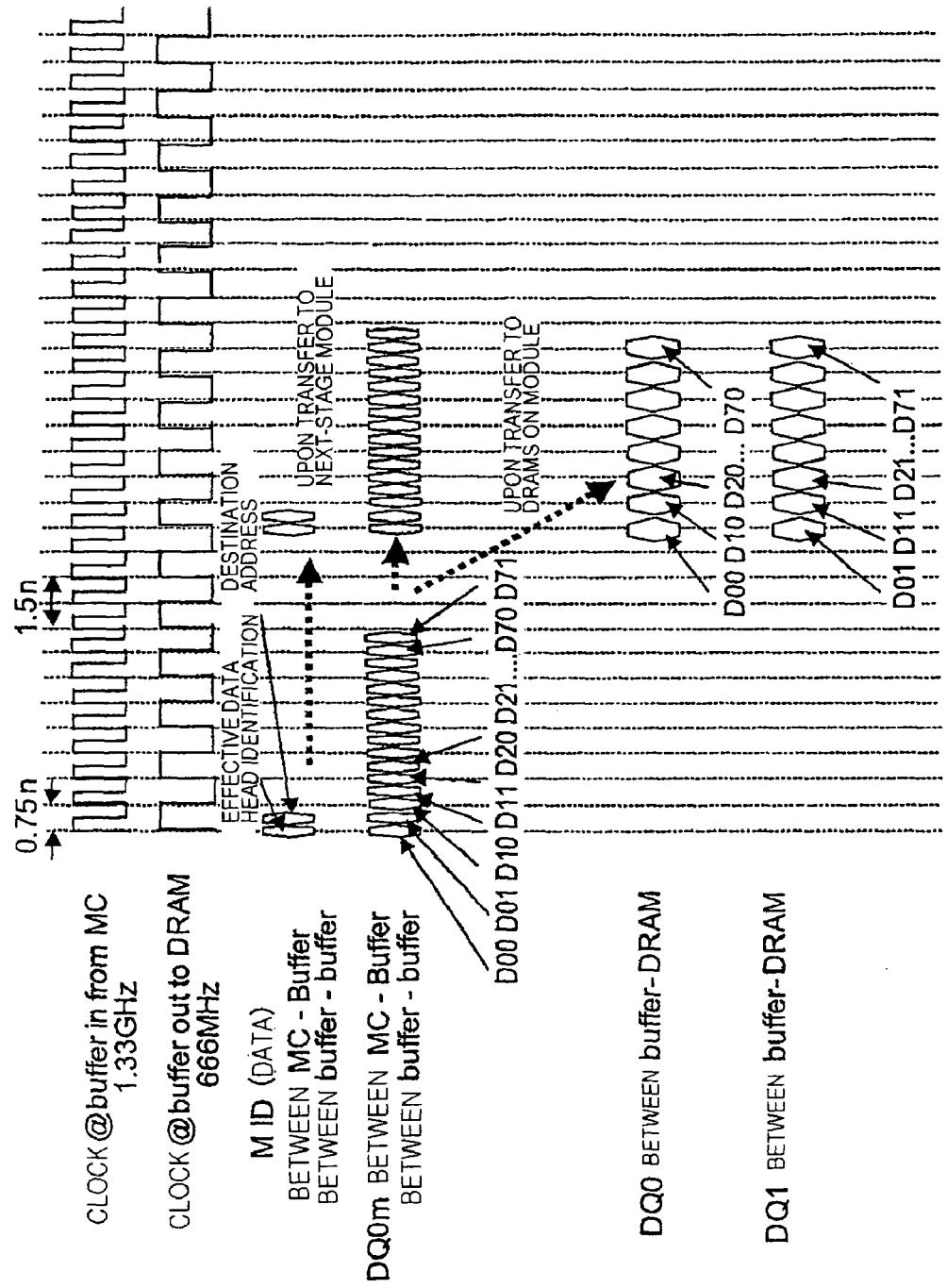
FIG. 13 is a time chart for explaining an operation, upon writing, of the transmission system shown in FIG. 11.

Now, further detailed description will be given about the foregoing operation by dividing it into data write and read operations, and a command/address signal transfer operation. FIG. 13 shows a data write operation from the memory controller (MC) to the DRAMs. As described above, the memory controller (MC) 101 outputs the clocks of 1.33 GHz to the buffers 105 (see the first line). Synchronously with the clocks, a module identifying signal MID and data DQ0*m* are outputted from the memory controller (MC) 101 (see the third and fourth lines).

Here, the module identifying signal MID includes an effective data head identifying signal and a destination address, while the data DQ0*m* includes two data sequences DQ0 and DQ1 to be distributed to two DQ pins of the DRAMs. Here, the data sequence DQ0 becomes continuous 8-bit data DQ00, 10, 20, 30 . . . 70, while the data sequence DQ1 becomes continuous 8-bit data DQ01, 11, 21, 31 . . . 71. As shown at the fourth line of FIG. 13, in the data DQ0*m*, unit data of the data sequences DQ0 and DQ1 are alternately placed synchronously with leading and trailing edges of the clocks shown at the first line. The data DQ0*m* is outputted from the memory controller (MC) 101 to the buffer 105*a* synchronously with the clocks. Here, when the number of data lines from the memory controller (MC) to the buffer is 32 in total, since data is fed to two DQ terminals of the DRAMs from the respective data lines, the system as a whole processes 8-bit continuous data at a 64-bit width. When the first-stage buffer 105*a* judges from the module identifying signal MID that it is not addressed to the memory module 103*a* to which the buffer 105*a* belongs, the module identifying signal MID is transferred to the next-stage memory module 103*b* along with the data DQ0*m* (see the third and fourth lines).

Then, as shown at the second line, the buffer 105*a* in the memory module 103*a* produces internal clocks of 666 MHz by dividing the clocks of 1.33 GHz to half, and outputs them to the DRAMs. If the memory module 103*a* is designated by the foregoing module identifying signal MID, the shown data DQ0*m* is, after a lapse of a buffer latency, written into the given DRAMs synchronously with the internal clocks. In the shown example, as shown at the fifth and sixth lines, the data sequences DQ0 and DQ1 are outputted from the buffer 105*a* to the two DRAMs synchronously with leading and trailing edges of the internal clocks.

Figure 14:
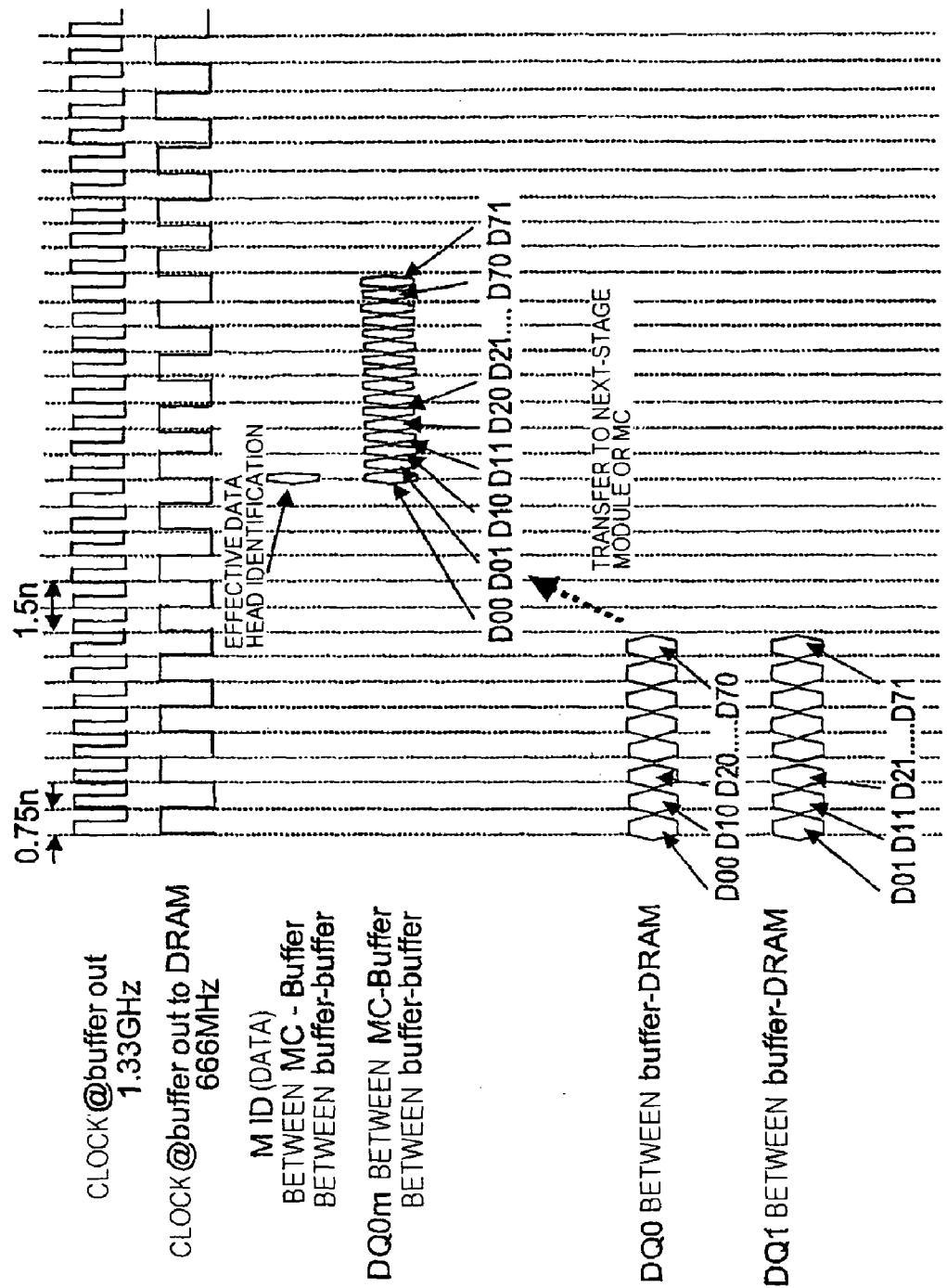
FIG. 14 is a time chart for explaining an operation, upon reading, of the transmission system shown in FIG. 11.

Now, referring to FIG. 14, description will be given about an operation when the data DQ0*m* is read from the DRAMs. In this case, it is assumed that the data DQ0*m* is read from the DRAMs of the memory module 103*a* to the memory controller (MC) 101 via the buffer 105*a*. First, the buffer 105*a* is outputting the internal clocks of 666 MHz to the DRAMs (see the second line in FIG. 14), while outputting the clocks having a frequency of 1.33 GHz to the memory controller (MC) 101 (see the first line). In this state, it is assumed that the data sequences DQ0 and DQ1 are read from two DQ terminals of the DRAMs. Here, it is assumed that the data sequences DQ0 and DQ1 include unit data D00, 10, 20 . . . 70 and unit data D01, 11, 21 . . . 71, respectively (see the fifth and sixth lines). These unit data are sent out to the buffer 105a from the two DQ terminals synchronously with the internal clocks. The buffer 105a outputs a module identifying signal MID representing the memory module 103a to which the buffer 105a belongs, to the memory controller (MC) as an effective data head identifying signal (see the third line). Subsequently, the buffer 105a alternately combines the continuous 8-bit unit data of the data sequences DQ0 and DQ1 from the two DQ terminals to multiplex them, and outputs the multiplexed data to the memory controller 101 synchronously with the clocks between the buffer 105a and the memory controller 101 as the 16-bit read data DQ0m. In case of a buffer located at a later stage of the buffer 105a like the buffer 105b, the data DQ0m is given to the memory controller (MC) via the buffer 105a of the prior stage.

As described above, it is seen that the data transmission speed and the clock frequency between the memory controller (MC) 101 and the buffers 105a and 105b are greater than the data transmission speed and the clock frequency between the buffers 105a and 105b and the DRAMs. With this configuration, the data write/read can be implemented at the transmission speed depending on the operation speed of the DRAMs by reducing the number of lines between the memory controller (MC) 101 and the buffers.

Figure 15:
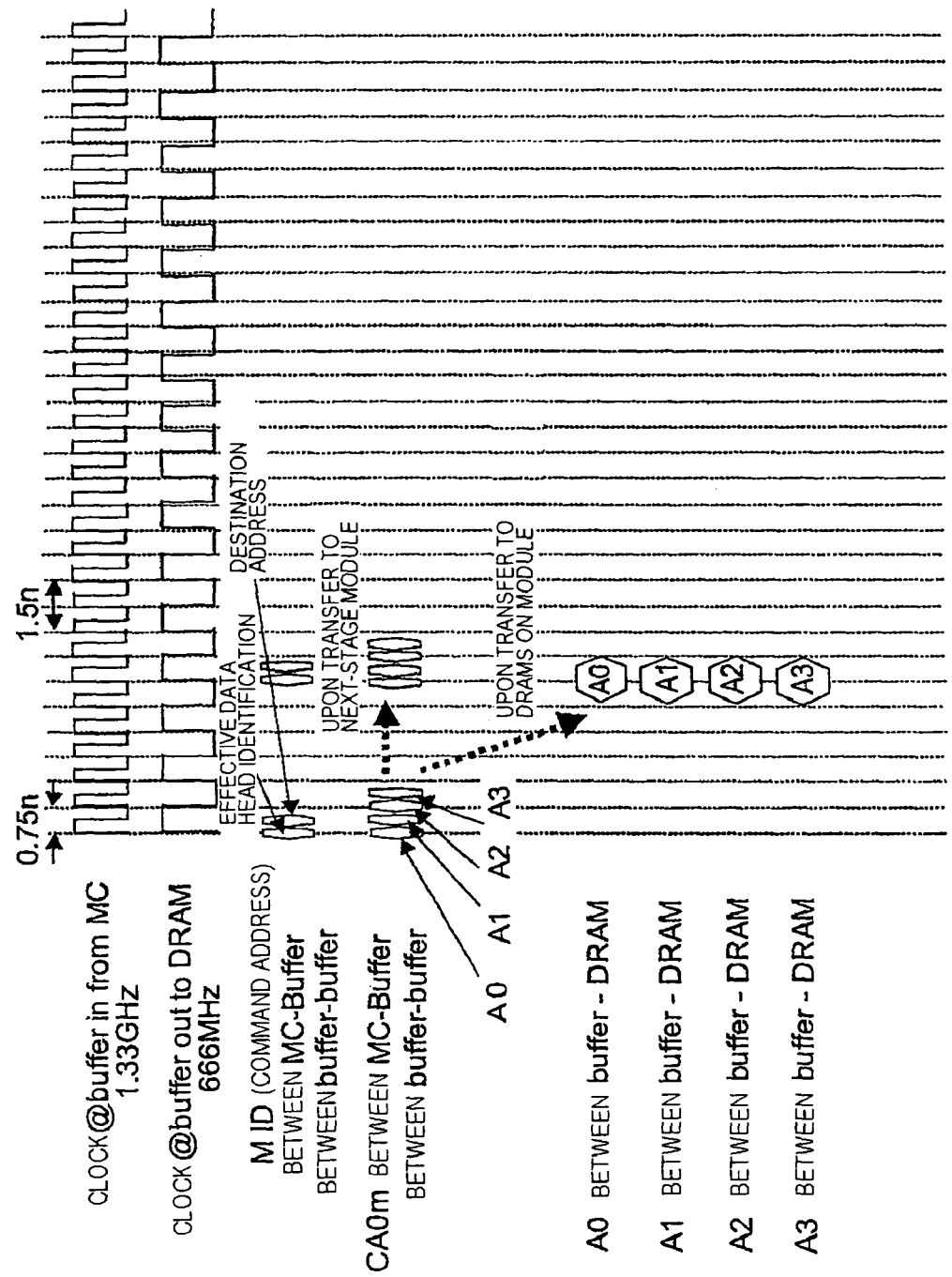
FIG. 15 is a time chart for explaining an operation, associated with a command/address signal, of the transmission system shown in FIG. 11.

Further, referring to FIG. 15, there is shown an operation when a command/address signal is given to the memory modules from the memory controller (MC) 101. As described before, it is assumed that the clocks having a frequency of 1.33 GHz is fed to the buffers 105a and 105b from the memory controller (MC) 101 (see the first line), the internal clocks of 666 MHz are used between each buffer 105 and the DRAMs 110 (see the second line). In this case, a module identifying signal MID includes a head identifying signal and a destination address signal of a command/address signal CA0m, the head identifying signal and the destination address signal of the command/address signal CA0m are outputted from the memory controller (MC) 101 synchronously with leading and trailing edges of the clocks of 1.33 GHz (see the third line), and the signal MID is transferred to the buffer 105a of the prior-stage memory module 103a and also to the buffer 105b of the subsequent-stage memory module 103b.

In this example, simultaneously with the module identifying signal MID, address signals A0 to A3 are outputted from the memory controller (MC) 101 to the buffer 105a in multiplexed mode as the command/address signal CA0m synchronously with leading and trailing edges of the clocks of 1.33 GHz, and subsequently, transferred to the buffer 105b (see the fourth line). The buffer 105 of the memory module 103 designated by the foregoing module identifying signal MID feeds the address signals A0 to A3 to the DRAMs mounted on the designated memory module 103 synchronously with the internal clocks. In FIG. 15, although only one of command/address signals is shown, a plurality of command/address signals given to the buffer are respectively converted into four command/address signals, for example, RAS, CAS, WE, and band address, and residual address signals etc. Through this, an operation mode, the DRAMs, and memory cells in the DRAMs within the designated memory module are selected.

In the foregoing, the description was given mainly about the signal transmission between the memory controller (MC) 101 and the memory modules 103. However, it is desirable that signal transmission can be achieved at high speed also between each memory module 103 and the DRAMs within the subject memory module 103.

For this purpose, the present invention proposes a method of transmitting data at high speed between the buffer 105 and the DRAM. Hereinbelow, description will be given about a case wherein the data transmission method according to the present invention is applied to the memory systems according to the foregoing first to third preferred embodiments of the present invention, but not necessarily limited thereto.

Figure 16:
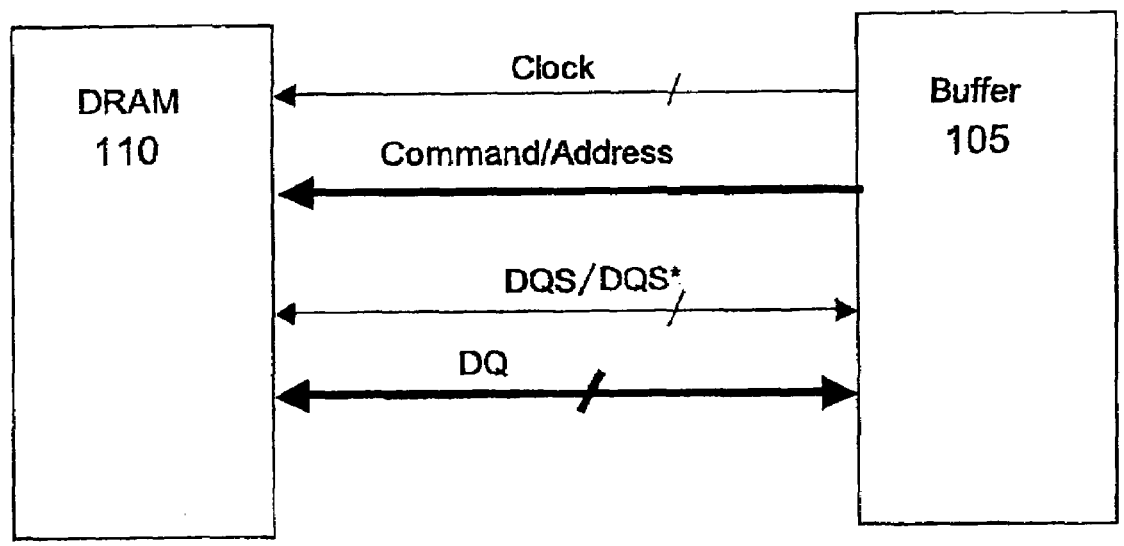
FIG. 16 is a block diagram for explaining a transmission system between a buffer and a DRAM, which is used in the memory systems according to the first to third preferred embodiments of the present invention.

Referring to FIG. 16, there are shown the DRAM 110 and the buffer 105 in the memory module 103 of the foregoing memory system.

In FIG. 16, the DRAM 110 performs data reception/transmission relative to the buffer 105 using data strobe signals DQS (and DQS* as complementary) (hereinbelow, only DQS will be described). In this case, the data strobe signal DQS is produced synchronously with clocks and, when bidirectionally transmitting data DQ, the data strobe signal DQS is transmitted in a transmission direction of the data DQ. For example, when transmitting the data DQ in a direction from the DRAM 110 to the buffer 105, the data strobe signal DQS is also outputted from the DRAM 110 to the buffer 105. This also applies to a case wherein data is transmitted from the buffer 105 to the DRAM 110.

Referring to FIG. 17A, there is shown an operation when writing data into the DRAM 110 from the buffer 105 in FIG. 16, while FIG. 17B shows an operation when reading data from the DRAM 110. First, as shown in FIG. 17A, in case of data writing, after a write command (WRT) and an address (Add) are given to the DRAM from the buffer, data writing is implemented with a data strobe signal DQS synchronously with leading and trailing edges of the clocks, and this writing operation continues while the strobe signal DQS is given. Therefore, subsequently to the production of the command/address signal, data is written after a lapse of a predetermined latency time (WL=4 in the figure).

Further, as shown in FIG. 17B, also in case of data reading, a read command (RED) and an address (Add) are given to the DRAM from the buffer, and data reading is implemented with a data strobe signal DQS synchronously with leading and trailing edges of the clocks.

As described above, when the data strobe signal DQS is used, data is transmitted at the timing matched with the data strobe signal DQS, and received by the data strobe signal DQS. Accordingly, in the transmission/reception system using the data strobe signal, it is necessary that logics and layout delays of the data strobe signal DQS and the data DQ be matched with each other within the reception-side device. However, when a delay changes due to temperature variation or voltage variation, a setup and a hold time of a signal receivable by the device are deteriorated. For higher frequency operation, a shorter setup and hold time are required. Therefore, there is a limitation in speedup in the system wherein the data strobe signal is transmitted bidirectionally.

For carrying out data transmission/reception between the DRAM 110 and the buffer 105 at higher speed, the present invention proposes to use, instead of the foregoing data strobe signal DQS, a signal (herein called "data phase signal DPS") that is constantly transmitted bidirectionally at the timing of a data signal and transmitted/received at the DRAM 110 and the buffer 105. By using the data phase signal DPS that is transmitted/received bidirectionally, transmission/reception clocks can be reproduced using a DLL in each device. Further, when the DLL is used, it is possible to cancel temperature variation or voltage variation by a replica delay, and further, since clocks can be set to the optimum timing, data reception is made possible without using a delay logic. Therefore, a shorter setup and hold time can be achieved.

Figure 18:
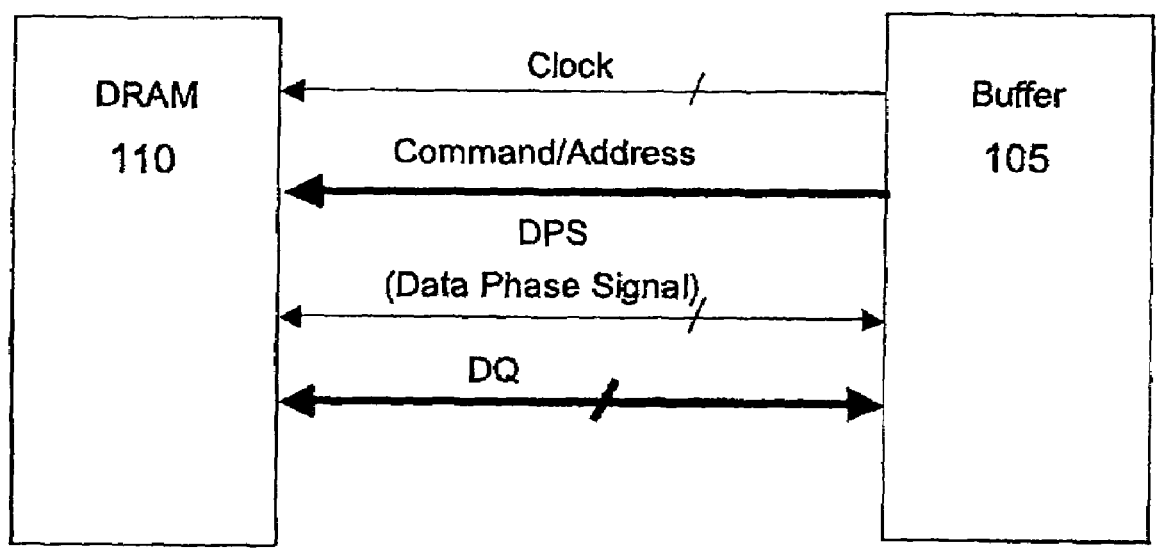
FIG. 18 is a block diagram for explaining a transmission system of the present invention that enables speedup of the transmission system explained with reference to FIG. 17.

Referring to FIG. 18, there is shown a schematic configuration of a data transmission system in which data transmission is performed between the DRAM 110 and the buffer 105 using the foregoing data phase signal DPS. As clear from comparison with FIG. 16, in the data transmission system shown in FIG. 18, the data phase signal DPS is, instead of the data strobe signal DQS, transmitted/received bidirectionally between the buffer 105 and the DRAM 110, and the data phase signal DPS is, as a timing signal of data DQ transmitted from the buffer 105 or the DRAM 110, fed to the other device. Specifically, when writing data DQ into the DRAM 110 from the buffer 105, a write data phase signal DPS is fed to the DRAM 110 from the buffer 105 along with write data DQ at predetermined write timing, while, when reading data DQ from the DRAM 110, a read data phase signal DPS produced at timing different from the foregoing write timing is fed to the buffer 105 from the DRAM 110 along with read data DQ.

By identifying the write timing and the read timing, the DRAM 110 and the buffer 105 respectively extract the write data phase signal and the read data phase signal (DPS), and perform writing and reading of the data DQ using the extracted write data phase signal and read data phase signal (DPS). As clear from this, the buffer 105 and the DRAM 110 are provided with, in addition to the foregoing DLLs, circuits for identifying the timings of the write data phase signal and the read data phase signal (DPS).

Figure 19:
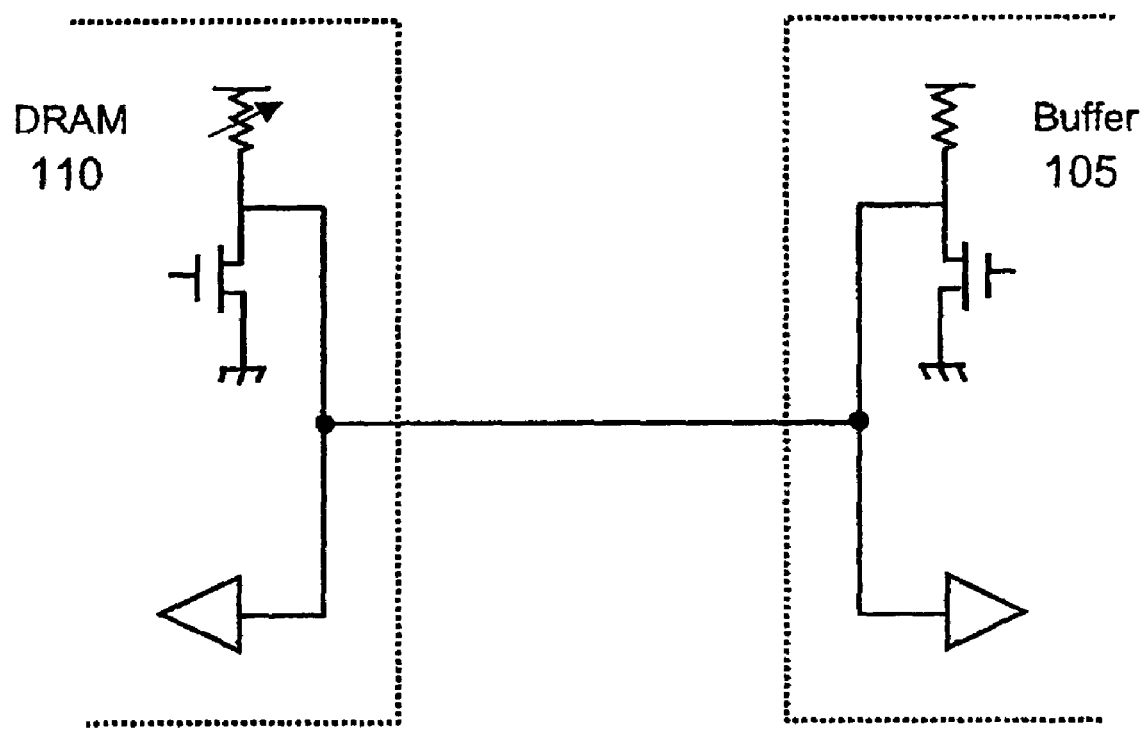
FIG. 19 is a circuit diagram showing configurations of driver portions of a buffer and a DRAM employing the transmission system of FIG. 18.

Referring to FIG. 19, there are shown driver circuits and receiver circuits (i.e. transmission/reception circuits) of a buffer 105 and a DRAM 110 that are used when transmitting/receiving a data phase signal DPS between the buffer 105 and the DRAM 110 in a 1-rank configuration. As shown in the figure, each of the drivers of the buffer 105 and the DRAM 110 is provided with an open-drain N-channel MOS transistor. The drain of the N-channel MOS transistor of the DRAM 110 is connected with a variable resistance as a terminating resistance, while the drain of the N-channel MOS transistor of the buffer 105 is connected with a fixed resistance as a terminating resistance. When the variable resistance is connected, a resistance value can be adjusted by the rank configuration of the DRAM side. Although the terminating resistance is provided within each of the DRAM 110 and the buffer 105, it is readily understood that it may be provided outside the device. A signal line for data phase signal DPS transmission connected to the drains of both transistors of the DRAM 110 and the buffer 105 is connected to internal circuits of the DRAM 110 and the buffer 105 via amplifiers, respectively.

In the configuration shown in FIG. 19, a timing signal is given to the gate of the N-channel MOS transistor of the buffer 105 at predetermined timing and period to thereby turn ON/OFF the N-channel MOS transistor of the buffer 105, so that a write data phase signal DPS is fed to the DRAM 110 from the buffer 105 and also to the inside of the buffer 105. On the other hand, a timing signal having a phase different from that of the timing signal of the buffer 105 while produced at the same period is given to the gate of the N-channel MOS transistor of the DRAM 110 to thereby turn ON/OFF the N-channel MOS transistor of the DRAM 110, so that a read data phase signal DPS is fed to the buffer 105 from the DRAM 110 and also to the inside of the DRAM 110. As shown in the figure, since the driver in each of the DRAM 110 and the buffer 105 is in open-drain mode, a bus is in a so-called wired OR configuration, and further, since the data phase signals DPS from the DRAM 110 and the buffer 105 are outputted at the different timings, even if both signals are outputted on the same signal line, there is no possibility of collision therebetween.

Figure 20:
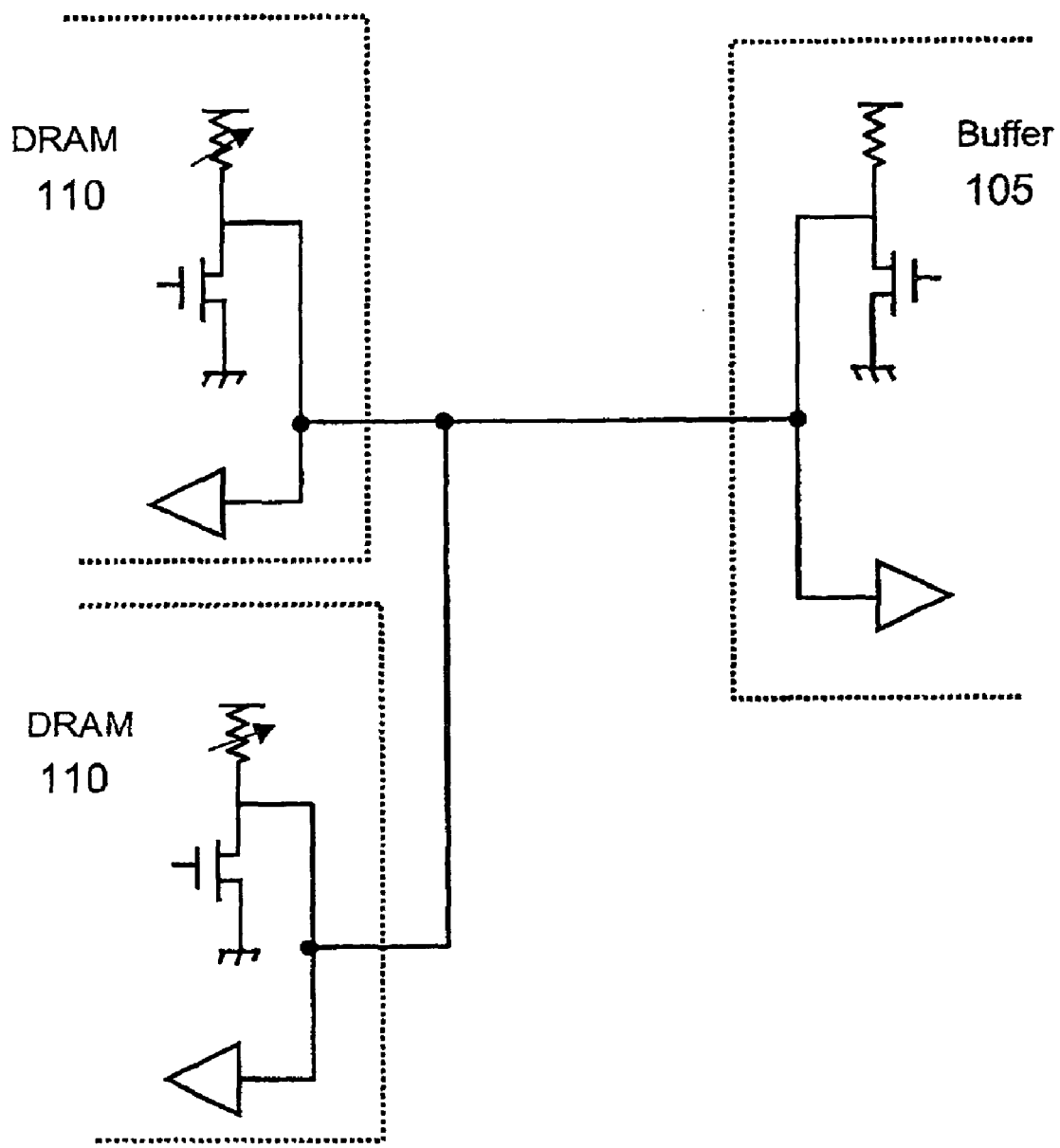
FIG. 20 is a circuit diagram showing other configurations of driver portions of a buffer and DRAMs employing the transmission system of FIG. 18.

Referring to FIG. 20, there are shown driver circuits for data phase signal DPS transmission/reception in a case wherein two DRAMs 110 in a 2-rank configuration are connected to a buffer 105. As clear from the figure, the configuration of FIG. 20 differs from that of FIG. 19 in that the drivers of the two DRAMs 110 are connected to a single signal line of data phase signal DPS, while the configuration in each DRAM 110 is the same. A variable resistance is connected to the drain of an N-channel MOS transistor in each DRAM 110 and, in this example, is adjusted to a resistance value suitable for the 2-rank configuration of the DRAMs 110.

Referring to FIGS. 21A and 21B along with FIG. 18, description will be given about an operation when writing data DQ (i.e. write operation) relative to the DRAM 110, and an operation when reading data DQ (i.e. read operation) from the DRAM 110. As shown in FIG. 21A, upon write operation, the buffer 105 feeds a write command (WRT) and an address signal (Add) to the DRAM 110 synchronously with clocks. In this event, a write data phase signal WDPS is transmitted to the DRAM 110 from the buffer 105 as a data phase signal DPS (see the fourth line). The shown write data phase signal WDPS is featured by the timing of a leading edge (rise) of each of pulses in a pulse stream having a frequency that is ¼ times the clocks.

On the other hand, a read data phase signal RDPS is transmitted on the same signal line in multiplexed mode from the DRAM 110 to the buffer 105 at the timing that avoids collision with the write data phase signal WDPS (here, the timing shifted by two clocks). As shown at the fourth line in FIG. 21B, like the write data phase signal WDPS, the read data phase signal RDPS is featured by the timings of leading edges (rise) of a pulse stream having a frequency ¼ times the clocks, and the timings thereof occur between the timings of the write data phase signal WDPS. In this manner, by deviating the timing between the write data phase signal WDPS and the read data phase signal RDPS, both signals are prevented from collision therebetween on the single signal line. In the shown example, the timing between the write data phase signal WDPS and the read data phase signal RDPS is shifted by two clocks. However, it is needless to say that the timing is not limited thereto as long as collision of both signals can be avoided.

Referring further to FIG. 21A, the phases of the clocks and the write data phase signal (WDPS) agree with each other at the buffer 105 in the write operation from the buffer 105, while the phase of the read data phase signal (RDPS) transmitted from the DRAM does not agree therewith. The data DQ is written after a lapse of a write latency time (WL=4) such that edges of rise (leading edge) and fall (trailing edge) of the clocks are placed at the center of a signal effective width.

Upon the read operation shown in FIG. 21B, the DRAM 110 reproduces the clocks in the DRAM 110 from the read data phase signal (RDPS). Matching with the timing of the reproduced clocks, the data DQ is transmitted to the buffer 105 from the DRAM 110. In the shown example, the timing of the data coincides with the clock edge. However, the center of the effective width may be matched with the clock edge.

In the foregoing example, the DRAM 110 and the buffer 105 constantly transmit the data phase signals DPS bidirectionally on the same signal line during a normal operation, i.e. during an operation other than a power save mode. Further, the drivers of the DRAM 110 and the buffer 105 are operated at the timings shifted by two clocks and, as shown in FIGS. 19 and 20, the open-drain mode is employed. Accordingly, the bus is in the so-called wired OR configuration, and therefore, there is no possibility of bus fight.

Referring to FIGS. 21A and 21B, the description was given about the timing relationship between the clocks and the write and read data phase signals WDPS and RDPS upon writing and reading, and the timing relationship among the data, the clocks, and the data phase signals (WDPS, RDPS). In the DRAM 110 and the buffer 105 having received the data phase signals (WDPS, RDPS), it is necessary to reproduce therein the data transmission/reception clocks from the data phase signals (WDPS, RDPS).

Now, referring to FIG. 22, description will be given about a procedure of reproducing the data reception/transmission clocks inside the DRAM 110 and the buffer 105 from the data phase signal DPS (write or read data phase signal WDPS, RDPS) according to the present invention upon the start of operation of the memory system.

First, the buffer 105 is transmitting clocks to the DRAM 110 (see the first line). In this example, the buffer 105 produces the clocks having a frequency of 666 MHz. In this state, the buffer 105 transmits a write data phase signal WDPS (see the second line) synchronously with the clocks. The shown write data phase signal WDPS is produced by dividing the frequency of the clocks to quarter, and therefore, the write data phase signal WDPS has a frequency of 666/4 MHz (i.e. ¼ times the clocks), and the write data phase signal WDPS is inputted into the DRAM 110 with a time delay (see the third line).

The DRAM 110 produces, using a DLL provided in the inside thereof, internal clocks as reproduced clocks for determining data (DQ) reception timing, from the write data phase signal WDPS (see the fourth line). The shown internal clocks have a frequency of 666 MHz.

Figure 22:
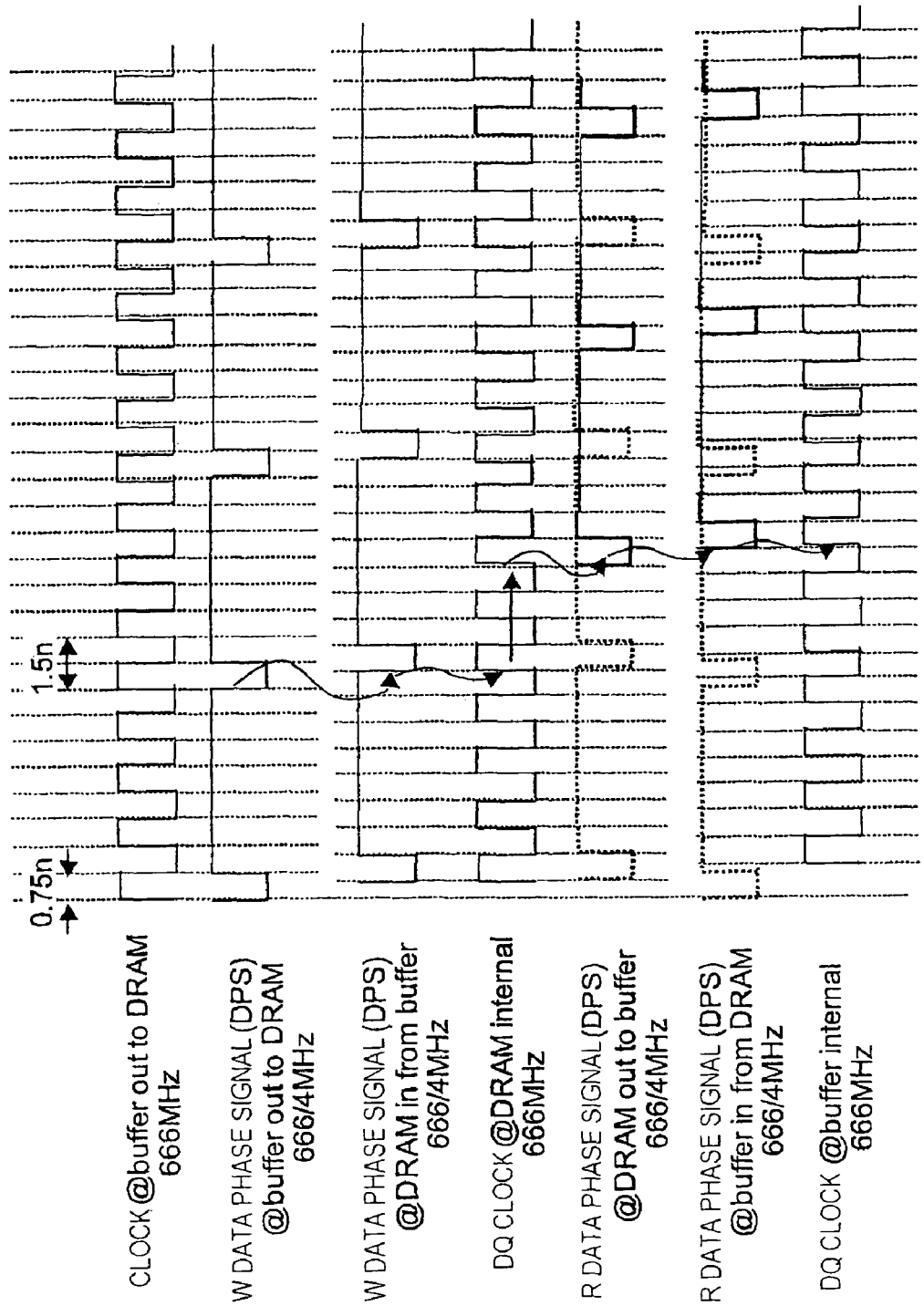
FIG. 22 is a time chart for schematically explaining a timing relationship among signals in the transmission system of FIG. 18.

Further, as shown in FIG. 22, after reproducing the data (DQ) reception clocks as the internal clocks, the DRAM 110 produces a read data phase signal RDPS shown by a solid line, based on the write data phase signal WDPS and the internal clocks by shifting the internal clocks by two clocks, and transmits the read data phase signal RDPS to the buffer 105 (see the fifth line). As shown in FIG. 22, the read data phase signal RDPS has a frequency ¼ times the internal clocks, and is produced so as not to collide with the write data phase signal WDPS shown by a broken line.

The read data phase signal RDPS is received at the buffer 105 with a time delay (see the sixth line), and the buffer 105 reproduces data (DQ) reception clocks of 666 MHz for receiving data from the DRAM 110 in the buffer 105 (see the seventh line), from the received read data phase signal RDPS. The timing chart shown in FIG. 22 conceptually explains the timing relationship between the data phase signals DPS and the clocks, while, actually, as described later, the DRAM internal clocks for data reception and data output are produced at the optimum internal timings, respectively. Further, the shown clocks do not necessarily have a period ¼ times that of the data phase signals DPS, and may be multiphase clocks.

In any case, a feature of the shown transmission system resides in that the reception/transmission clocks within the DRAM 110 and the buffer 105 are reproduced from the data phase signals WDPS and RDPS.

Figure 23:
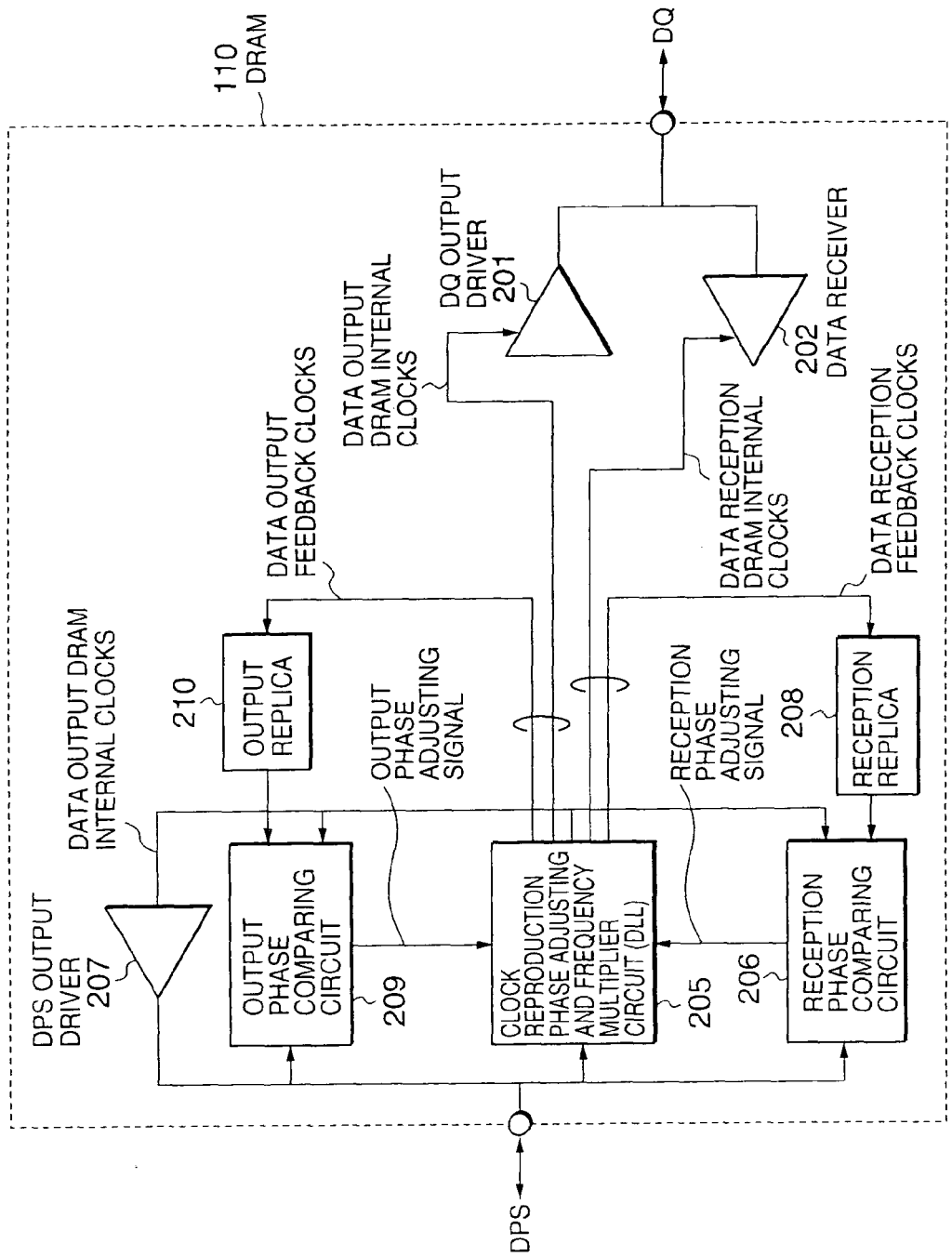
FIG. 23 is a block diagram for explaining a configuration of a DRAM that can realize the transmission system shown in FIG. 18.

Referring to FIG. 23, description will be given about a concrete configuration of the DRAM 110 that performs the foregoing operation. In the figure, only an interface for transmitting/receiving data phase signals DPS and data (DQ) relative to the buffer 105 is shown, and a memory cell region for writing and reading the data (DQ) is omitted in FIG. 23. Incidentally, the memory cell region of the DRAM 110 is connected to a data (DQ) output driver 201 and a data receiver 202 to thereby perform reading and writing of the data (DQ). Further, the shown DRAM 110 is provided with a clock reproduction phase adjusting and frequency multiplier circuit 205 composed of a DLL. A write data phase signal WDPS is inputted into the DLL 205, while a read data phase signal RDPS from the DLL 205 is outputted via a DPS output driver 207. As clear from this, it is assumed that the shown DLL 205 is provided with a delay line including a plurality of delay cells, a phase detector, an integrator, and a frequency multiplier.

Specifically, the DLL 205 is given data phase signals DPS including write and read data phase signals WDPS and RDPS, and the data phase signals DPS are also given to a reception phase comparing circuit 206 and an output phase comparing circuit 209. The DLL 205 reproduces data reception DRAM internal clocks from the write data phase signal WDPS, and produces data reception feedback clocks. The data reception DRAM internal clocks are given to the data receiver 202 so as to be used for writing data DQ, while the data reception feedback clocks are given to a reception replica 208 where the clocks are divided to quarter in frequency, so that a replica signal of the received write data phase signal WDPS is outputted to the reception phase comparing circuit 206. The reception phase comparing circuit 206 suppresses the read data phase signal RDPS by the replica signal from the reception replica 208 to thereby output to the DLL 205 a reception phase adjusting signal relative to DPS output DRAM internal clocks with respect to only the write data phase signal WDPS.

Further, the shown DLL 205 delays the data reception DRAM internal clocks by two clocks to thereby output DRAM internal clocks for outputting the read data phase signal RDPS, data output feedback clocks, and data output DRAM internal clocks. Among them, the DPS output DRAM internal clocks are given to the DPS output driver 207 and the output phase comparing circuit 209, while the data output DRAM internal clocks are fed to the data output driver 201. Further, the data output feedback clocks are given to an output replica 210, and the output replica 210 outputs a replica signal of the read data phase signal RDPS to the output phase comparing circuit 209. The DPS output driver 207 sends out the read data phase signal RDPS to the buffer 105 in response to the DPS output DRAM internal clocks.

While suppressing the timing of the write data phase signal WDPS by the read replica signal given from the output replica 210, the output phase comparing circuit 209 compares phases of the read data phase signal RDPS and the output of the DLL 205 and outputs to the DLL 205 an output phase adjusting signal depending on a comparison result. As a result, the read data phase signal RDPS is transmitted from the shown DRAM 110 to the buffer 105.

As described above, in the shown DRAM 110, when the DRAM 110 transmits the read data phase signal RDPS, the DPS output DRAM internal clocks are outputted so as not to perform phase comparison and, when receiving the write data phase signal WDPS, the DPS output DRAM internal clocks are inputted into the reception phase comparing circuit 206 to thereby perform an operation to inhibit feedback of a comparison value to the DLL 205.

Figure 24:
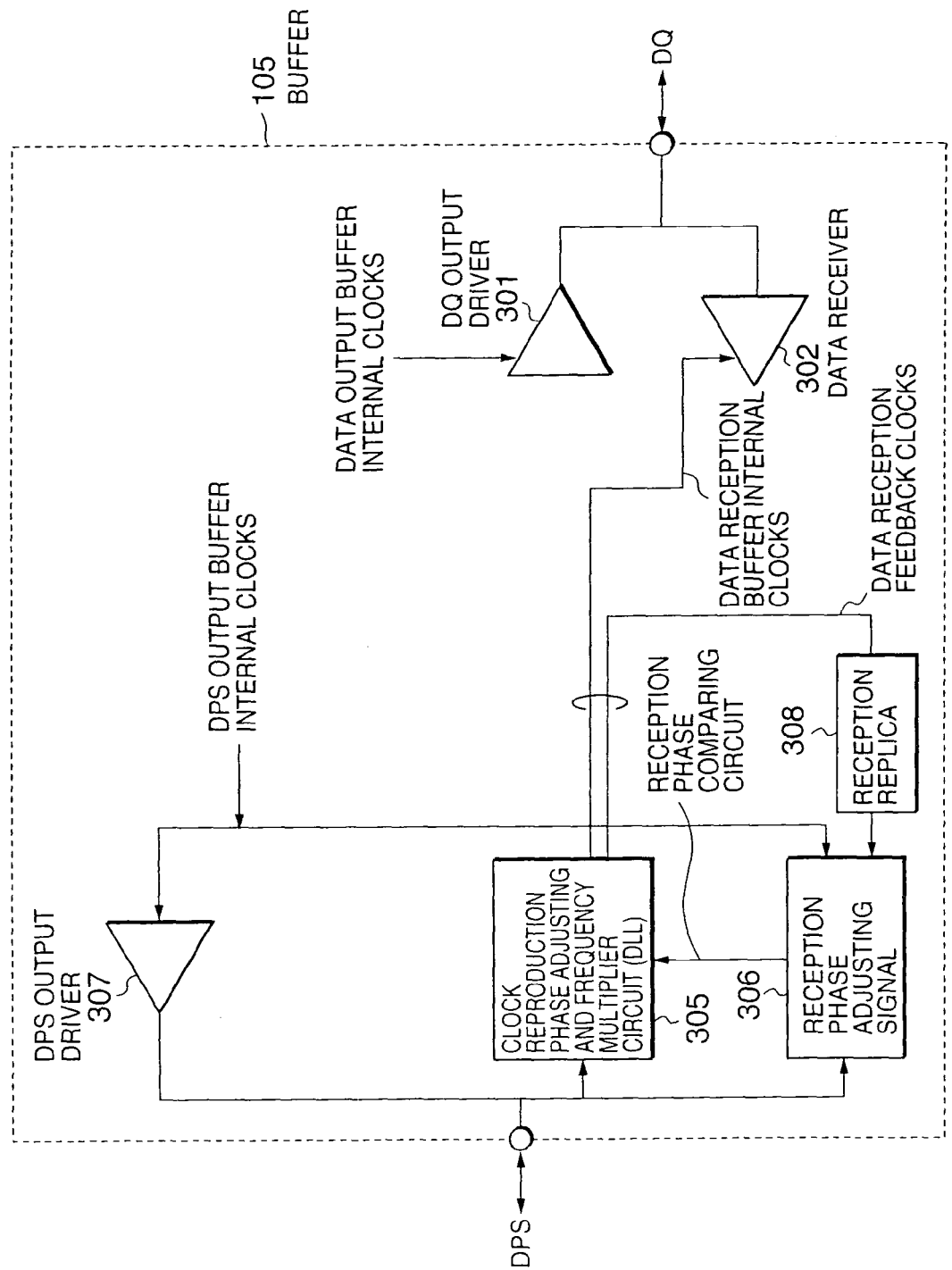
FIG. 24 is a block diagram for explaining a configuration of a buffer that can realize the transmission system shown in FIG. 18.

Referring to FIG. 24, description will be given about a concrete configuration of the buffer 105 that performs data transmission/reception relative to the DRAM 110 shown in FIG. 23. Like the DRAM 110 shown in FIG. 23, the buffer 105 is provided with a DQ output driver 301 for outputting data to the DRAM 110, and a data receiver 302 for receiving read data from the DRAM 110, and further provided with a DLL 305 forming a clock reproduction phase adjusting and frequency multiplier circuit for data phase signal DPS transmission/reception. Further, in the shown buffer 105, DPS output buffer internal clocks are produced by a non-shown clock generator, and fed to a DPS output driver 307 and a reception phase comparing circuit 306. The DPS output driver 307 divides the given clocks to quarter in frequency to thereby output a write data phase signal DPS (i.e. WDPS) to the DRAM 110, and the write data phase signal WDPS is also given to the DLL 305 and the reception phase comparing circuit 306 within the buffer 105.

In this state, when the read data phase signal RDPS is received from the DRAM 110, the DLL 305 of the buffer 105 produces data reception buffer internal clocks and data reception feedback clocks, and outputs them to the data receiver 302 and a reception replica 308, respectively. The reception replica 308 produces a replica signal of the read data feedback signal RDPS from the data reception feedback clocks, and outputs it to the reception phase comparing circuit 306. As a result, the reception phase comparing circuit 306 ignores the write data phase signal WDPS outputted from the DPS output driver 307, and outputs to the DLL 305 a reception phase adjusting signal with respect to a phase of the read data phase signal RDPS.

In the shown buffer 105, for reproducing the clocks from the read data phase signal RDPS from the DRAM 110, the DPS output buffer internal clock signal is inputted into the reception phase comparing circuit 306 to thereby inhibit feedback of a comparison value to the DLL.

Figure 25:
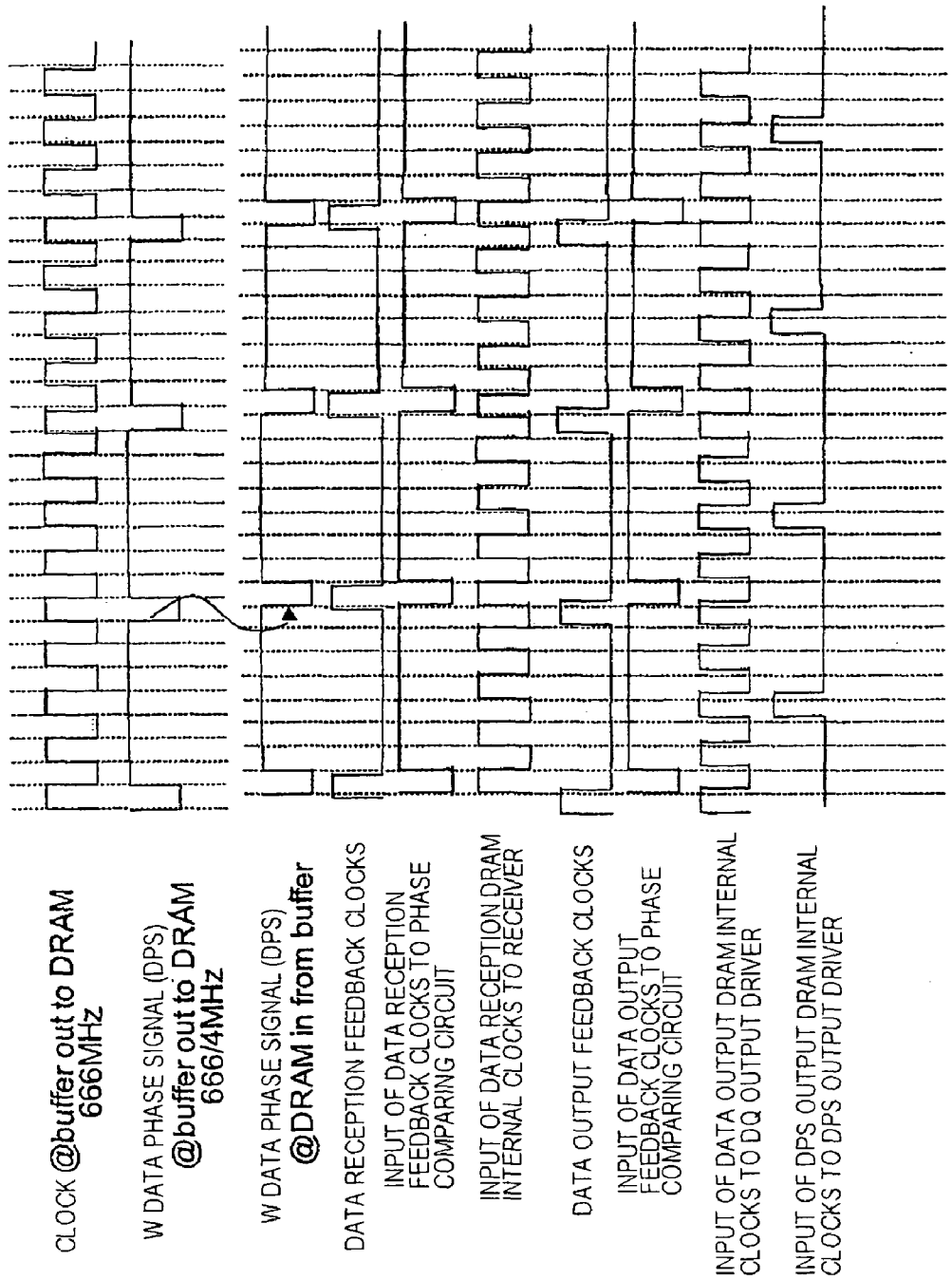
FIG. 25 is a timing chart for explaining a timing relationship upon the start of operation in the DRAM shown in FIG. 23.
Figure 26:
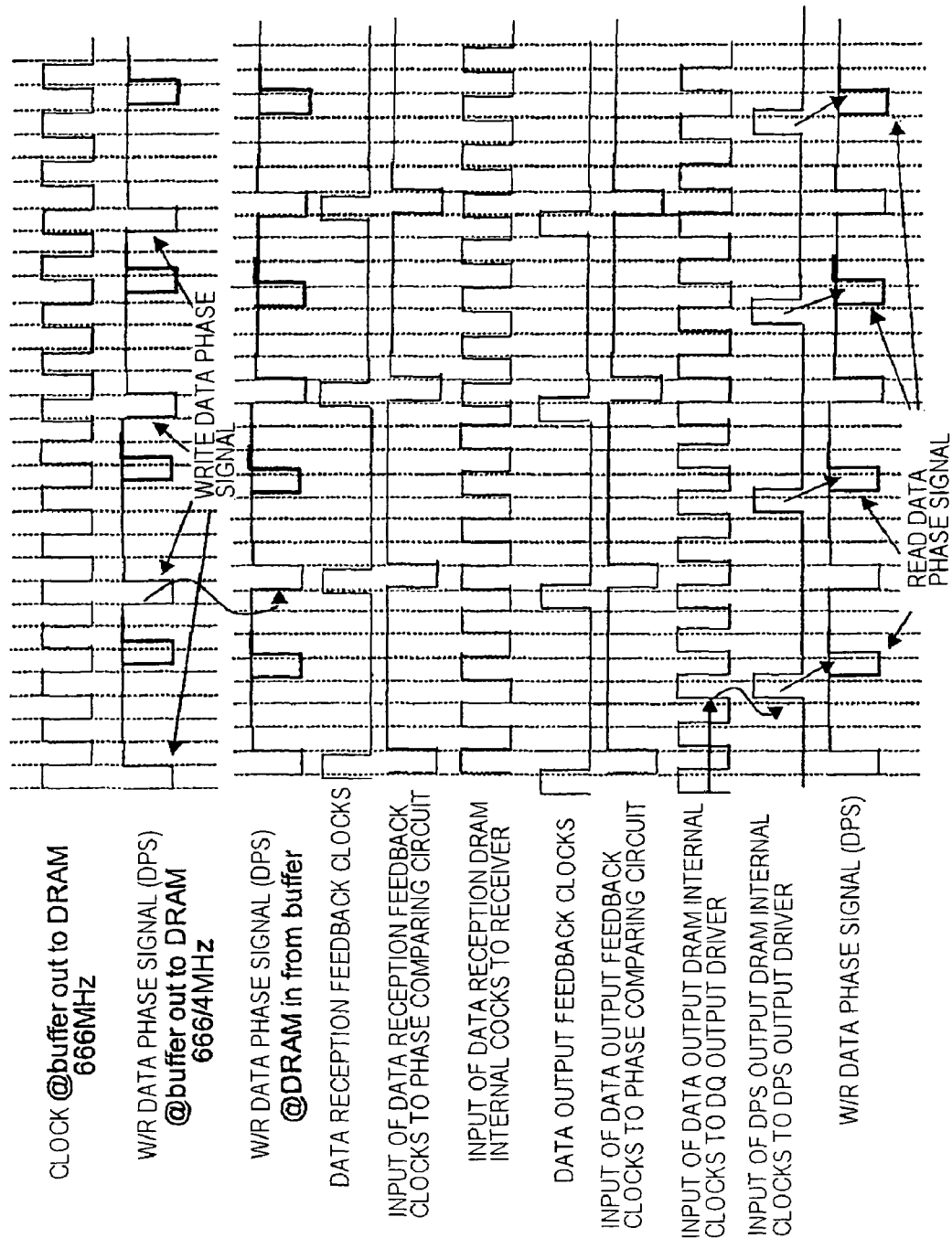
FIG. 26 is a timing chart for explaining a timing relationship during a normal operation in the DRAM shown in FIG. 23.

FIG. 25 shows a timing chart upon the start of operation in the DRAM 110 shown in FIG. 23, and FIG. 26 shows a timing chart during a normal operation of the DRAM 110. Upon the start of operation shown in FIG. 25, a read data phase signal RDPS is not outputted to the buffer 105 from the DRAM 110. In FIG. 25, like in FIG. 22, DPS output buffer internal clocks of 666 MHz are produced in the buffer 105, and are divided to quarter in frequency at the DPS output driver 307 (FIG. 24) so that a write data phase signal WDPS is outputted synchronously with the clocks (see the second line in FIG. 25). The write data phase signal WDPS is inputted into the DRAM 110 with a time delay (see the third line). In the DRAM 110, data reception feedback clocks having an advanced phase relative to the received WDPS are produced at the DLL 205 (see the fourth line) and outputted to the reception replica 208, and a replica signal of the WDPS is outputted from the reception replica 208 to the reception phase comparing circuit 206 (see the fifth line).

Following a reception phase adjusting signal from the reception phase comparing circuit 206 and the received WDPS, the DLL 205 of the DRAM 110 outputs data reception DRAM internal clocks to the data receiver 202 (see the sixth line). Further, the DLL 205 of the DRAM 110 outputs to the output replica 210 data output feedback clocks having an advanced phase relative to the internal clocks (see the seventh line), and outputs to the DQ output driver 201 data output DRAM internal clocks synchronously with the data output feedback clocks (see the ninth line). Further, as shown at the eighth line in FIG. 25, a data output feedback signal is fed to the output phase comparing circuit 209 as a replica signal from the output replica 210, and phase comparison is performed with the presence of this replica signal so that DPS output DRAM internal clocks as shown at the tenth line is outputted to the DPS output driver 207.

Now, referring to FIG. 26, the normal operation of the DRAM 110 shown in FIG. 23 will be described. In this case, as shown at the second and third lines in FIG. 26, a write data phase signal WDPS is outputted from the buffer 105, while a read data phase signal RDPS (see thick lines) is outputted from the DRAM 110. In this case, at the buffer 105, DPS output clocks are produced, and the write data phase signal WDPS synchronous with the DPS output clocks is transmitted to the DRAM 110, while, at the DRAM 110, data reception feedback clocks, a replica signal of the data reception feedback clocks, data reception DRAM internal clocks, data output feedback clocks, and data output DRAM internal clocks are produced, which is the same as FIG. 25 (see the fourth to eighth lines). Further, as shown at the ninth line, when the data output DRAM internal clocks are produced, the DLL 205 produces DPS output DRAM internal clocks by delaying the internal clocks by two clocks and, according to the DPS output DRAM internal clocks, a read data phase signal RDPS is produced from the DPS output driver 207 as shown by thick lines at the tenth line, and is received at the buffer 105 as shown at the second line.

Figure 27:
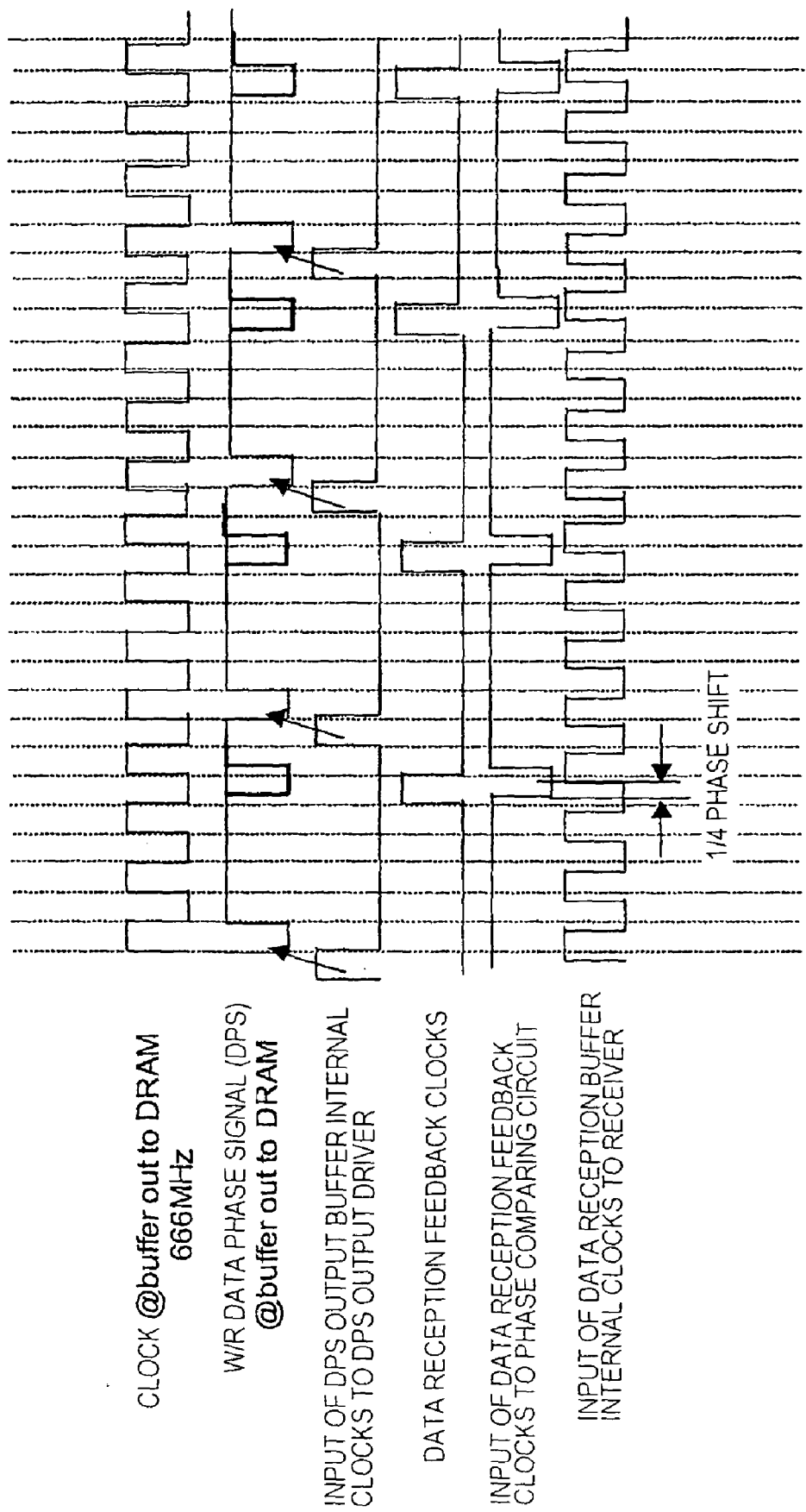
FIG. 27 is a time chart for explaining a timing relationship upon reading in the buffer shown in FIG. 24.

FIG. 27 shows a timing chart in the buffer 105 (FIG. 24) when the foregoing RDPS is received. It is assumed that data transmitted from the DRAM 110 is matched in phase with edges of the read data phase signal RDPS in this embodiment. In this connection, the buffer 105 shifts a phase of the reception buffer internal clocks by ¼ relative to a phase of a replica signal from the reception replica 308 which is obtained from the data reception feedback clocks.

In the foregoing examples, there have been shown the systems wherein when the internal clock signals are reproduced from the data phase signals, the clocks are reproduced directly from the data phase signals.

Figure 28:
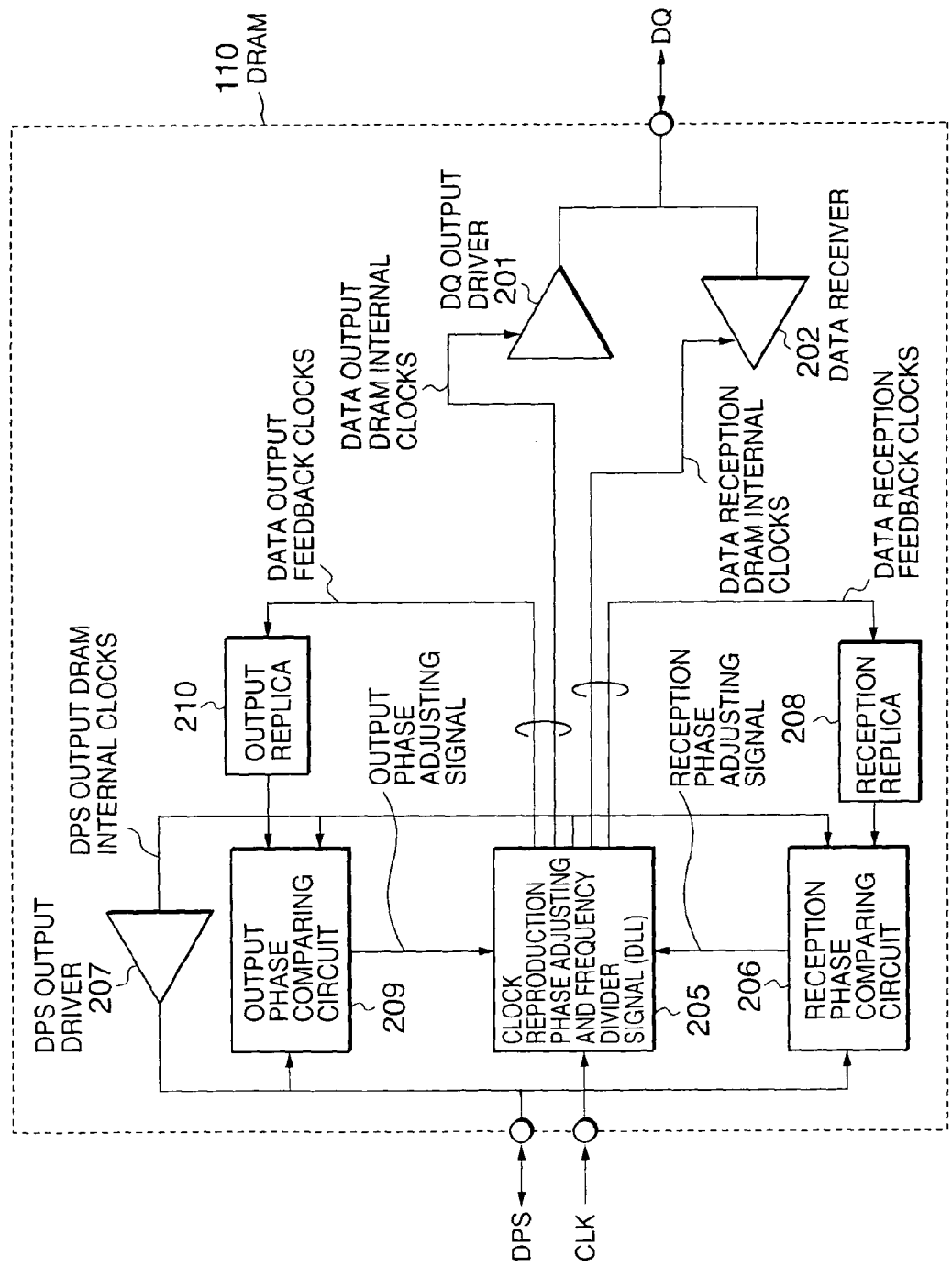
FIG. 28 is a block diagram showing an example of a DRAM that can realize a transmission system according to the present invention.
Figure 29:
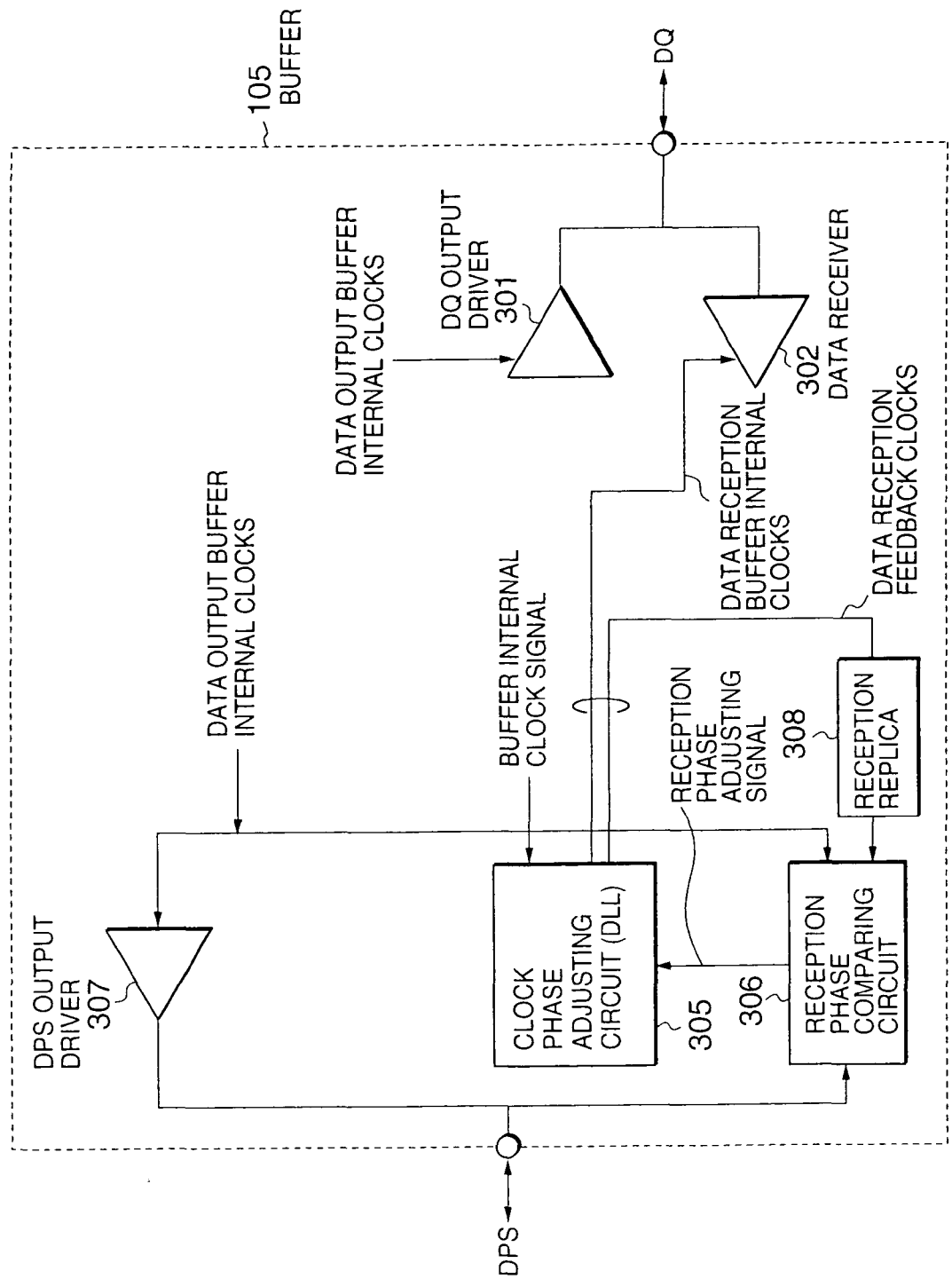
FIG. 29 is a block diagram of a buffer that can perform transmission/reception of a signal relative to the DRAM shown in FIG. 28.

Referring to FIGS. 28 and 29, there are shown modifications of the DRAM 110 and the buffer 105 respectively shown in FIGS. 23 and 24. The DRAM 110 shown in FIG. 28 differs from the DRAM 110 shown in FIG. 23 in that clocks CLK are given to a DLL 205 from the exterior, and a data phase signal DPS is not given to the DLL 205. In this connection, the shown DLL 205 not only operates as a clock reproduction phase adjusting circuit, but also operates as a frequency divider for dividing a frequency of clocks. In this configuration, it is seen that, upon clock reproduction, the external clock signal CLK is fed to the DLL 205 as a clock source, only a phase of the signal CLK is adjusted at the DLL 205. In this manner, by giving the external clocks CLK to the DLL 205 and adjusting the phase of the clocks by the DLL 205, it is also possible to reproduce data reception DRAM internal clocks and data reception feedback clocks from the received write data phase signal WDPS, and further possible to produce DPS output DRAM internal clocks to thereby transmit a read data phase signal RDPS to the buffer 105.

The buffer 105 shown in FIG. 29 also differs from the buffer 105 shown in FIG. 24 in that a buffer internal clock signal is given to a DLL 305 that operates as a clock phase adjusting circuit. When the buffer 105 having the configuration shown in FIG. 29 is used, the DLL 305 adjusts a phase of clocks according to a reception phase adjusting signal from a reception phase comparing circuit 306 to thereby produce data reception buffer internal clocks and data reception feedback clocks.

Figure 30:
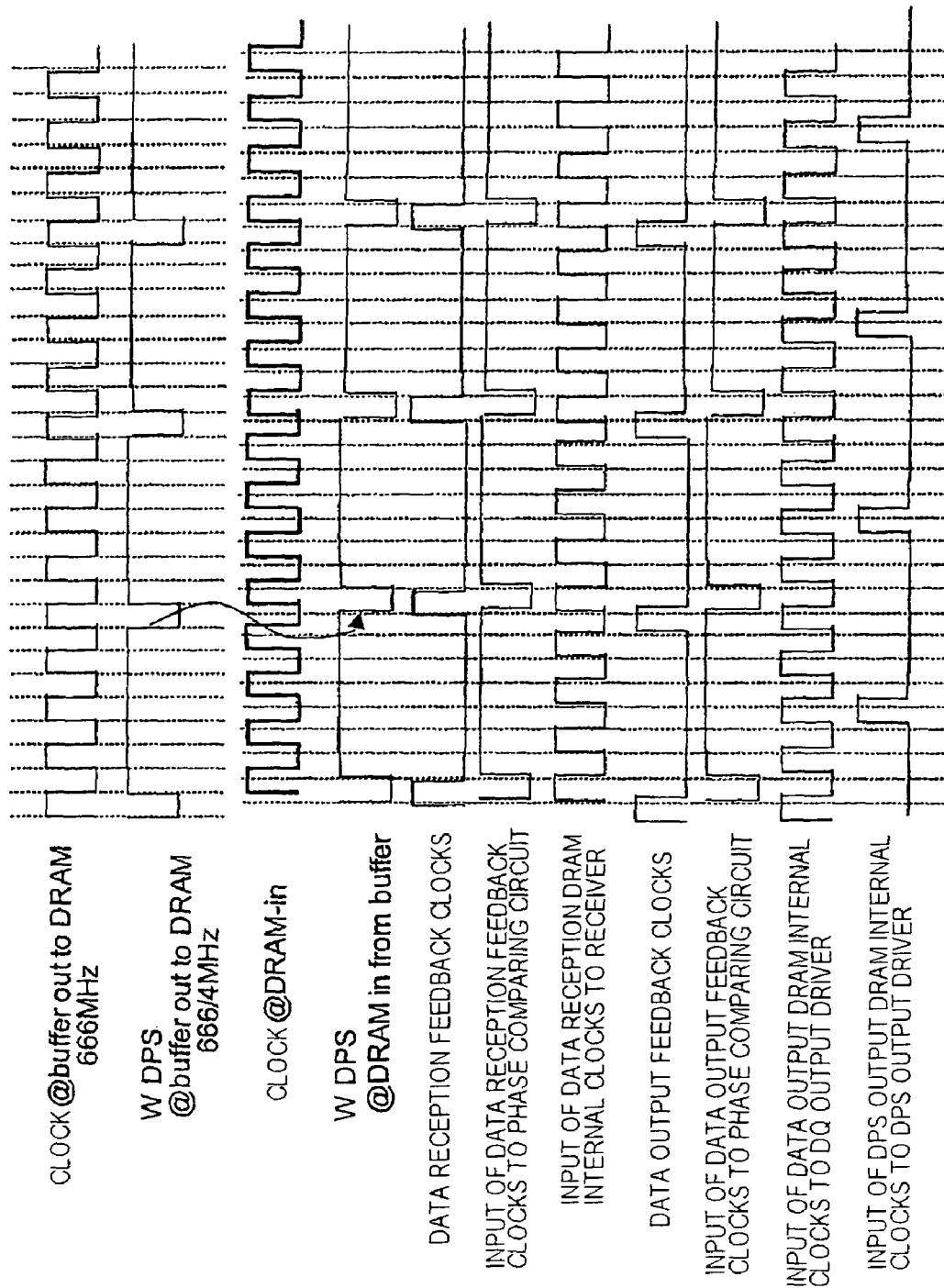
FIG. 30 is a time chart for explaining an operation of the DRAM shown in FIG. 28.

Referring to FIG. 30, description will be given about operations of the buffer 105 and the DRAM 110 shown in FIGS. 28 and 29. In this example, an operation in the initial state of the DRAM 110 is shown wherein the DRAM 110 does not output the read data phase signal RDPS. As compared with FIG. 25, the example shown in FIG. 30 differs therefrom in that external clocks of 666 MHz are produced in the DRAM 110 like in the buffer 105 (see the third line). The other operations are the same as those in FIG. 25 except that the operations are performed referring to such external clocks, and therefore, description thereof is omitted herein.

Figure 31:
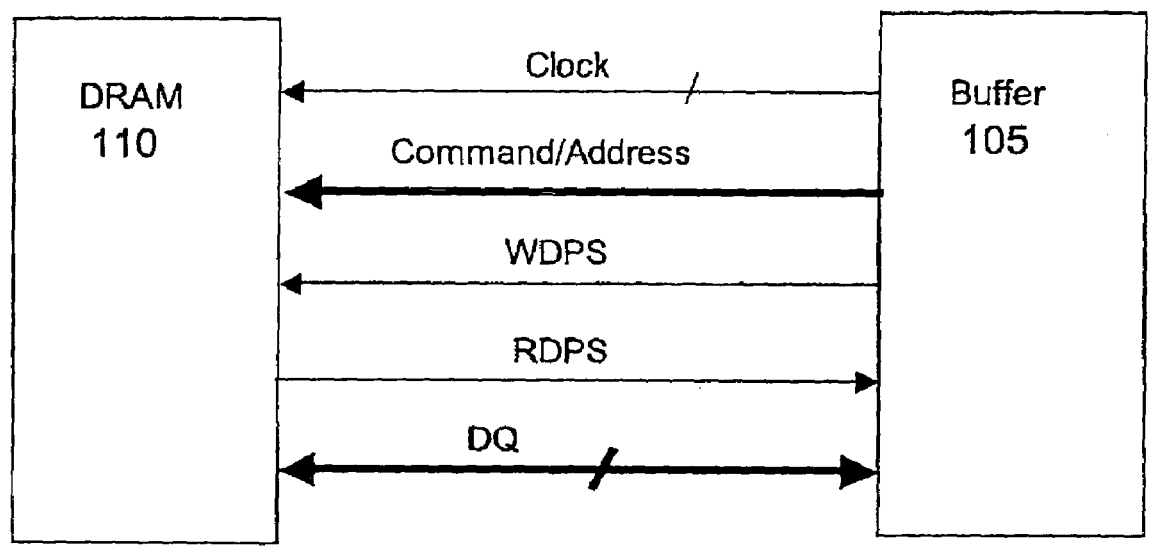
FIG. 31 is a block diagram for explaining a modification of a transmission system between a buffer and a DRAM.
Figure 32:
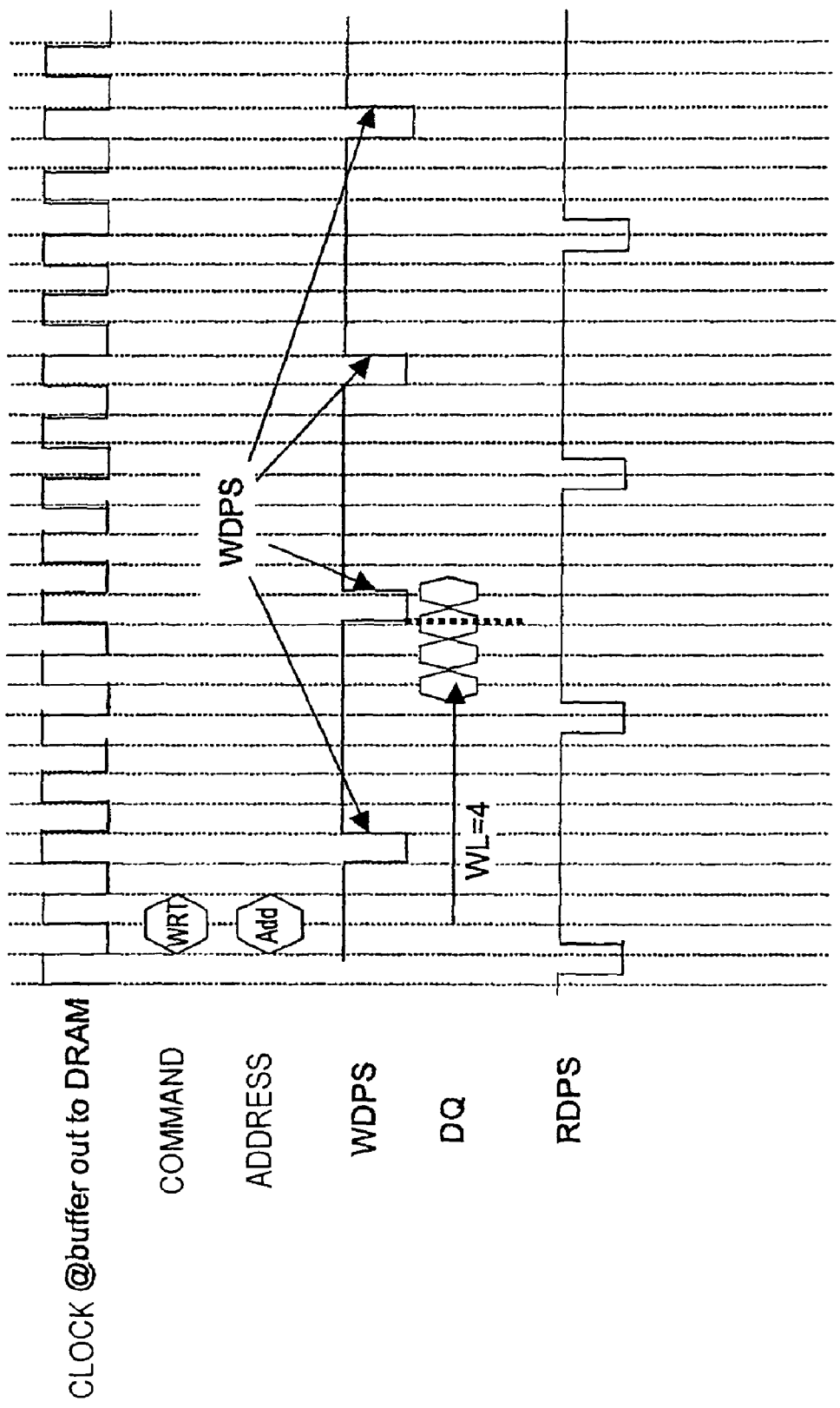
FIG. 32 is a timing chart for explaining an operation, upon reading, of the DRAM shown in FIG. 31.
Figure 33:
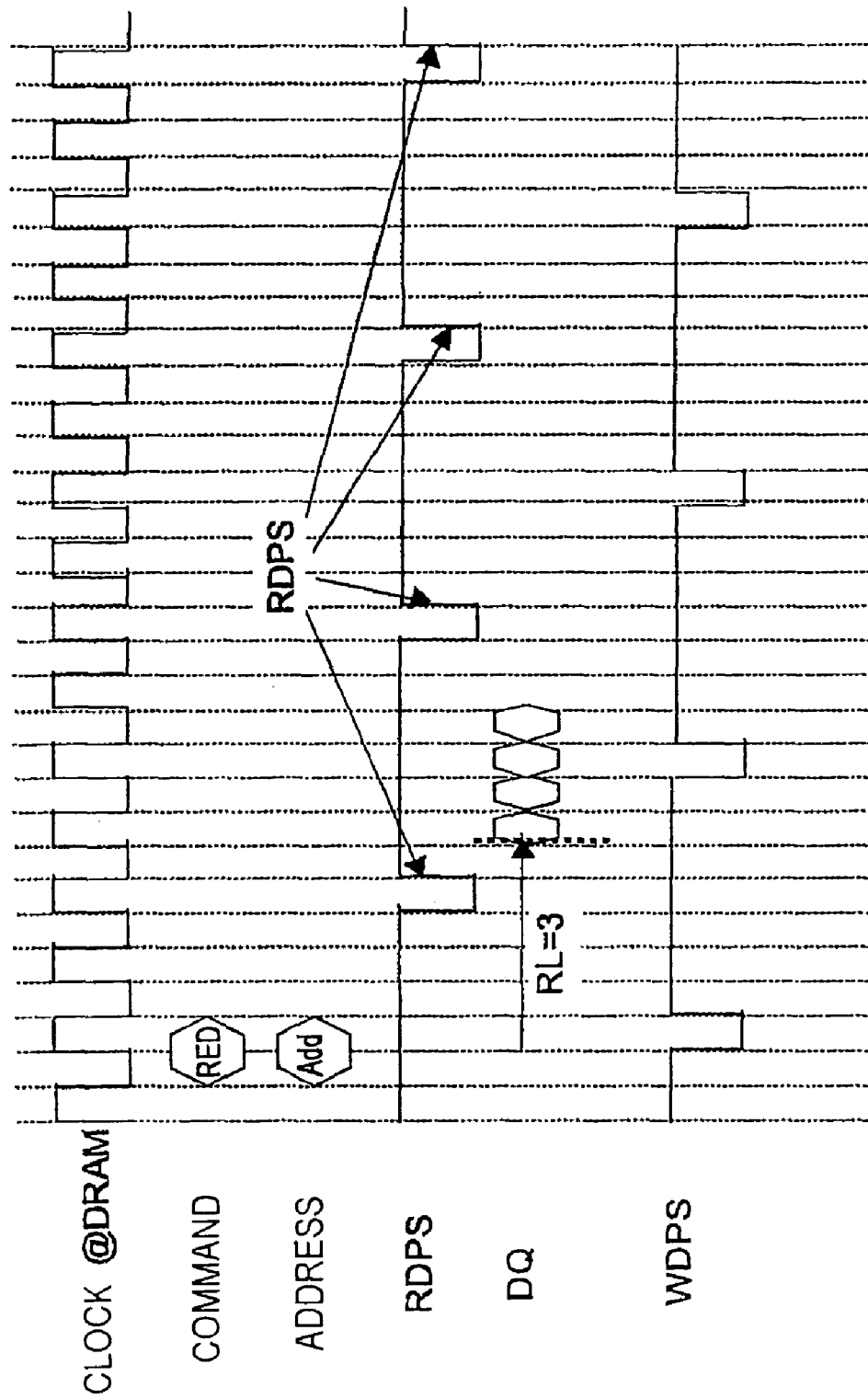
FIG. 33 is a timing chart for explaining an operation, upon writing, of the DRAM shown in FIG. 31.

Referring to FIGS. 31 to 33, description will be given about another example of a transmission system between the buffer 105 and the DRAM 110 in the memory system according to the present invention. In the foregoing example, the description has been given about the case wherein the data phase signals DPS are outputted bidirectionally from the buffer 105 and the DRAM 110 as the write and read data phase signals WDPS and RDPS. In FIG. 31, it is seen that a write data phase signal WDPS and a read data phase signal RDPS are outputted onto different signal lines from the buffer 105 and the DRAM 110. Other clocks (CLK), command/address (Cmd/Add), and data DQ are the same as those in FIG. 18. By employing this configuration, it is not necessary to multiplex the two data phase signals WDPS and RDPS onto the single signal line, so that the configuration of the DLL used in each of the buffer 105 and the DRAM 110 can be simplified.

Referring to FIG. 32, description will be given about an operation, upon data writing, of the DRAM 110 shown in FIG. 31. In this case, a write command WRT and an address (Add) are outputted to the DRAM 110 from the buffer 105 synchronously with clocks. In this event, a write data phase signal WDPS is transmitted to the DRAM 110 from the buffer 105 while being obtained by dividing the clocks CLK to quarter in frequency (see the fourth line in FIG. 32). In the DRAM 110, according to internal clocks produced by using the write data phase signal WDPS as a reference, data DQ is written into the DRAM 110 after a lapse of a predetermined latency time (see the fifth line).

On the other hand, in the DRAM 110, a read data phase signal RDPS is outputted onto a signal line different from that for the write data phase signal WDPS, at timing different from the reception timing of the write data phase signal WDPS.

As shown in FIG. 33, when a read command (RED) and an address (Add) are received at the DRAM 110, the DRAM 110 outputs read data DQ (see the fifth line) to the buffer 105 according to internal clocks (see the first line) produced based on a read data phase signal RDPS (see the fourth line). As clear from the figure, the output timing of the read data phase signal RDPS differs from the reception timing of the write data phase signal WDPS. In this example, the write data phase signal WDPS and the read data phase signal RDPS are shifted in phase by two clocks therebetween for avoiding output noise such as mutual interference or crosstalk therebetween.

Figure 34:
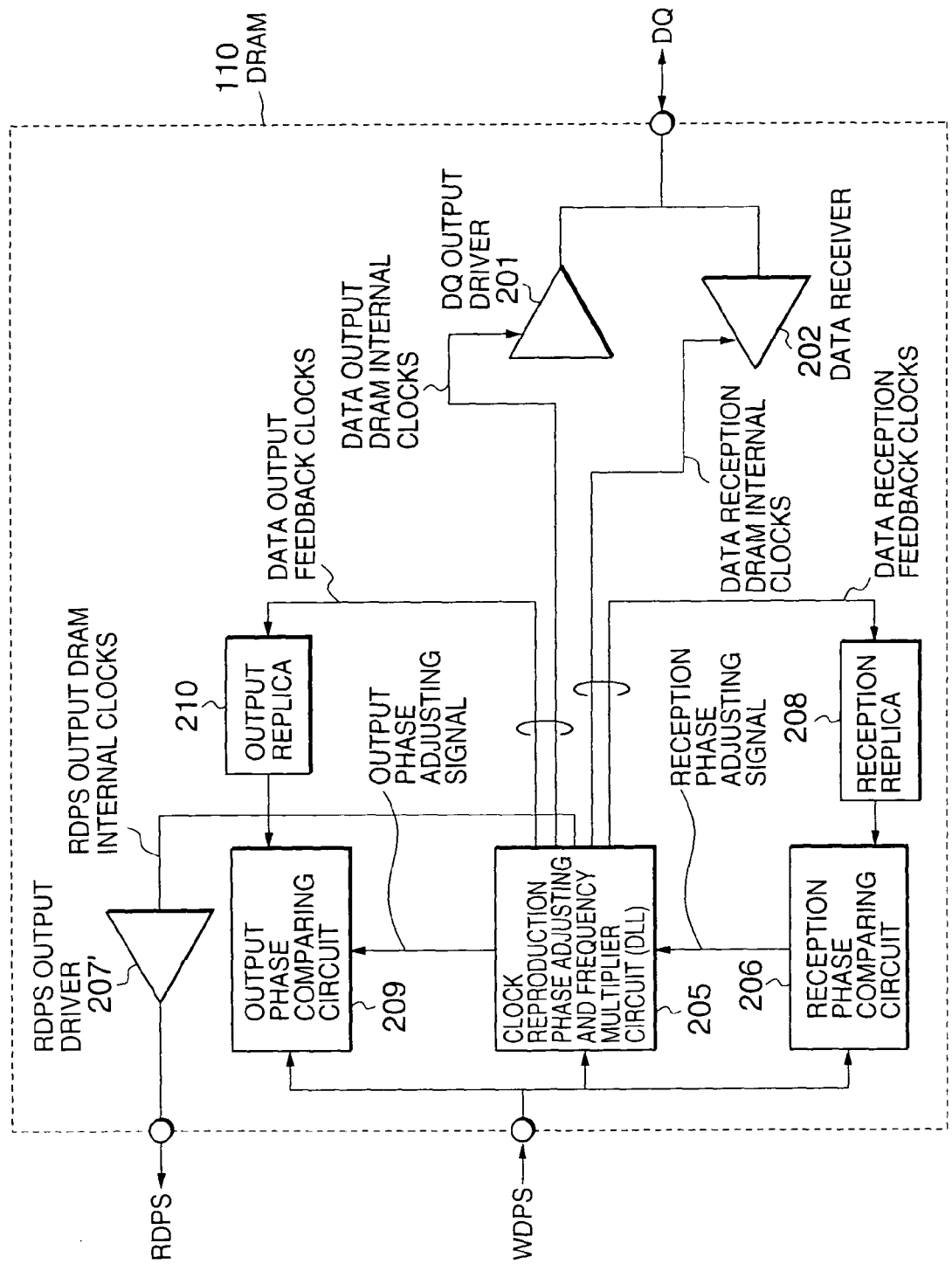
FIG. 34 is a block diagram for concretely explaining a configuration of the DRAM shown in FIG. 31.

Now, referring to FIGS. 34 and 35, description will be given about concrete examples of the DRAM 110 and the buffer 105 shown in FIG. 31. When comparing the DRAM 110 shown in FIG. 34 and the DRAM 110 shown in FIG. 23, the DRAM 110 of FIG. 34 differs from the DRAM 110 of FIG. 23 in that the write data phase signal WDPS and the read data phase signal RDPS are inputted thereinto via mutually different signal lines. In this connection, a read data phase signal output driver 207' is connected to the read data phase signal RDPS transmission signal line, but disconnected from a DLL 205 of the DRAM 110 and the signal line of the write data phase signal WDPS, which differs from FIG. 23. The other components are the same as those in FIG. 23.

Figure 35:
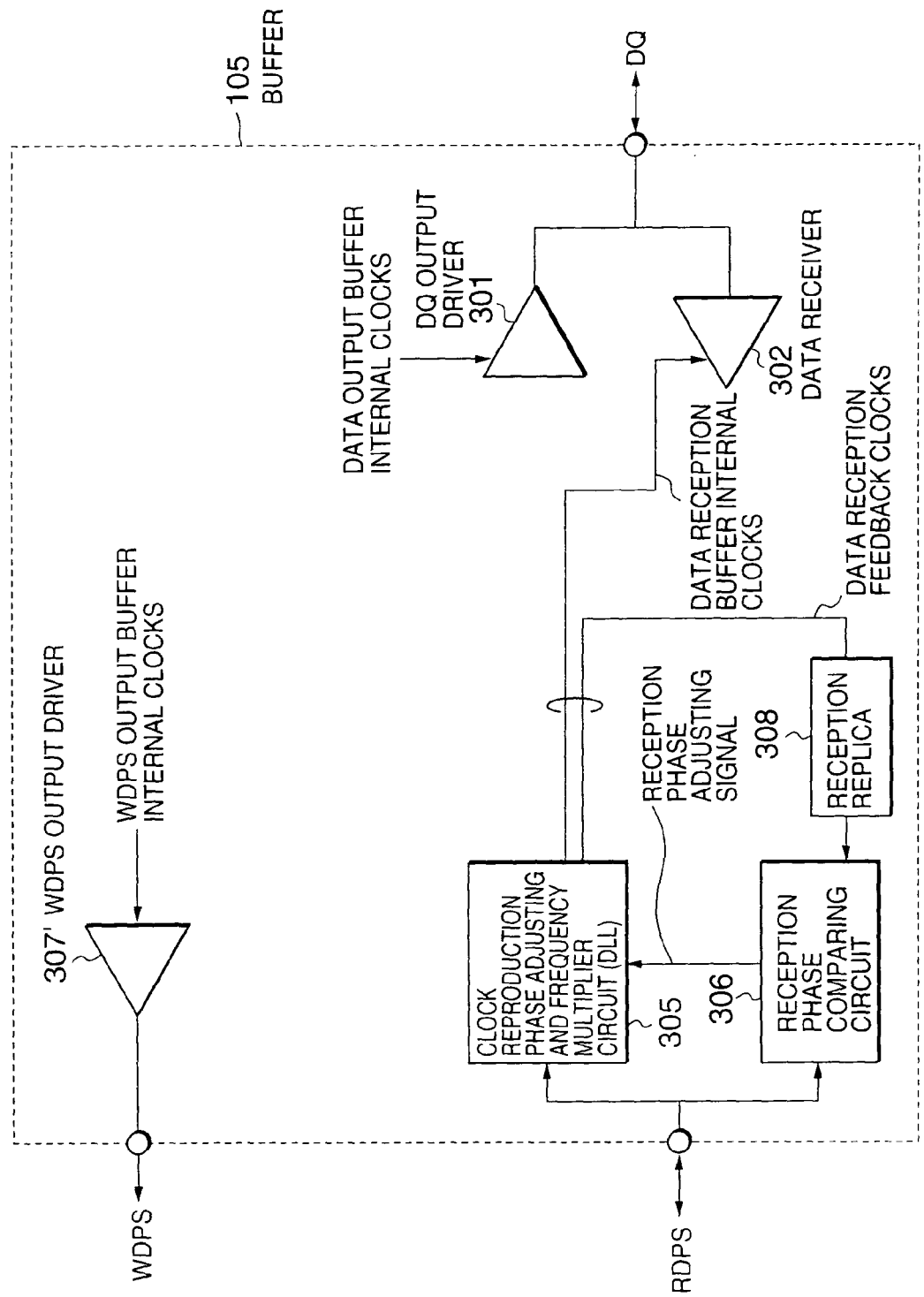
FIG. 35 is a block diagram for concretely explaining a configuration of the buffer shown in FIG. 31.

Further, the buffer 105 shown in FIG. 35 differs from the buffer 105 shown in FIG. 24 in that a write data phase signal WDPS transmission driver 307' is connected to the write data phase signal transmission signal line, but disconnected from the read data phase signal RDPS reception signal line and a DLL 305 of the buffer 105. The other components are the same as those in FIG. 24.

Figure 36:
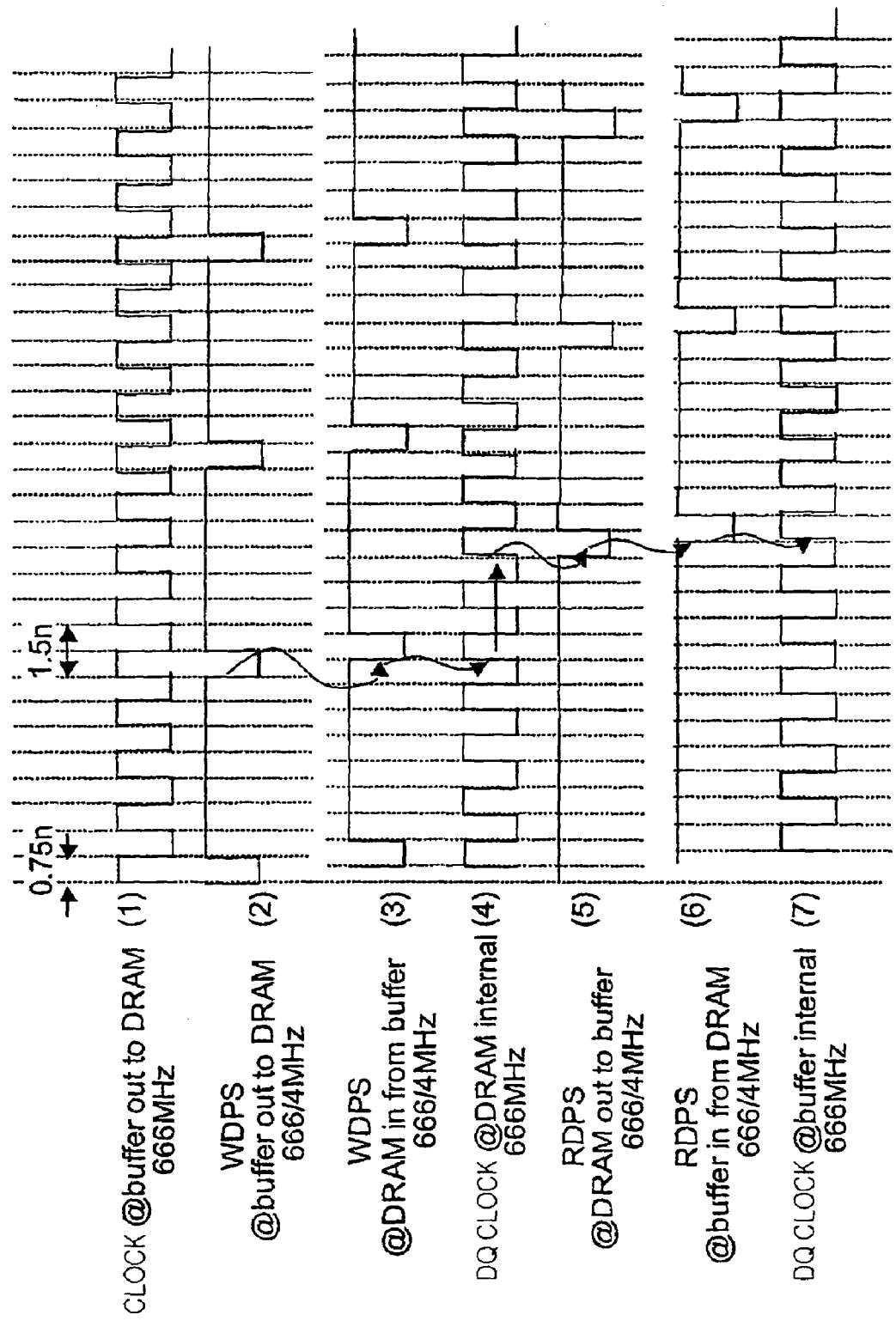
FIG. 36 is a timing chart for explaining a timing relationship in the DRAM and the buffer shown in FIGS. 34 and 35.

Here, a timing relationship between the DRAM 110 and the buffer 105 shown in FIGS. 34 and 35 will be schematically described with reference to FIG. 36. First, as shown in FIG. 36, the buffer 105 produces clocks having a frequency of 666 MHz (see the first line), and divides the produced clocks to quarter in frequency to thereby output a write data phase signal WDPS onto the write data phase signal line (see the second line). As shown at the third line, the write data phase signal WDPS is received at the DRAM 110 with a time delay. The DRAM 110 increases the received write data phase signal WDPS four times in frequency to thereby produce internal clocks having a frequency of 666 MHz (see the fourth line), then shifts the produced internal clocks by two clocks and divides them to quarter in frequency to thereby output a read data phase signal RDPS as shown at the fifth line onto the read data phase signal line. The read data phase signal RDPS is received at the buffer 105 at the timing shown at the sixth line, and the buffer 105 produces data reception internal clocks from the received read data phase signal RDPS as shown at the seventh line.

Figure 37:
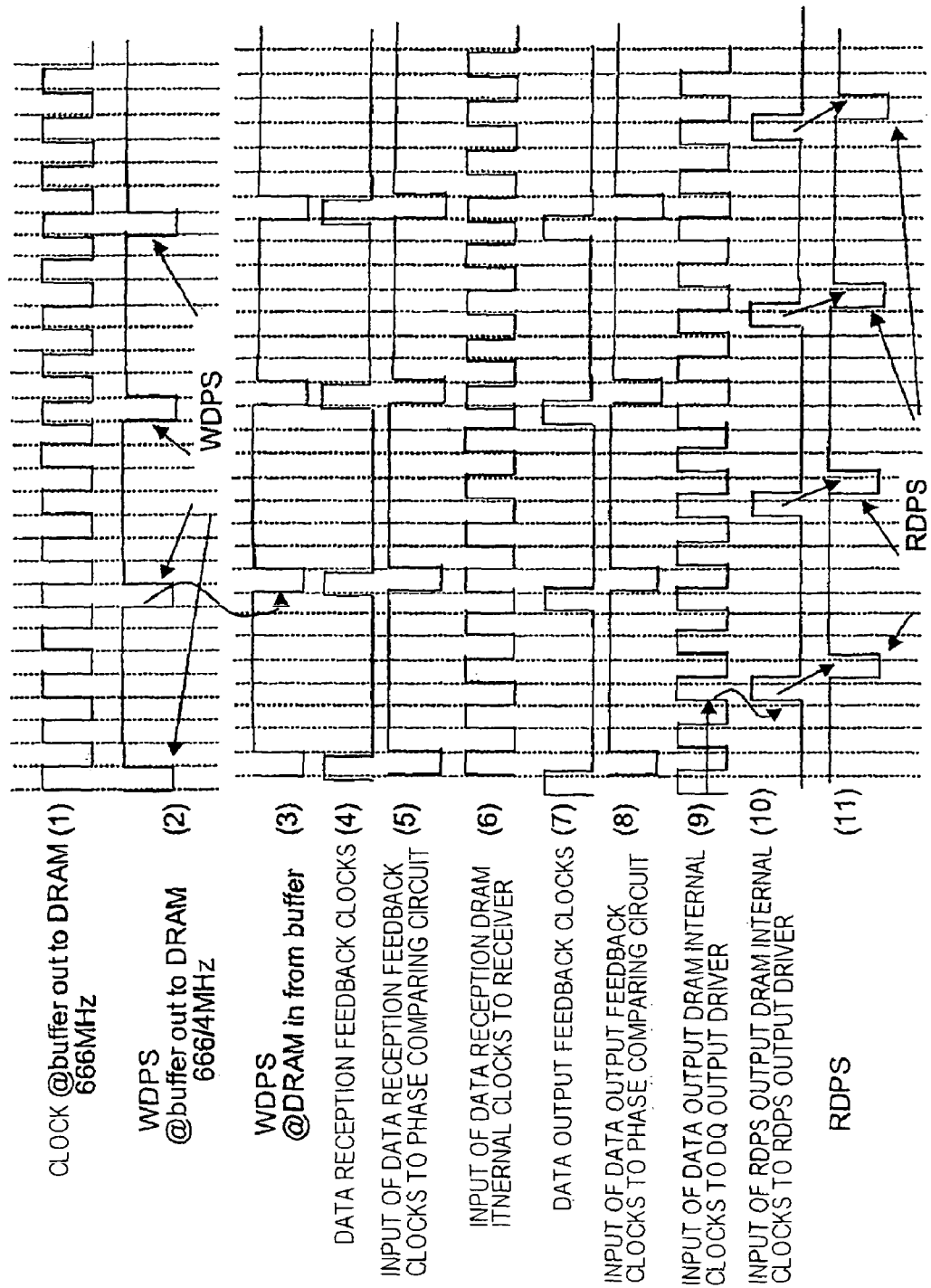
FIG. 37 is a timing chart for explaining an operation of the DRAM shown in FIG. 34.

Referring also to FIG. 37, further detailed description will be given about an operation, during a normal time, of the DRAM 110 shown in FIG. 34. Since operations upon the start are the same in the DRAM 110 of FIG. 34 and the DRAM 110 of FIG. 23, description thereof is omitted. The DRAM 110 shown in FIG. 34 is given the write data phase signal WDPS from the buffer 105 via the write data phase signal line (see the third line in FIG. 37), and the write data phase signal WDPS is received at the DLL 205, the reception phase comparing circuit 206, and the output phase comparing circuit 209 in FIG. 34. As a result, the reception phase comparing circuit 206 and the output phase comparing circuit 209 are given write data phase signals WDPS as shown at the fifth and eighth lines in FIG. 37 as input signals, respectively.

The DLL 205 refers also to a reception phase adjusting signal and an output phase adjusting signal from the reception phase comparing circuit 206 and the output phase comparing circuit 209 to thereby output data reception feedback clocks shown at the fourth line and data reception DRAM internal clocks shown at the sixth line in FIG. 37 to the reception replica 208 and the data receiver 202, respectively.

Further, the DLL 205 feeds data output feedback clocks and data output DRAM internal clocks shown at the seventh and ninth lines to the output replica 210 and the DQ output driver 201, respectively. Of them, the data output DRAM internal clocks are divided to quarter in frequency at the DLL 205 and, as shown at the tenth line, fed to the RDPS output driver 207' as RDPS output DRAM internal clocks. From the output driver 207', a read data phase signal RDPS shown at the eleventh line is outputted to the buffer 105.

Figure 38:
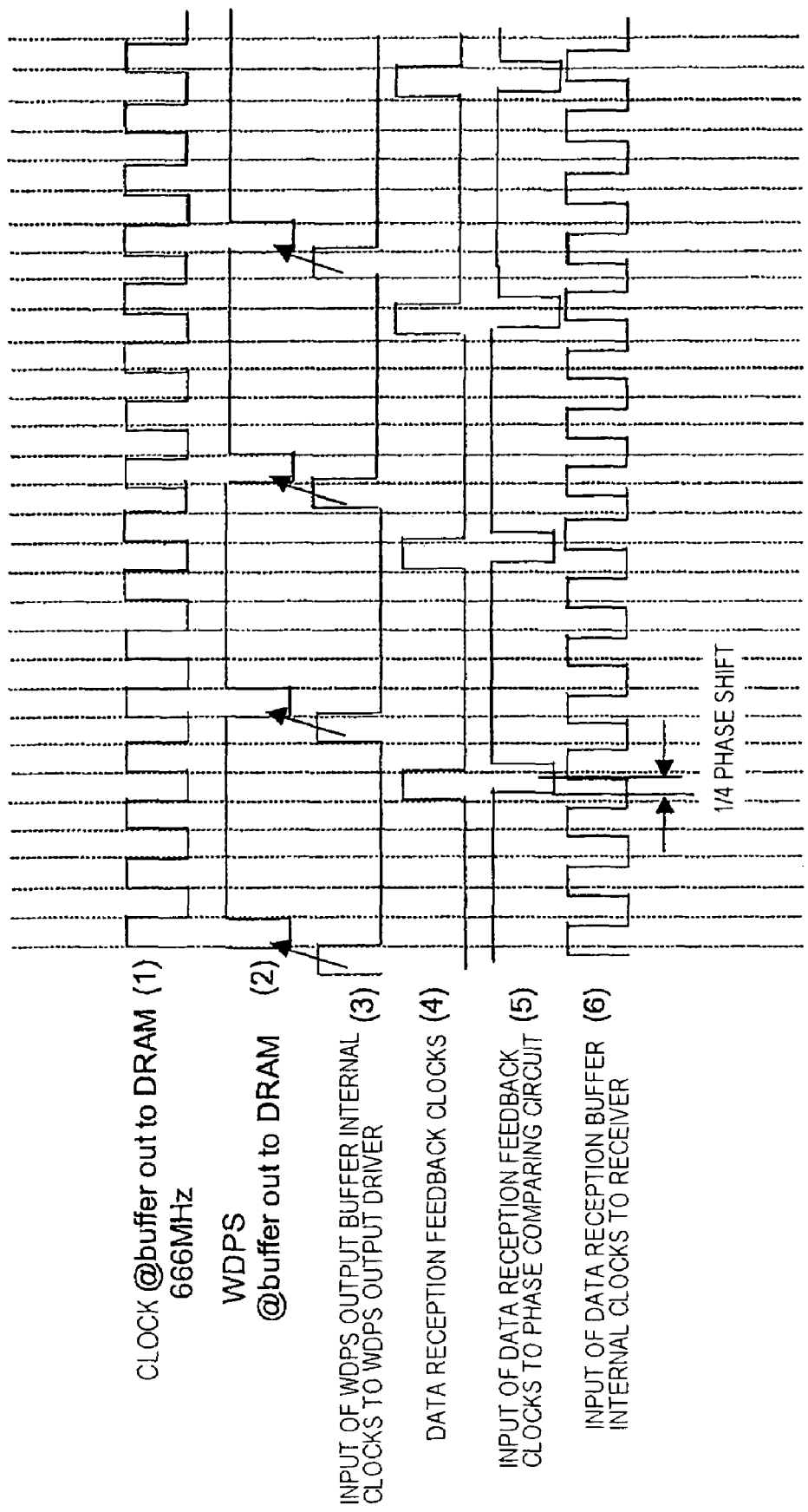
FIG. 38 is a timing chart for explaining an operation of the buffer shown in FIG. 35.

Referring to FIGS. 35 and 38, description will be given about an operation of the buffer 105 upon read data reception. By the use of WDPS output buffer internal clocks (see the third line), a write data phase signal WDPS is outputted onto the corresponding signal line (see the second line), and the read data phase signal RDPS is given to the DLL 305 and the reception phase comparing circuit 306 in the buffer 105 via the read data phase signal line (see the fifth line). The DLL 305 refers to a reception phase adjusting signal from the reception phase comparing circuit 306 to thereby feed data reception feedback clocks and data reception buffer internal clocks shown at the fourth and sixth lines to the reception replica 308 and the data receiver 302. Here, the shown data reception buffer internal clocks are shifted by ¼ phase relative to the read data phase signal RDPS.

Figure 39:
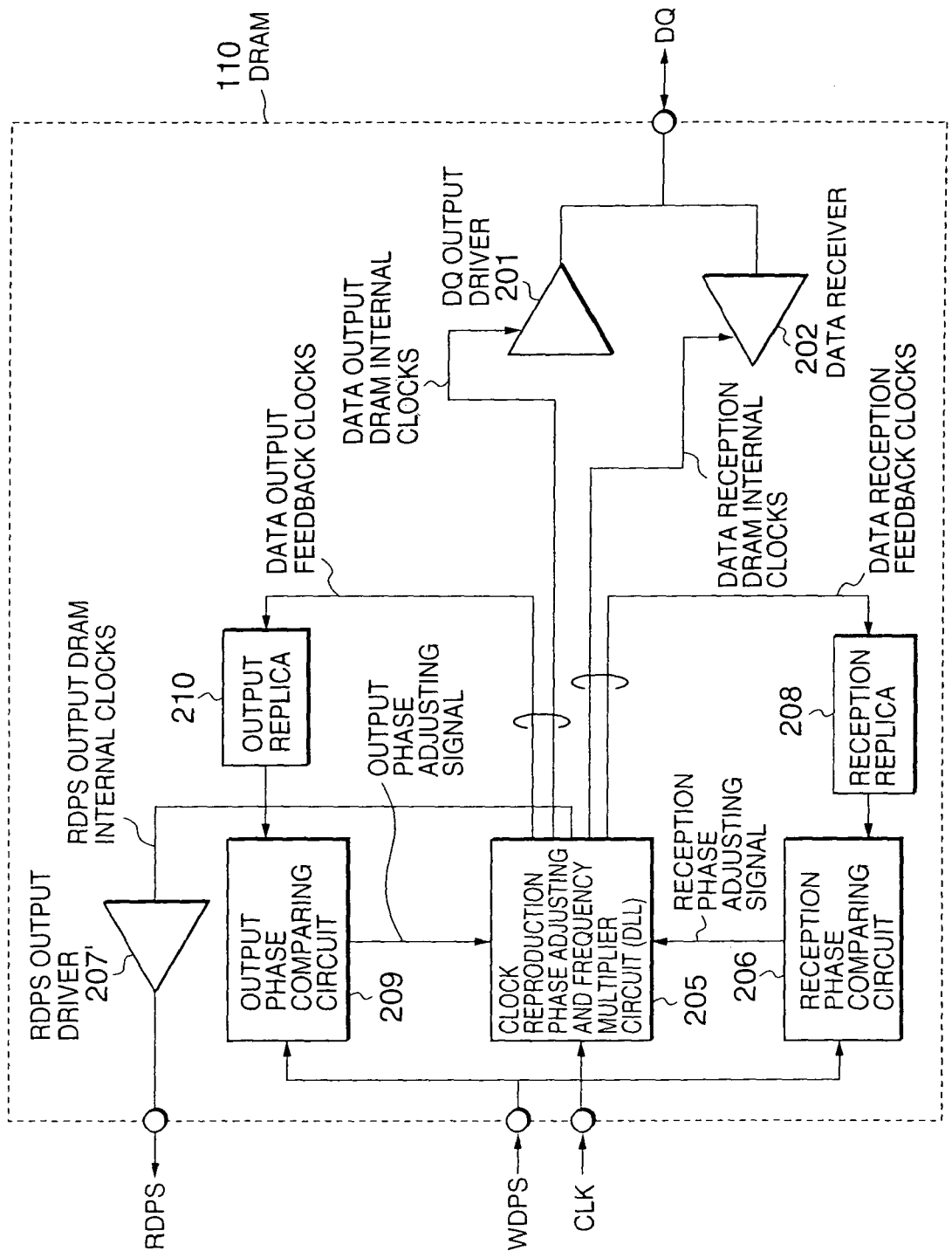
FIG. 39 is a block diagram showing another example of a DRAM applicable to the transmission system shown in FIG. 31.
Figure 40:
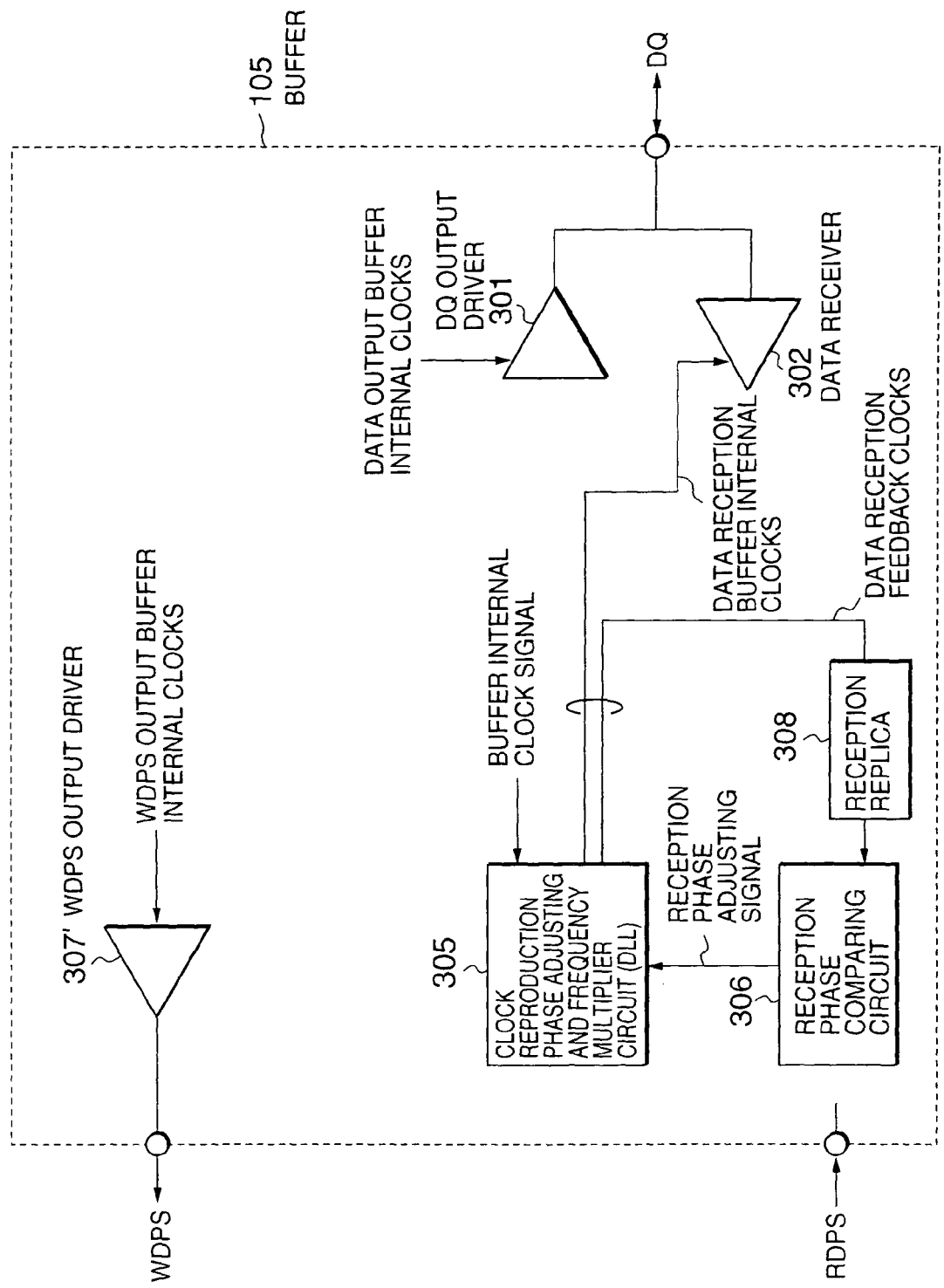
FIG. 40 is a block diagram showing an example of a buffer that can cooperatively work with the DRAM shown in FIG. 39.

Referring to FIGS. 39 and 40, description will be given about other examples of a DRAM 110 and a buffer 105 that can realize the transmission system shown in FIG. 31. The DRAM 110 shown in FIG. 39 differs from the DRAM 110 shown in FIG. 34 in that clocks CLK are given from the exterior like in FIG. 28. On the other hand, the buffer 105 shown in FIG. 40 differs from the buffer 105 shown in FIG. 35 in that a buffer internal clock signal is given to a DLL 305 in the buffer 105. In FIG. 39, the external clocks are given to a DLL 205 in the DRAM 110, while a write data phase signal WDPS is fed to a reception phase comparing circuit 206 and an output phase comparing circuit 209. With this configuration, an operation like that in FIG. 34 can also be realized.

In the buffer 105 shown in FIG. 40, a read data phase signal RDPS from the DRAM 110 is given to a reception phase comparing circuit 306, and the DLL 305 produces data reception feedback clocks and data reception buffer internal clocks according to a reception phase adjusting signal from the reception phase comparing circuit 306 and the buffer internal clock signal. With this configuration, an operation like that in FIG. 35 is made possible.

In the foregoing transmission systems, the description has been given about the data transmission between the buffer and the DRAM that are mounted on the memory module. However, the present invention is not at all limited thereto. For example, the present invention is also applicable to a memory circuit other than a DRAM, e.g. a ROM. Further, the present invention can achieve high-speed data transmission even if it is applied to the system that requires bidirectional data transmission or that requires a strobe signal.

In the foregoing memory systems, the buffer and the plurality of DRAMs are mounted on each memory module, and reception/transmission of data signals relative to the DRAMs on the memory module and transmission of clocks and address/command signals relative to the DRAMs are all carried out via the buffer on each memory module. Further, in the foregoing, the description has been mainly given about one-to-one data reception/transmission between the buffer and each of the DRAMs on each memory module.

However, for actually operating the foregoing memory module at high speed, it is further necessary to process timing skews that are generated between data signals, and clocks and command/address signals depending on positions of the DRAMs on the memory module, and moreover, to perform matching of clock timings in the buffer relative to data that are transmitted from the respective DRAMs and arrive at the buffer at different timings.

Here, referring to FIG. 41, the foregoing point will be described more specifically. A buffer 105 and a plurality of DRAMs 110 are mounted on a shown memory module 103. The package size of each DRAM 110 mounted on the memory module 103 normally has a width of about 14 mm, and this size is considered to be maintained even if the generation is advanced. When the DRAMs 110 each having such a size are mounted as shown in the figure, for example, when the five DRAMs 110 are mounted at regular intervals of 9 mm, a wiring length of each of a clock line, a command/address ling, and a DQ signal line between the far-end DRAM 110 (denoted by 110F) and the buffer 105 is 65 mm, while a wiring length thereof between the near-end DRAM 110 (denoted by 110N) and the buffer 105 is 9 mm.

When the memory module 103 thus dimensioned is operated at a high frequency of 800 MHz, a timing skew of a level that can not be ignored relative to an operation period (1250 ps) of the high-frequency operation (800 MHz) is generated at the far-end DRAM 110F due to a difference in signal propagation time between the clocks and the command/address signal, and the DQ signal.

More specifically, since the clocks and the command/address signal are inputted into the respective DRAMs 110 from the buffer 105 via the common wiring, an input capacitance of about 1.5 pF×2×5 is distributed on the wiring relative to the clocks and the command/address signal. Therefore, a signal unit propagation time (tPD) of the clocks and the command/address signal becomes about 14 ps/mm. On the other hand, the DQ signal is transmitted/received between the buffer and the respective DRAMs 110 via one-to-one or one-to-two wiring, and therefore, an input capacitance of about 2.5 pF×2 is distributed on the wiring relative to the DQ signal. Therefore, a signal unit propagation time tPD of the DQ signal becomes about 8 ps/mm, and thus it is understood that the signal unit propagation time of the DQ signal is shorter than the signal unit propagation time of the clocks and the command/address signal.

Based on such a difference in signal propagation time between the clocks and the command/address signal, and the DQ signal, the timing skew of the level that can not be ignored relative to the operation period (1250 ps) of the high-frequency operation (800 MHz) is generated at the far-end DRAM 110F. In the shown memory system, a signal propagation time of the clocks and the command/address signal upon writing is 910 (=14×65) ps, while a signal propagation time of the DQ signal is 520 (=8×65) ps. As a result, a timing skew of 390 ps is generated between the clocks and the command/address signal, and the DQ signal at the far-end DRAM 110F.

When a write command (WRT) is given to the far-end DRAM 110F in the state where such a timing skew is generated, the write command is inputted into the DRAM at a phase of a buffer clock signal from the buffer 105.

On the other hand, a data write operation in each DRAM 110 is implemented synchronously with the buffer clock signal after the reception of the write command. This means that data received at leading edges of the data reception DRAM internal clocks should be matched with the phase timing of the buffer clock signal during one cycle.

For example, data received at leading edges of the data reception DRAM internal clocks are matched with the clock signal phase timing at trailing edges of the buffer clock signal, while data received at trailing edges are matched with the clock signal phase timing at leading edges of the buffer clock signal. As a result, internal data are alternately produced. When shifting matching of such data from one timing to another timing, a setup time and a hold time are required.

Figure 41:
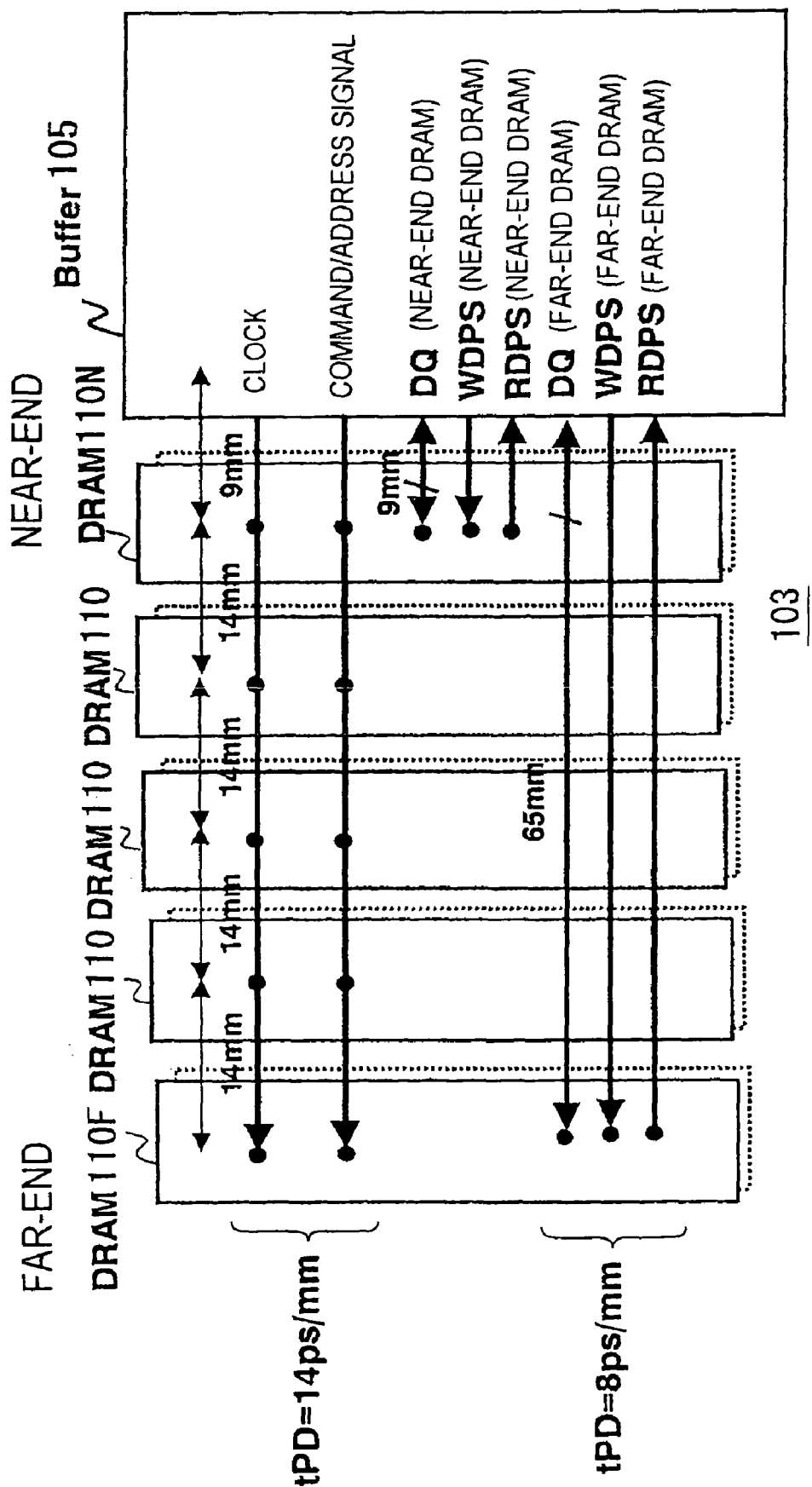
FIG. 41 is a block diagram for explaining a memory module according to an example of the present invention.

In the system shown in FIG. 41, a setup time and a hold time at the near-end DRAM 110N for shifting matching of data received at the timing of the data reception DRAM internal clocks to the buffer clock timing are 679 ps and 571 ps, respectively, while a setup time and a hold time at the far-end DRAM 110F are 1015 ps and 235 ps, respectively.

As clear from this, since a timing skew between the clock signal and the DQ signal is 54 ps, i.e. small, at the near-end DRAM, uniform margins are obtained for the setup time and the hold time, while, the hold time becomes 235 ps (0.19 clock period), i.e. short, at the far-end DRAM 110F due to the skew of 390 ps, so that a sufficient time margin can not be obtained.

Further, DQ signals transmitted from the respective DRAMs in response to a read (READ or RED) command arrive at the buffer 105 at different arrival times due to a difference between a propagation time of the clock signal (equal to a propagation time of the command) and a propagation time of the DQ signal. For example, a propagation time of the clock signal (command) to the near-end DRAM 110N is 126 ps and a propagation time of the DQ signal to the buffer 105 from the near-end DRAM 110N is 72 ps, while a propagation time of the clock signal (command) to the far-end DRAM 110F is 910 ps and a propagation time of the DQ signal to the buffer 105 from the far-end DRAM 110F is 520 ps.

Assuming that a latency from a read command to data output is equal among the respective DRAMs, e.g. eight clocks here, the total signal two-way propagation time at the near-end DRAM 110N is 198 ps, while the total signal two-way propagation time at the far-end DRAM 110F is 1430 ps, i.e. a difference therebetween is 1230 ps.

Therefore, at the buffer 105, it is necessary to match the data of different arrival times with the timing of the clock signal again, and transfer them to the memory controller. Further, as clear from the foregoing, data from the near-end DRAM 110N and data from the far-end DRAM 110F arrive spanning different clock cycles within the buffer 105. Therefore, it is necessary to judge at the buffer 105 per data from each DRAM 110 as to which cycle it should be matched with.

Hereinbelow, referring to the drawings, description will be given about examples of the present invention that take the foregoing skew into account.

In the following examples, it is assumed that a clock signal fed to each DRAM (herein, called "buffer clock signal") is produced by dividing clocks fed to the buffer 105 (herein, called "global clocks") to half in frequency for the purpose of processing the foregoing skew, and a DPS signal is transmitted at a frequency equal to that of the produced buffer clock signal. Therefore, the command/address signal is transmitted/received synchronously with leading and trailing edges of the clock signal. Further, a data signal is received/transmitted synchronously with the DPS signal at a transfer rate that is four times a frequency of the clock signal.

Figure 42:
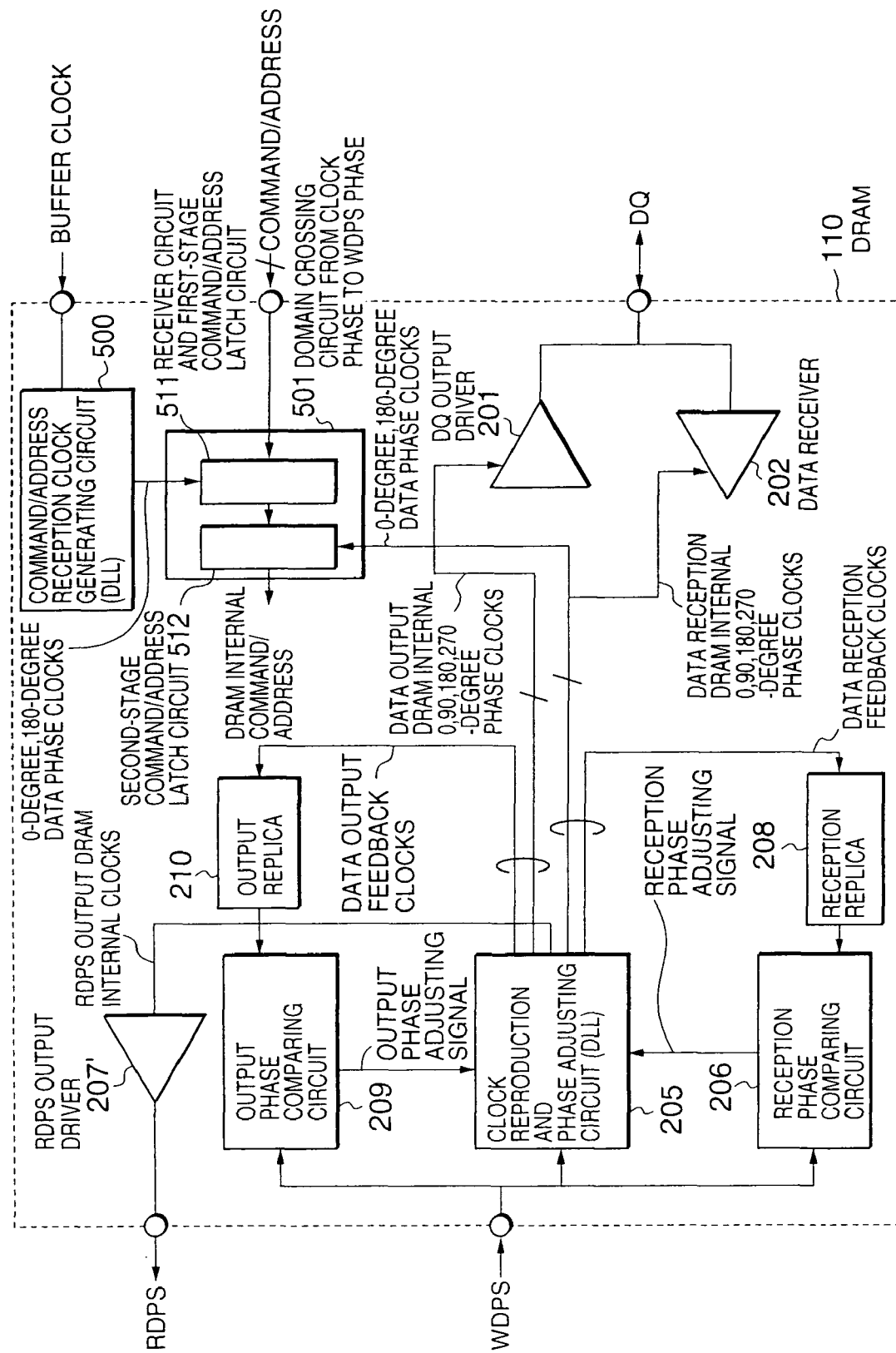
FIG. 42 is a block diagram for explaining a DRAM that is used in a memory module according to a first example of the present invention.

Referring to FIG. 42, there is shown a configuration of a DRAM that is used in a memory system according to a first example of the present invention, wherein write/read data phase signals (WDPS/RDPS) are inputted/outputted via mutually different wirings.

The DRAM 110 shown in FIG. 42 is provided with a command/address reception clock generating circuit (DLL) 500 and a domain crossing circuit 501, which differs from the DRAMs 110 shown in other figures. The shown clock generating circuit (DLL) 500 and domain crossing circuit 501 operate in response to reception of a buffer clock signal and a command/address signal each having a frequency of 400 MHz from the buffer, respectively.

In the shown example, the command/address signal is received into the DRAM 110 at the timing of the buffer clock signal (hereinafter, it may also be referred to simply as "clock signal"), and delivered to data phase clocks within the DRAM 110 produced based on the data phase signal (WDPS). Through this, the command/address signal becomes an internal command produced based on the data phase (WDPS), and thereafter, an internal read/write operation of the DRAM 110 is carried out according to this internal command. This means that the internal read/write operation of the DRAM 110 is implemented synchronously with the data phase of the WDPS.

Here, for allowing the phase of the clocks in the DRAM 110 to allocate margins to a setup time and a hold time relative to the phase of the delivery-destination WDPS, the WDPS signal is delayed by one clock (represented by 1 tCK) of the global clocks, i.e. by 180 degrees of the divider clocks, in the buffer 105.

Figure 43:
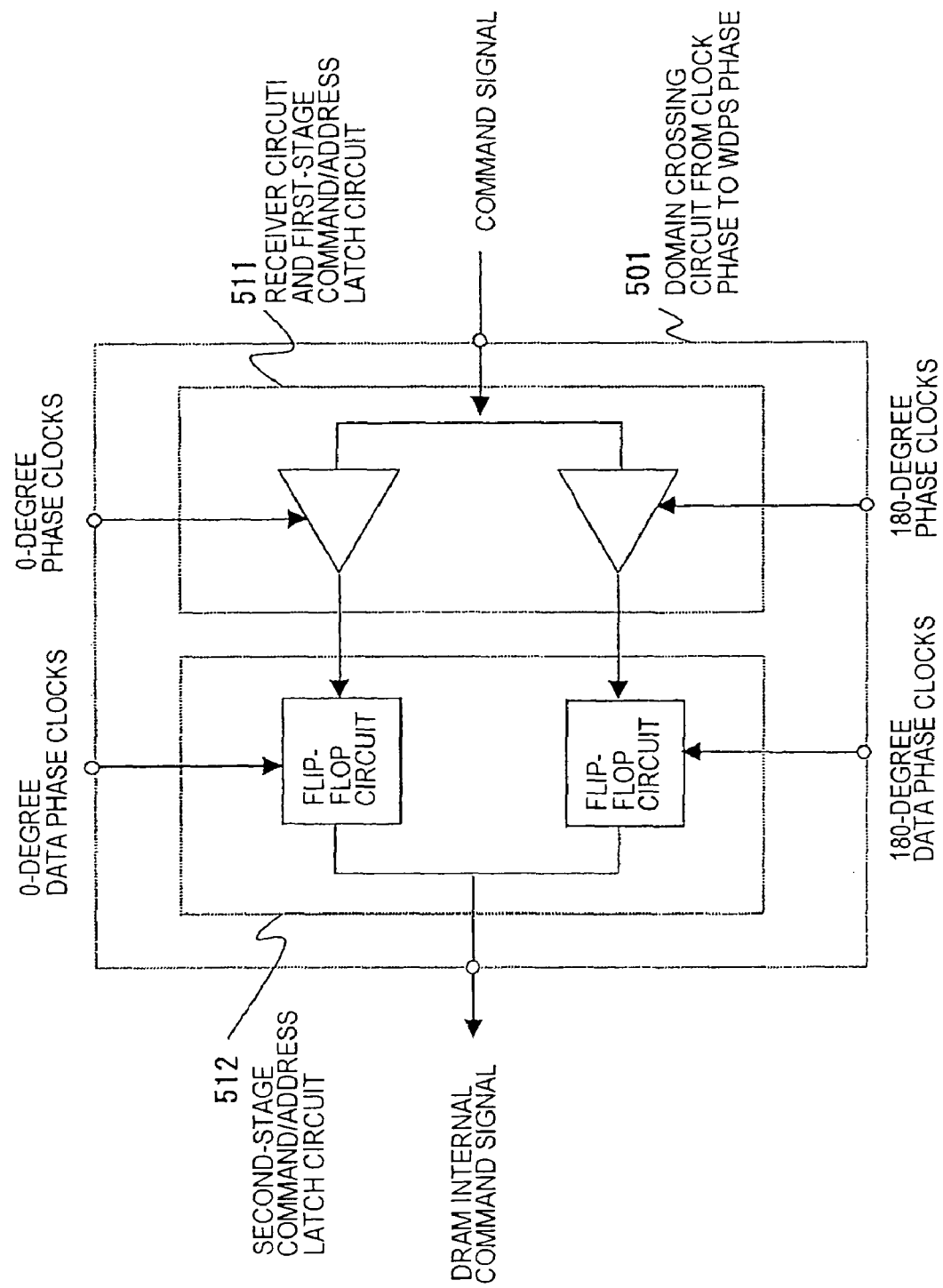
FIG. 43 is a block diagram for concretely explaining a domain crossing circuit in the DRAM shown in FIG. 42.

Referring to FIG. 43, there is shown a concrete configuration of the domain crossing circuit 501 provided in the DRAM 110. The shown domain crossing circuit 501 is a circuit for domain-crossing the command/address signal from the phase of the buffer clock signal to the WDPS phase, and comprises a first latch circuit 511 and a second latch circuit 512. Specifically, the first latch circuit 511 comprises two receivers for receiving a command signal according to 0-degree phase clocks and 180-degree phase clocks and latching it, while the second latch circuit 512 comprises two flip-flop circuits for holding the command signal from the first latch circuit 511 according to 0-degree data phase clocks and 180-degree data phase clocks.

Here, the 0-degree and 180-degree phase clocks are produced at the command/address reception clock generating circuit 500 shown in FIG. 42, and represent 0-degree and 180-degree phases of the received buffer clock signals, respectively. On the other hand, the 0-degree and 180-degree data phase clocks represent 0-degree and 180-degree phases of the write data phase signal (WDPS), respectively.

As shown in FIG. 42, the 0-degree and 180-degree data phase clocks are produced at a clock reproduction and phase adjusting circuit (DLL) 205 that operates in response to the WDPS.

As clear from this, it is understood that the shown domain crossing circuit 501 shifts synchronization of the command signal (or the address signal) with the 0-degree or 180-degree phase of the buffer clock signal to synchronization thereof with the 0-degree or 180-degree phase of the data phase signal (WDPS), and outputs it as a DRAM internal command/address signal.

Figure 44:
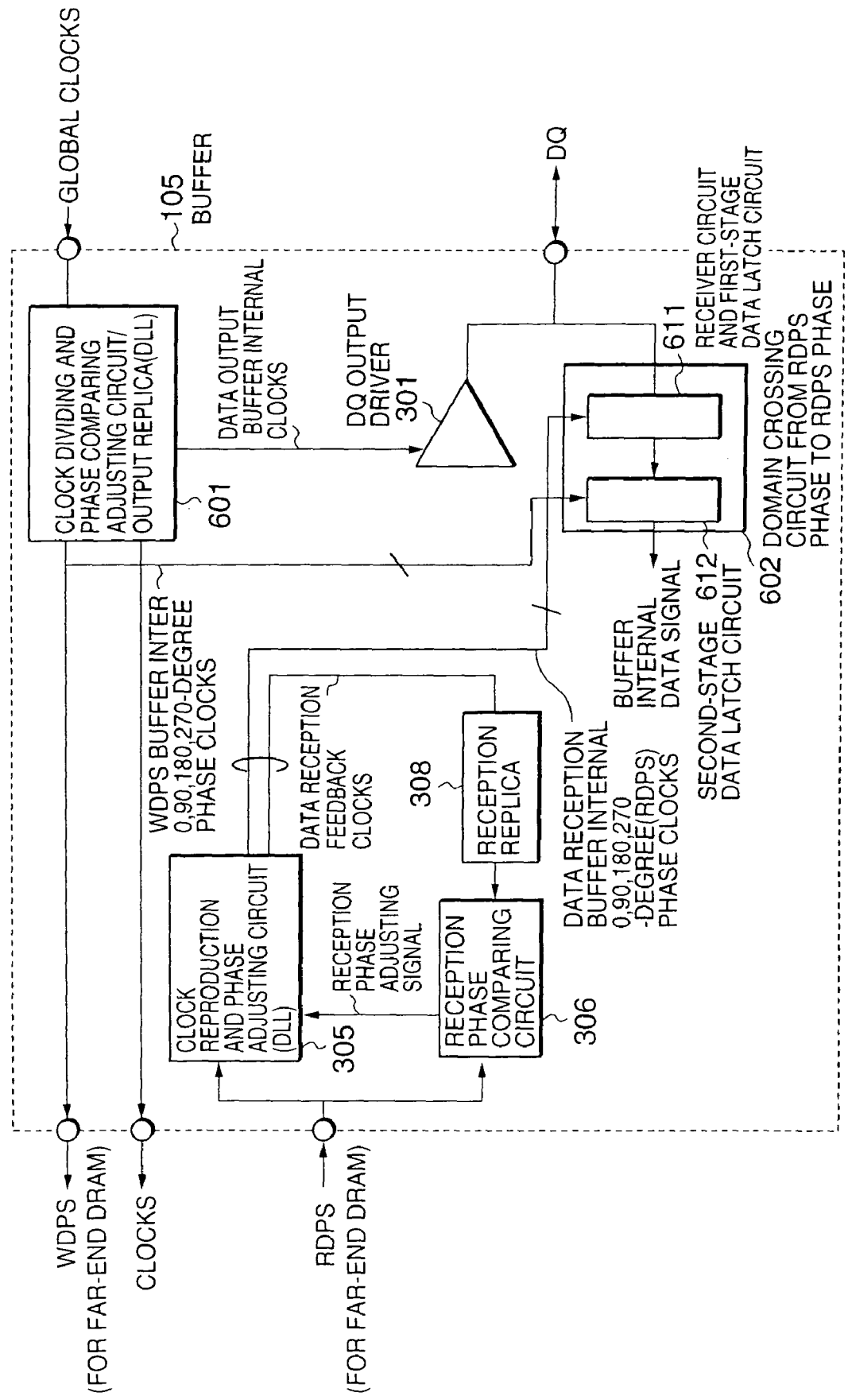
FIG. 44 is a block diagram for explaining a buffer forming the memory module according to the first example cooperatively with the DRAM shown in FIG. 43.

Referring to FIG. 44, there is shown a concrete configuration of the buffer 105 forming the first example of the present invention cooperatively with the DRAM 110 shown in FIG. 42, wherein the buffer 105 implements transmission/reception of the data signal DQ relative to the DRAM 110 of FIG. 42. The shown buffer 105 has a clock dividing/phase comparing adjusting circuit 601 that operates in response to reception of global clocks given from a memory controller (not shown). The clock dividing/phase comparing adjusting circuit 601 outputs buffer clocks obtained by dividing the global clocks to half in frequency, to the DRAM 110 as a clock signal, while outputs WDPS for DRAMs. In the figure, there is shown only a portion of outputting the WDPS for the far-end DRAM 110F.

Further, the shown clock dividing/phase comparing adjusting circuit 601 internally outputs data output buffer internal clocks and WDPS buffer internal phase clocks to a DQ output driver 301 and a domain crossing circuit 602, respectively. Here, the WDPS buffer internal phase clocks represent 0-degree, 90-degree, 180-degree and 270-degree phases of the WDPS for the far-end DRAM 110F.

On the other hand, a clock reproducing/phase adjusting circuit 305, which operates in response to reception of an RDPS being a data phase signal from the far-end DRAM 110F, produces data reception buffer internal phase clocks representing 0-degree, 90-degree, 180-degree and 270-degree phases of the RDPS, and feeds them to the domain crossing circuit 602.

Figure 45:
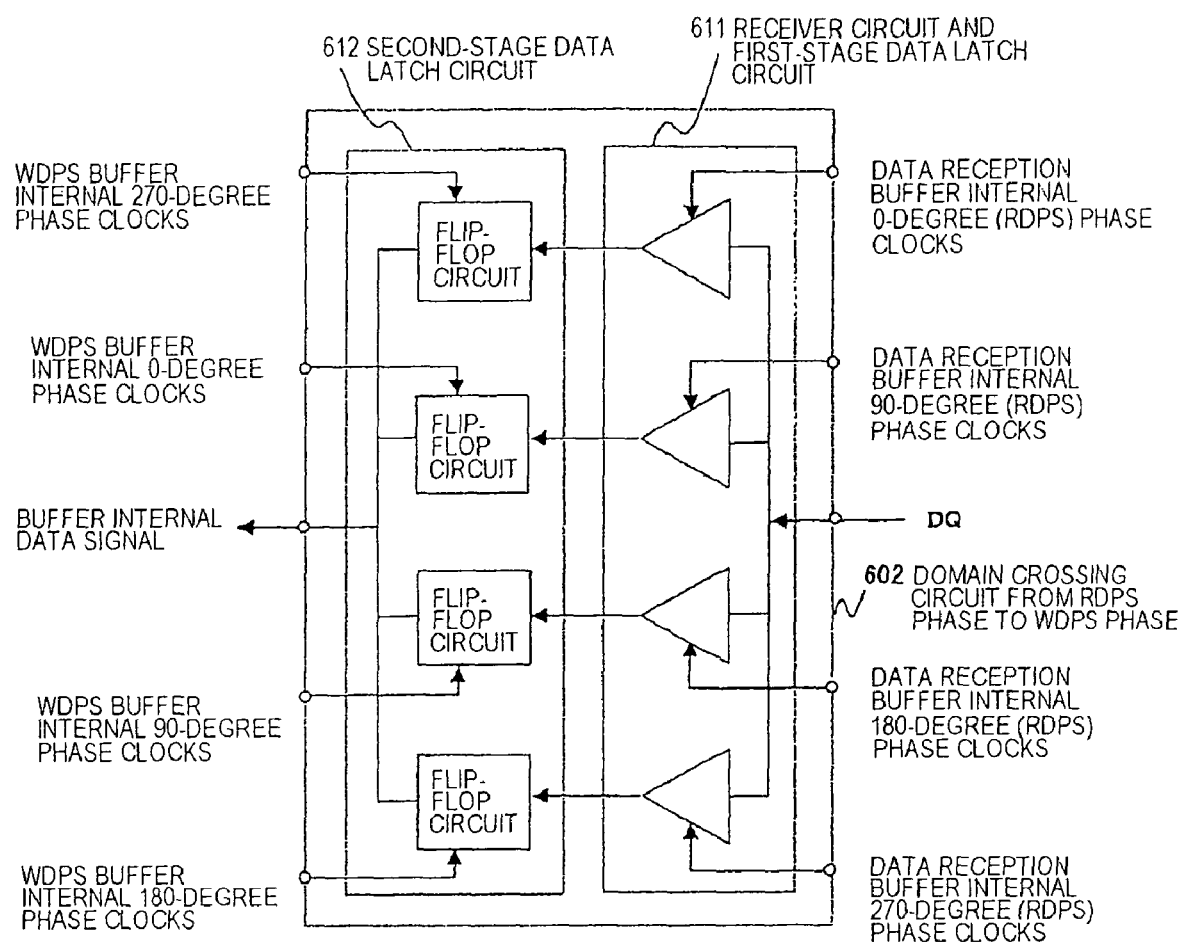
FIG. 45 is a block diagram showing a domain crossing circuit in the buffer shown in FIG. 44.

The domain crossing circuit 602 in the buffer 105 comprises a first-stage data latch circuit 611 and a second-stage data latch circuit 612. Specifically, the domain crossing circuit 602 is a circuit for domain-crossing from the RDPS phase to the WDPS phase and, as shown in FIG. 45, comprises the first-stage data latch circuit 611 for receiving a data signal DQ read from the DRAM 110 according to buffer internal phase clocks produced synchronously with 0-degree, 90-degree, 180-degree and 270-degree phases of the RDPS, and latching it, and the second-stage data latch circuit 612 for latching an output of the first-stage data latch circuit 611. The second-stage data latch circuit 612 comprises flip-flop circuits respectively latching according to WDPS buffer internal phase clocks (270, 0, 90 and 180 degrees) produced at the clock dividing/phase comparing adjusting circuit 601 shown in FIG. 44, and latches the output from the first-stage data latch circuit 611 at the phases of the WDPS buffer internal phase clocks, then outputs it as a buffer internal data signal.

Figure 46:
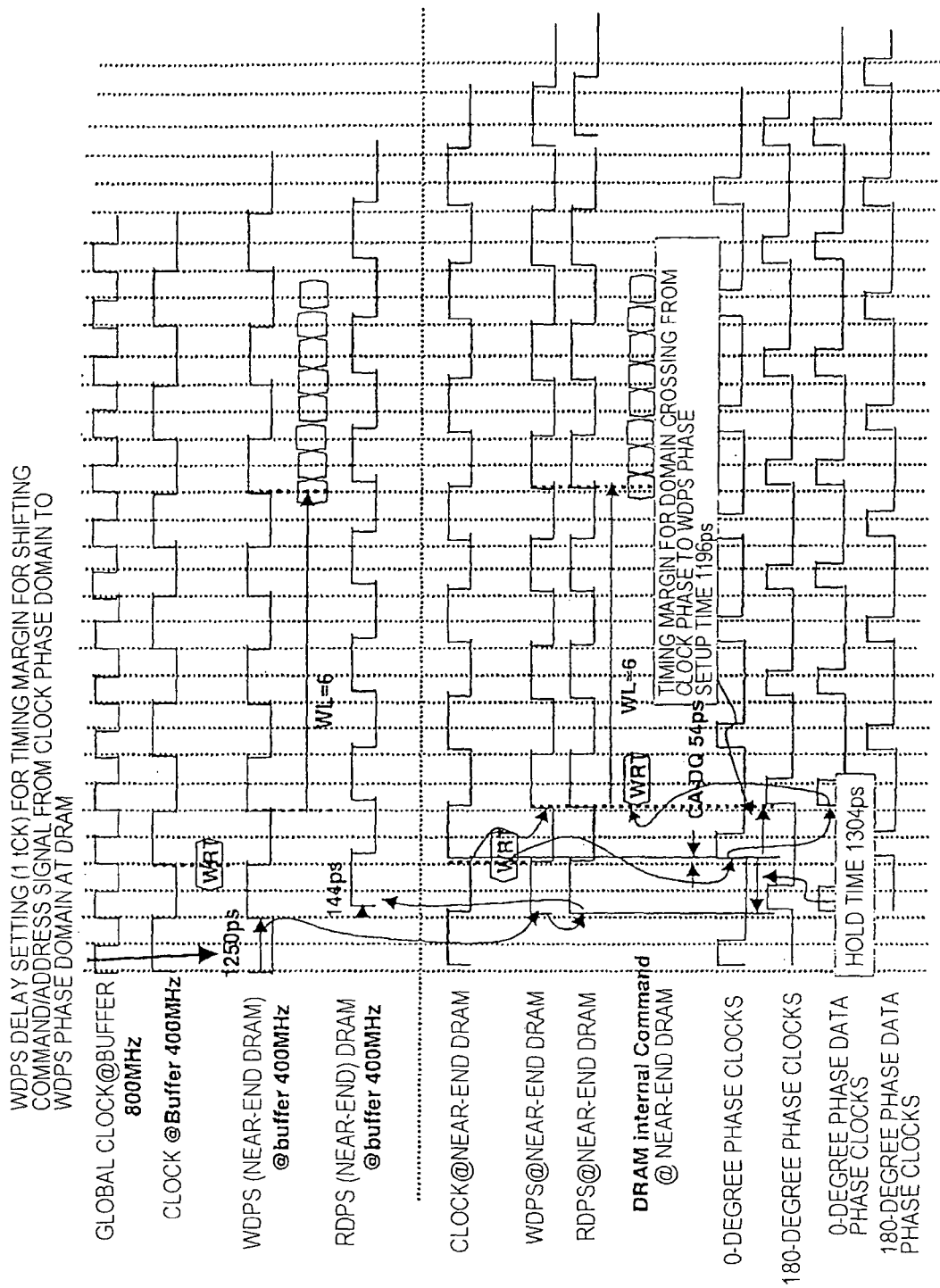
FIG. 46 is a timing chart for explaining write operations of the buffer and the near-end DRAM that are used in the memory system shown in FIGS. 42 and 44.

Referring to FIG. 46, description will be given about an operation of the shown example upon writing. Here, description will be given about an operation between the buffer 105 and the near-end DRAM 110N upon writing. Herein, it is assumed that, for matching the command/address signal with the global clocks in each DRAM 110, i.e. for shifting the command/address signal from the phase domain of the buffer clocks to the phase domain of the WDPS, the buffer 105 outputs the WDPS to the near-end DRAM 110N by delaying the WDPS by one system clock time phase (1250 ps), and a write latency (WL) is six system clocks.

As shown in the figure, when global clocks of 800 MHz (see the first line) are received, the clock dividing/phase comparing adjusting circuit 601 of the buffer 105 outputs buffer clocks of 400 MHz (see the second line). Synchronously with the buffer clocks, a write command (WRT) is outputted to the near-end DRAM 110N. On the other hand, a write phase signal (WDPS) of 400 MHz is outputted to the near-end DRAM 110N with a delay of a phase corresponding to one global clock (1250 ps), i.e. with a delay of ½ phase of the buffer clock signal. After the foregoing WL, a write data signal (DQ) is outputted to the near-end DRAM 110N synchronously with the WDPS.

On the other hand, at the near-end DRAM 110N, as described before, the buffer clocks and the write command (WRT) arrive in a propagation time after 126 ps, while the WDPS arrives in a 54 ps-shorter propagation time.

As shown in FIG. 42, at the near-end DRAM 110N, the command/address reception clock generating circuit 500 generates 0-degree and 180-degree phase clocks representing 0 degrees and 180 degrees of the received buffer clocks. Further, the clock reproducing/phase adjusting circuit 205 of the near-end DRAM 110N receiving the WDPS generates 0-degree and 180-degree phase data phase clocks representing 0-degree and 180-degree phases of the WDPS.

In the shown example, the command/address signal received at the DRAM synchronously with the clock signal is subjected to domain crossing from 0-degree phase clocks (phase of buffer clocks) to 0-degree phase data phase clocks (0-degree phase of WDPS) and, as a result, an internal write command (WRT) is produced synchronously with the 0-degree phase data phase clocks. This means that the domain crossing from the buffer clock phase to the WDPS phase has been implemented, and writing of the data signal (DQ) is carried out after 6 WL in response to the internally produced write command (WRT).

A setup time and a hold time of the thus configured near-end DRAM 110N for shifting the command/address signal from the clock phase to the data phase are 1196 ps and 1304 ps, respectively, and therefore, it is seen that a sufficient time margin can be ensured.

The near-end DRAM 110N produces an RDPS in phase with the received WDPS and outputs it to the buffer 105, which arrives at the buffer 105 after a propagation time of 144 ps.

Figure 47:
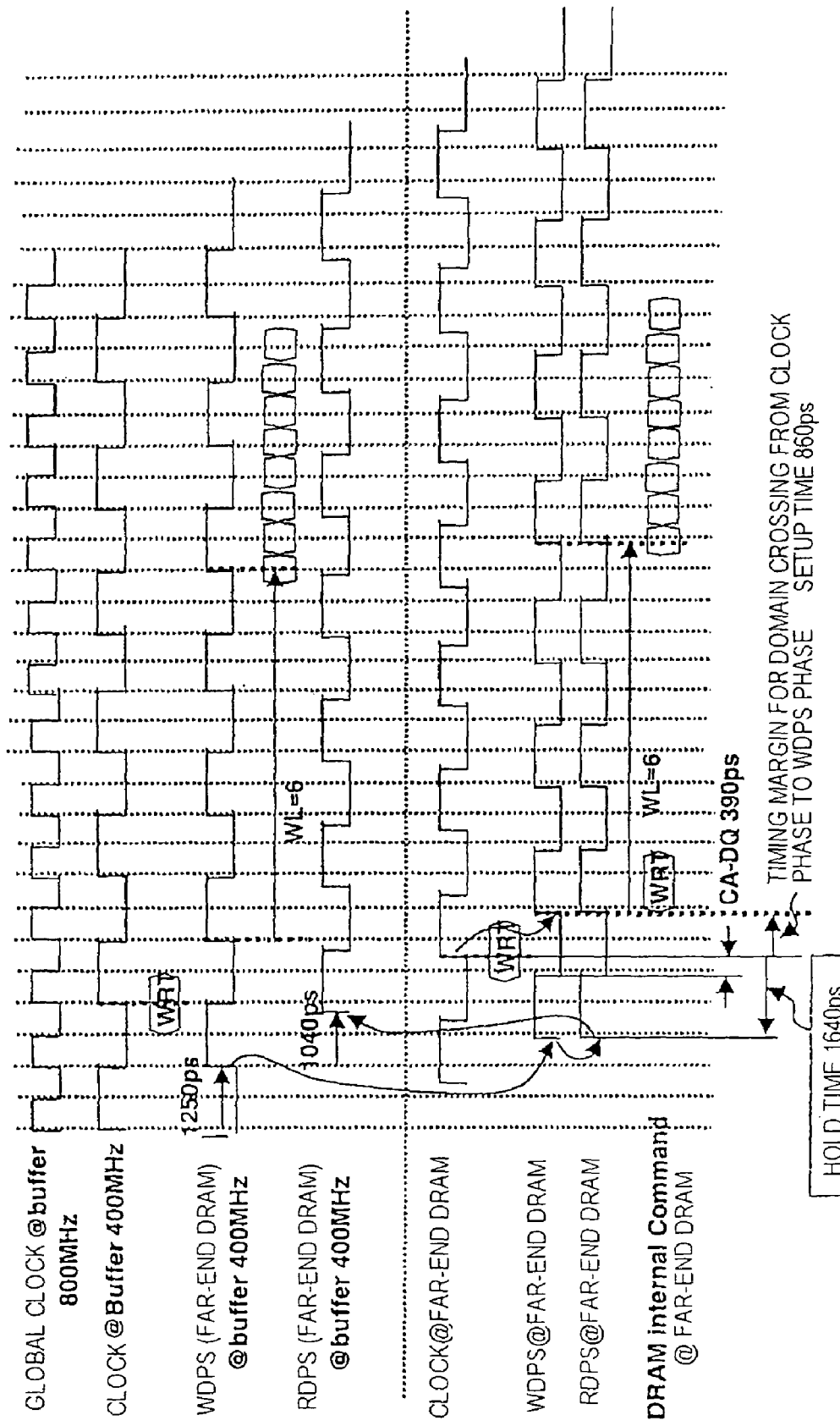
FIG. 47 is a timing chart for explaining write operations of the buffer and the far-end DRAM that are used in the memory system shown in FIGS. 42 and 44.

Referring to FIG. 47, there is shown an operation, upon writing, between the buffer 105 and the far-end DRAM 110F in the memory system according to the foregoing example. As shown in the figure, a write command (WRT) is outputted synchronously with buffer clocks of 400 MHz, while a WDPS is outputted with a delay of ½ phase of a 1250 ps delayed buffer clock signal relative to the buffer clocks. The write command (WRT) and the buffer clocks, and the WDPS reach the far-end DRAM 110F after a lapse of different delay times. They are received at the far-end DRAM 110F in the state where the foregoing skew of 390 ps is generated between the buffer clocks and the WDPS. At the far-end DRAM 110F, the received write command WRT is caused to match with the timing of the received WDPS to thereby produce a DRAM internal command (WRT) synchronously with the received WDPS, and a data signal (DQ) is written after 6 WL from the DRAM internal command.

As shown in the figure, a hold time and a setup time of the thus configured far-end DRAM 110F for shifting the command/address signal from the clock phase to the data phase can be 1640 ps and 860 ps, respectively. Accordingly, it is seen that a sufficient timing margin can be ensured.

Further, as shown in the figure, the far-end DRAM 110F having received the WDPS outputs an RDPS to the buffer 105 synchronously with the WDPS, wherein the RDPS has the same phase as the WDPS. After a lapse of 1040 ps subsequently to the production of the WDPS, the buffer 105 receives the RDPS having the corresponding phase from the far-end DRAM 110F. In this example, the RDPS has the same phase as the WDPS. Accordingly, 0-degree phase of the RDPS corresponds to 0-degree phase of the WDPS, 90-degree phase of the RDPS corresponds to 90-degree phase of the WDPS, and likewise, 180-degree and 270-degree phases of the RDPS correspond to 180-degree and 270-degree phases of the WDPS, respectively.

Figure 48:
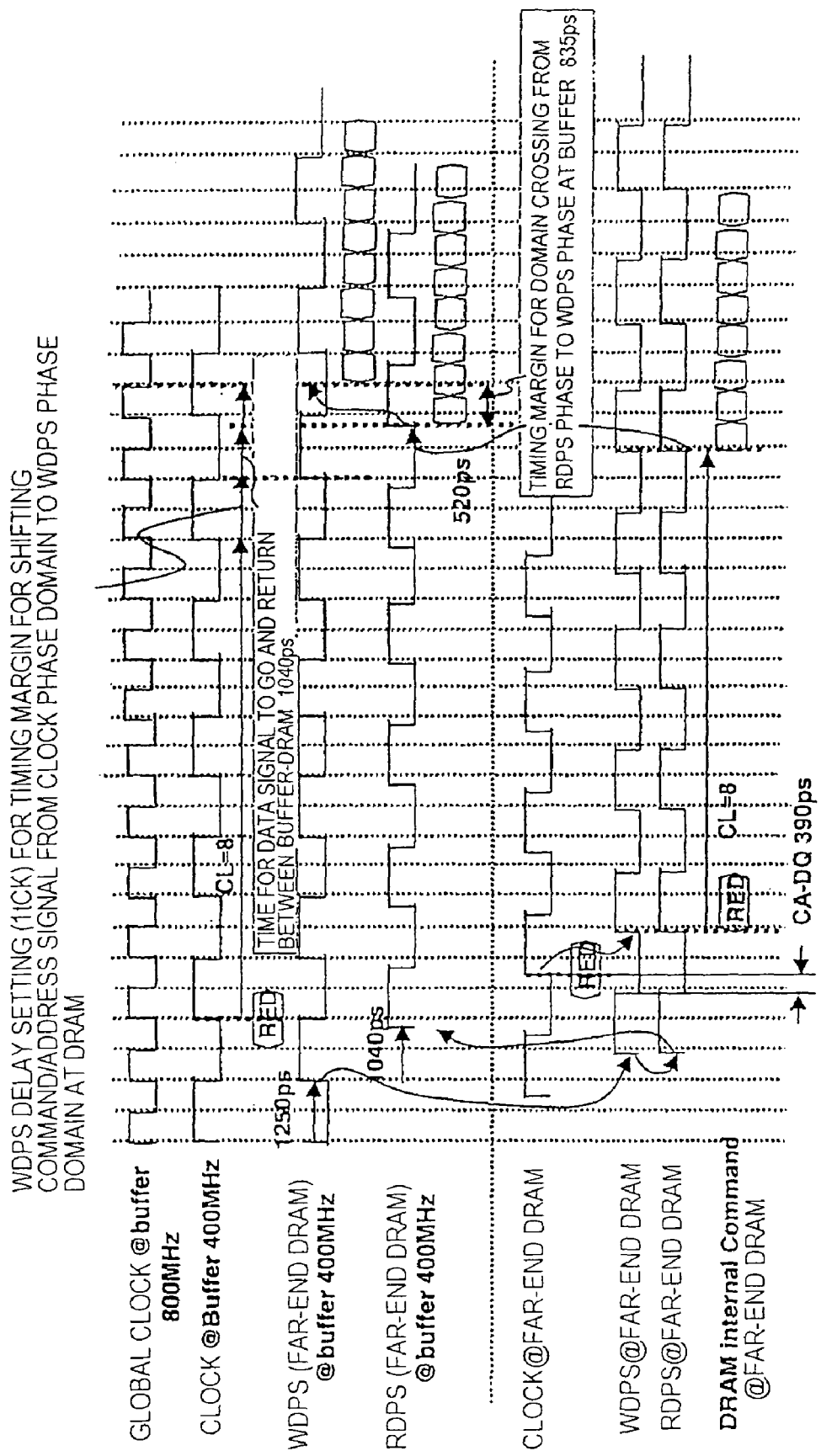
FIG. 48 is a time chart for explaining a read operation between the far-end DRAM and the buffer.

Now, referring to FIG. 48, description will be given about a read operation in the memory system according to the foregoing example, wherein the buffer 105 outputs a read command (RED) to the far-end DRAM 110F synchronously with the buffer clocks. As described above, when a time of 1040 ps has elapsed after the transmission of the WDPS, the RDPS having the corresponding phase arrives at the buffer 105 from the far-end DRAM 110F.

On the other hand, on the side of the far-end DRAM 110F, synchronously with the received WDPS, the RDPS having the same phase is outputted to the buffer 105. The buffer 105 outputs the read command (RED) to the far-end DRAM 110F synchronously with buffer clocks. The far-end DRAM 110F receives the read command at the timing of the buffer clock signal and delivers it to the data phase clocks produced based on the WDPS. As a result, the read command signal becomes an internal command produced based on the data phase (WDPS), and thereafter, an internal read operation of the DRAM 110F is implemented by this internal read command. After a lapse of eight global clocks from the received RED, a data signal (DQ) is read out. The read-out data signal is outputted to the buffer 105 from the far-end DRAM 110F synchronously with the RDPS and, after 520 ps, received at the buffer 105.

In this configuration, the timing margin for domain crossing from the RDPS phase to the WDPS phase in the buffer 105 is 835 ps, and therefore, it is understood that the sufficient timing margin can be obtained.

Figure 49:
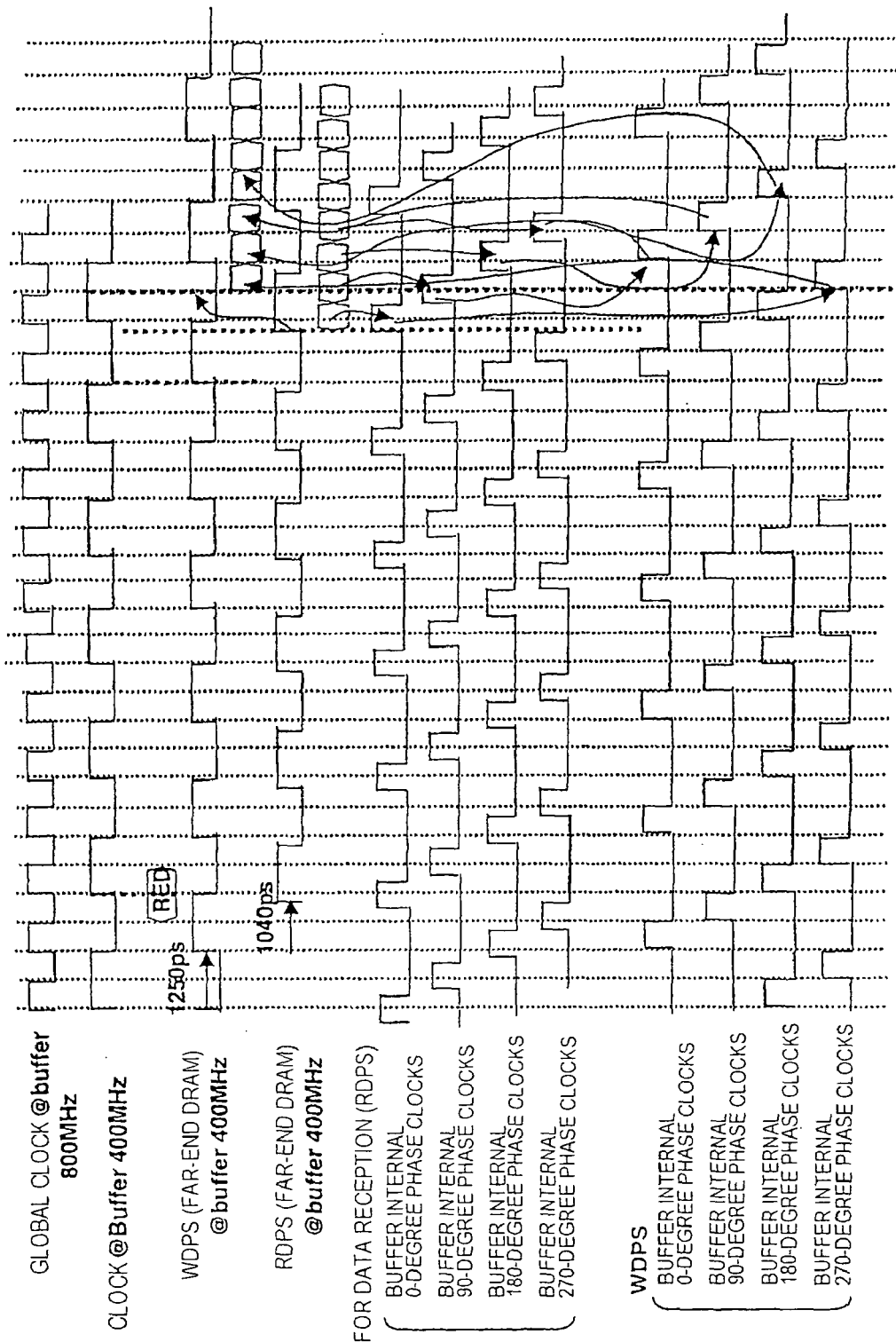
FIG. 49 is a timing chart for explaining an operation of the buffer upon reading.

Further, referring to FIG. 49 and FIG. 44, description will be given about an operation, upon reading, in the buffer 105 in the foregoing example. Here, it is assumed that a data signal (DQ) is read from the far-end DRAM 110F. At the buffer 105, the read data signal (DQ) is received synchronously with the received RDPS. The buffer 105 shown in FIG. 44 produces, from the RDPS, four-phase data reception buffer internal clocks (0, 90, 180 and 270 degrees) representing phases of the RDPS, and feeds them to the first-stage data latch circuit 611 of the domain crossing circuit 602. Therefore, the data signal (DQ) from the far-end DRAM 110F is stored into the first-stage data latch circuit 611 synchronously with those four-phase data reception buffer internal clocks, then fed to the second-stage data latch circuit 612.

Four-phase buffer internal phase clocks obtained from the WDPS (global clocks) produced at the buffer 105 are given to the second-stage data latch circuit 612 from the clock dividing/phase comparing adjusting circuit 601, and an output of the first-stage data buffer 611 is stored into the second-stage data latch circuit 612 according to the four-phase buffer internal phase clocks. As a result, the data signal (DQ) read from the far-end DRAM 110F is caused to match with the internal clocks produced in the buffer 105, so as to be outputted to the memory controller from the buffer 105.

Figure 50:
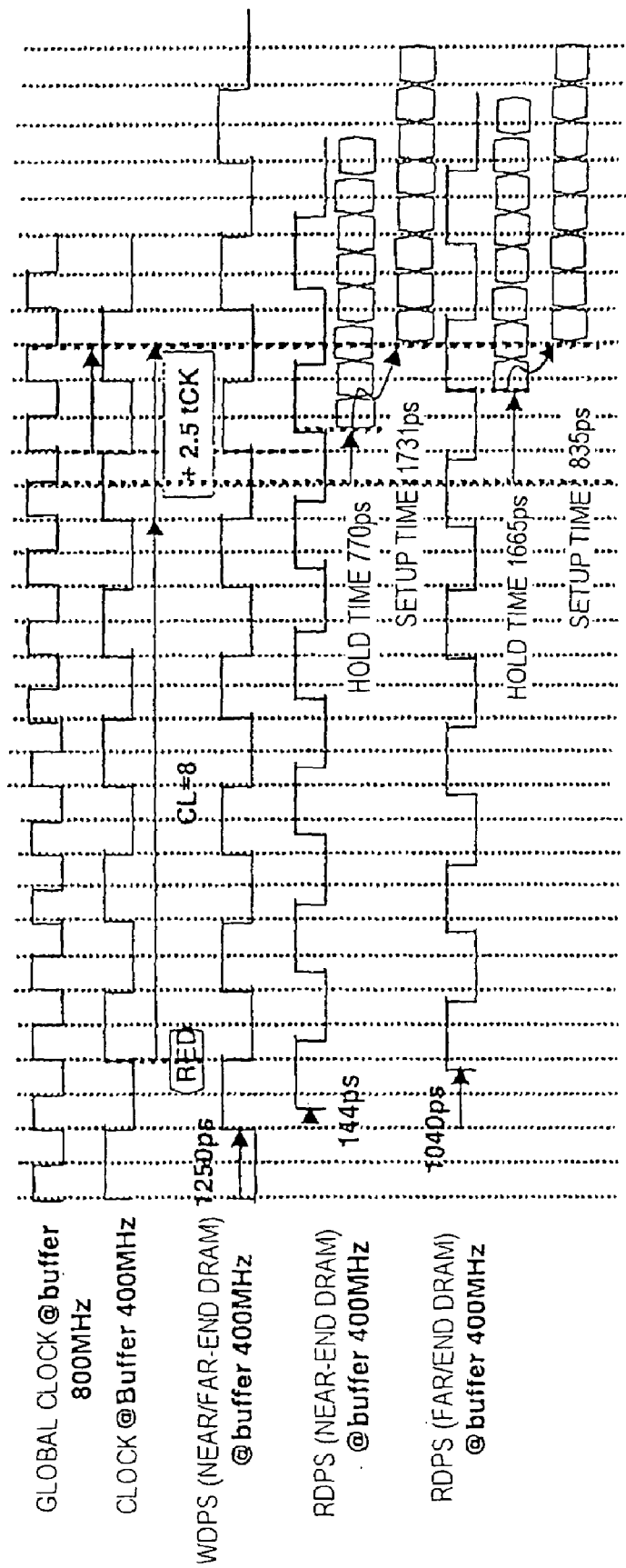
FIG. 50 is a timing chart for explaining an operation of the buffer when reading out read data from the near-end and far-end DRAMs.

Now, referring to FIG. 50, description will be given about an operation of the buffer 105 when processing data signals (DQ) from the near-end and far-end DRAMs 110N and 110F upon reading. It is assumed that read commands (RED) and WDPS delayed by ½ phase relative to buffer clocks are outputted to the near-end and far-end DRAMs 110N and 110F from the buffer 105 synchronously with the buffer clocks. In this case, as shown in the figure, an RDPS signal having the same phase as a corresponding phase of a WDPS signal is inputted into the buffer 105 at timing delayed by 144 ps from the near-end DRAM 110N, while it is inputted into the buffer 105 at timing delayed by 1040 ps from the far-end DRAM 110F. Here, assuming that the buffer 105 is set to start a data take-in operation at a time instant when (8+2.5) global clock time elapses after production of the read command (RED), hold times for shifting the timing of the data signals (DQ) that are read out synchronously with the RDPS of the near-end and far-end DRAMs, from the RDPS phase to the WDPS phase, i.e. the clock phase, in the buffer 105 are 770 ps and 1665 ps, respectively, and setup times therefor are 1731 ps and 835 ps, respectively, and therefore, it is understood that sufficient time margins are ensured.

The foregoing operation will be described in a more generalized manner. A buffer clock signal obtained by n-dividing (dividing by n) a system clock (global clock) signal in frequency, and a data phase signal (WDPS) having a frequency equal to that of the buffer clock signal are fed to the DRAMs from the buffer 105. On the other hand, command/address signals are transmitted from the buffer 105 while being matched with the buffer clock signal. When the command/address signals transferred in a period are m times at maximum, each command/address signal is received by one of internal clock signals produced per 1/m phase from the timing of the buffer clock signal at the DRAM.

On the other hand, in each DRAM 110, the command/ address signal is delivered to previously associated one of internal data phase clocks that are internally produced per 1/m phase, likewise, from the timing of the data phase signal (WDPS) transmitted from the buffer 105, so that an internal command/address signal is produced.

Data signals written into the respective DRAMs 110 are transmitted to the DRAMs 110 from the buffer 105 while being matched with the timing of the data phase signal (WDPS). When the data signals transferred in a period are k times at maximum, the data signal is received at each DRAM 110 and stored therein by one of internal clock signals that are produced at the DRAM 110 per 1/k phase from the timing of the data phase signal (WDPS) transmitted from the buffer 105.

On the other hand, the data signal read from each DRAM 110 is transmitted from the DRAM 110 while being matched with the timing of the data phase signal (RDPS), and received at the buffer 105 by one of internal clock signals produced per 1/k phase from the timing of the data phase signal (RDPS) transmitted from the DRAM 110. This RDPS is delivered to previously associated one of internal clocks produced per 1/k phase from the timing of the data phase signal (WDPS) that is originally produced in the buffer 105, so that an internal read data signal is produced.

In this case, the command/address signal is transmitted to the buffer 105 synchronously with leading and trailing edges of the buffer clock signal, and taken into the DRAM synchronously with leading and trailing edges of the buffer clock signal.

Figure 51:
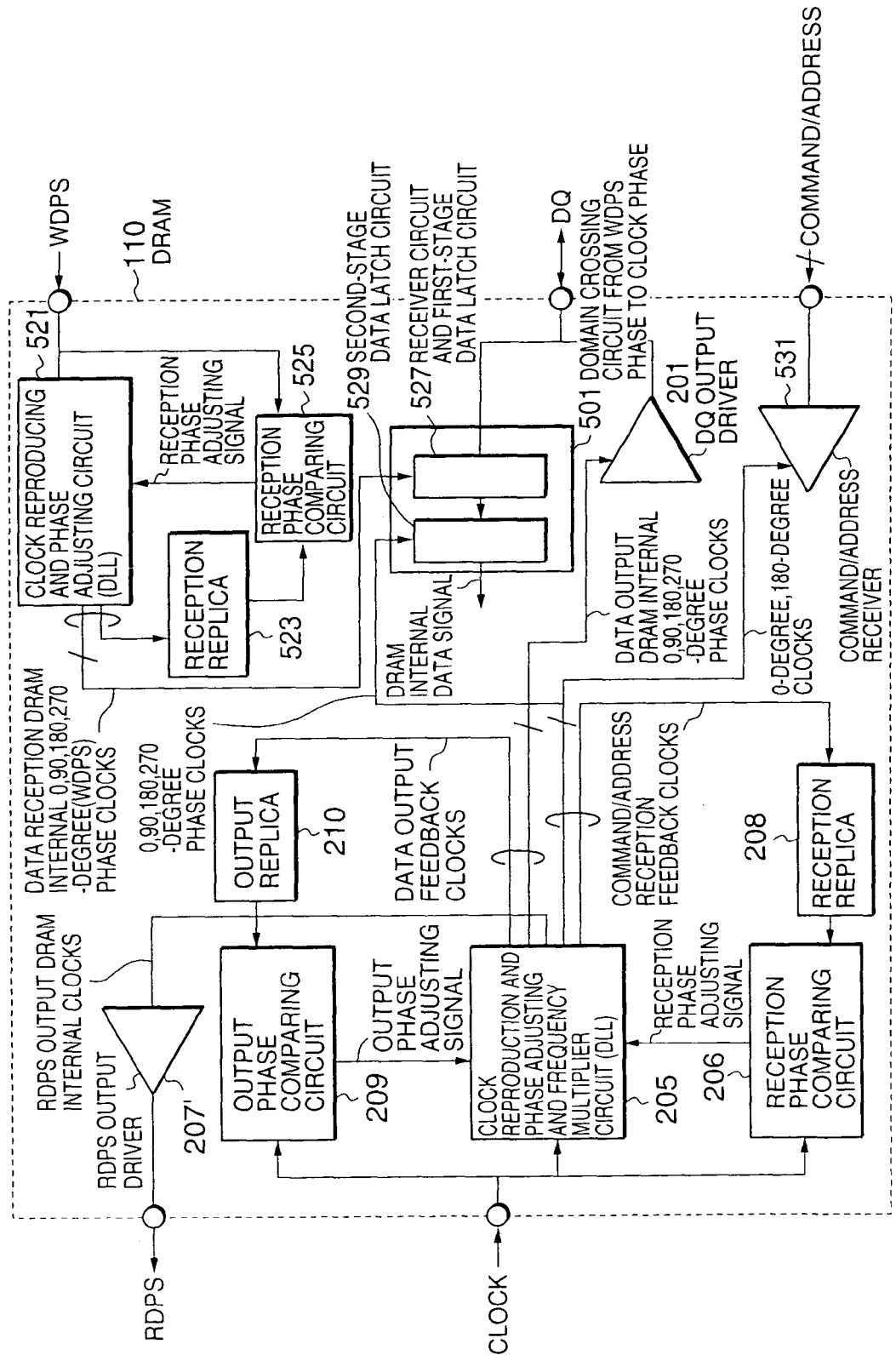
FIG. 51 is a block diagram showing a DRAM that is used in a memory system according to a second example of the present invention.

Referring to FIG. 51, there is shown a DRAM 110 that is used in a memory system according to a second example of the present invention. The DRAM 110 according to this example is configured to take in a data signal using phase clocks produced from a WDPS and deliver it to phase clocks produced from a buffer clock signal. Therefore, the shown DRAM 110 comprises a clock reproducing/phase adjusting circuit 521 that operates in response to reception of the WDPS, and the clock reproducing/phase adjusting circuit 521 is connected to a reception replica 523 and a reception phase comparing circuit 525. Under the control of a reception phase adjusting signal from the reception phase comparing circuit 525, the shown clock reproducing/phase adjusting circuit 521 produces four-phase data reception DRAM internal phase clocks (0, 90, 180 and 270 degrees) from the WDPS and feeds them to a first-stage data latch circuit 527 of a domain crossing circuit 501.

On the other hand, the buffer clock signal is given to a clock reproducing/phase adjusting circuit (DLL) 205 which produces four-phase phase clocks therefrom and feeds them to a second-stage data latch circuit 529 of the domain crossing circuit 501.

Figure 52:
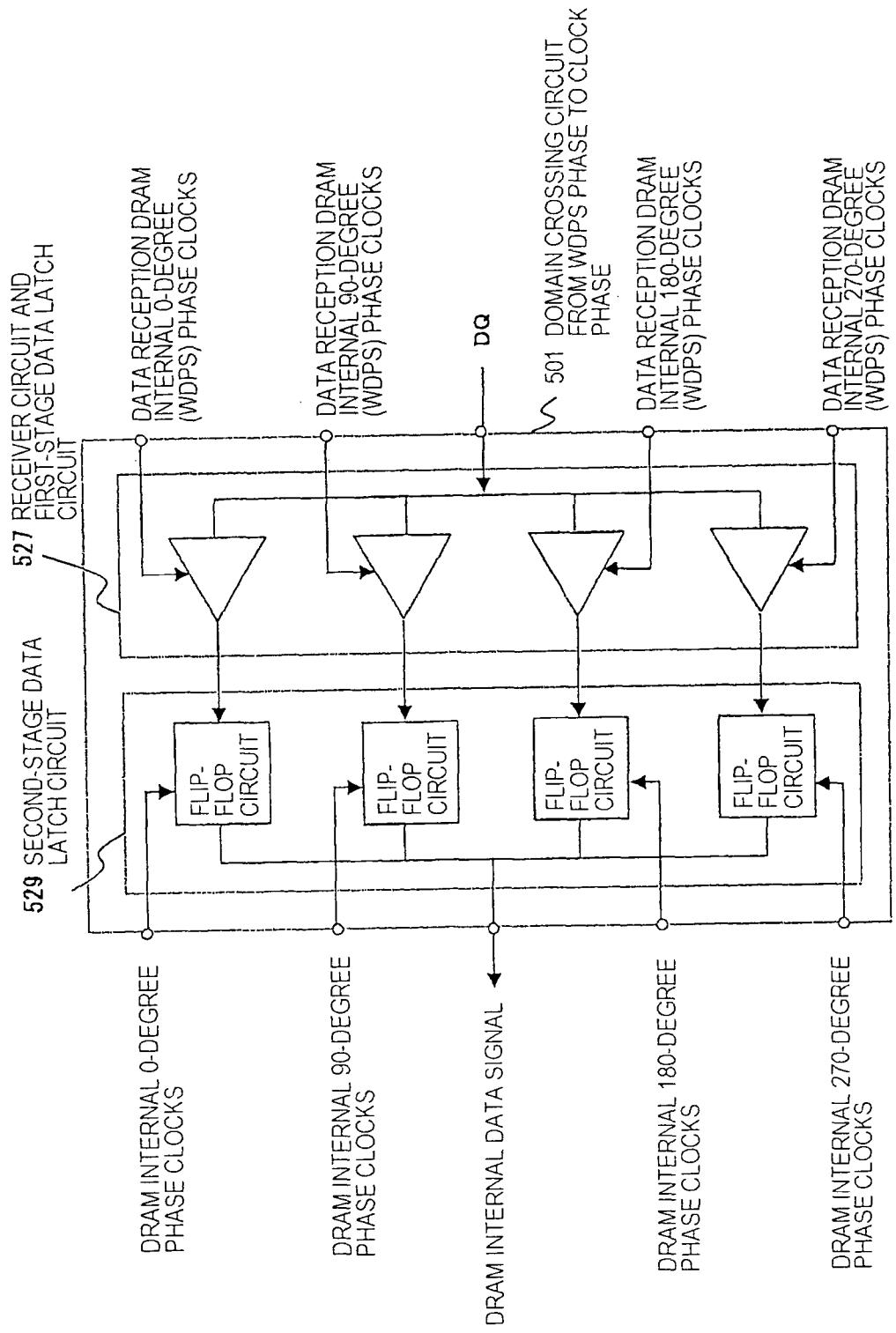
FIG. 52 is a block diagram showing a concrete configuration of a domain crossing circuit used in the DRAM shown in FIG. 51.

Referring also FIG. 52, the first-stage data latch circuit 527 of the domain crossing circuit 501 is given a data signal (DQ) from the buffer 105, and further given from the clock reproducing/phase adjusting circuit 521 four-phase data reception DRAM internal phase clocks produced from the WDPS. Therefore, the first-stage data latch circuit 527 composed of four receivers/latches receives the data signal (DQ) at timing of the four-phase data reception DRAM internal clocks and latches it, and feeds outputs thereof to the second-stage data latch circuit 529 composed of four flip-flop circuits, respectively.

Four-phase DRAM internal phase clocks are respectively given to the four flip-flop circuits of the second-stage data latch circuit 529, and the outputs from the first-stage data latch circuit 527 are stored according to the four-phase DRAM internal phase clocks and outputted as a DRAM internal data signal.

Further, the clock reproducing/phase adjusting circuit 205 produces two-phase phase clocks of 0 and 180 degrees from the buffer clock signal and feeds them to a command/address receiver 531. The command/address receiver 531 takes in a command/address signal according to the two-phase phase clocks and outputs it as an internal command/address signal. Accordingly, the internal command/address signal is produced at the buffer clock phase, and an internal read/write operation of the DRAM is implemented synchronously with the buffer clock phase.

Figure 53:
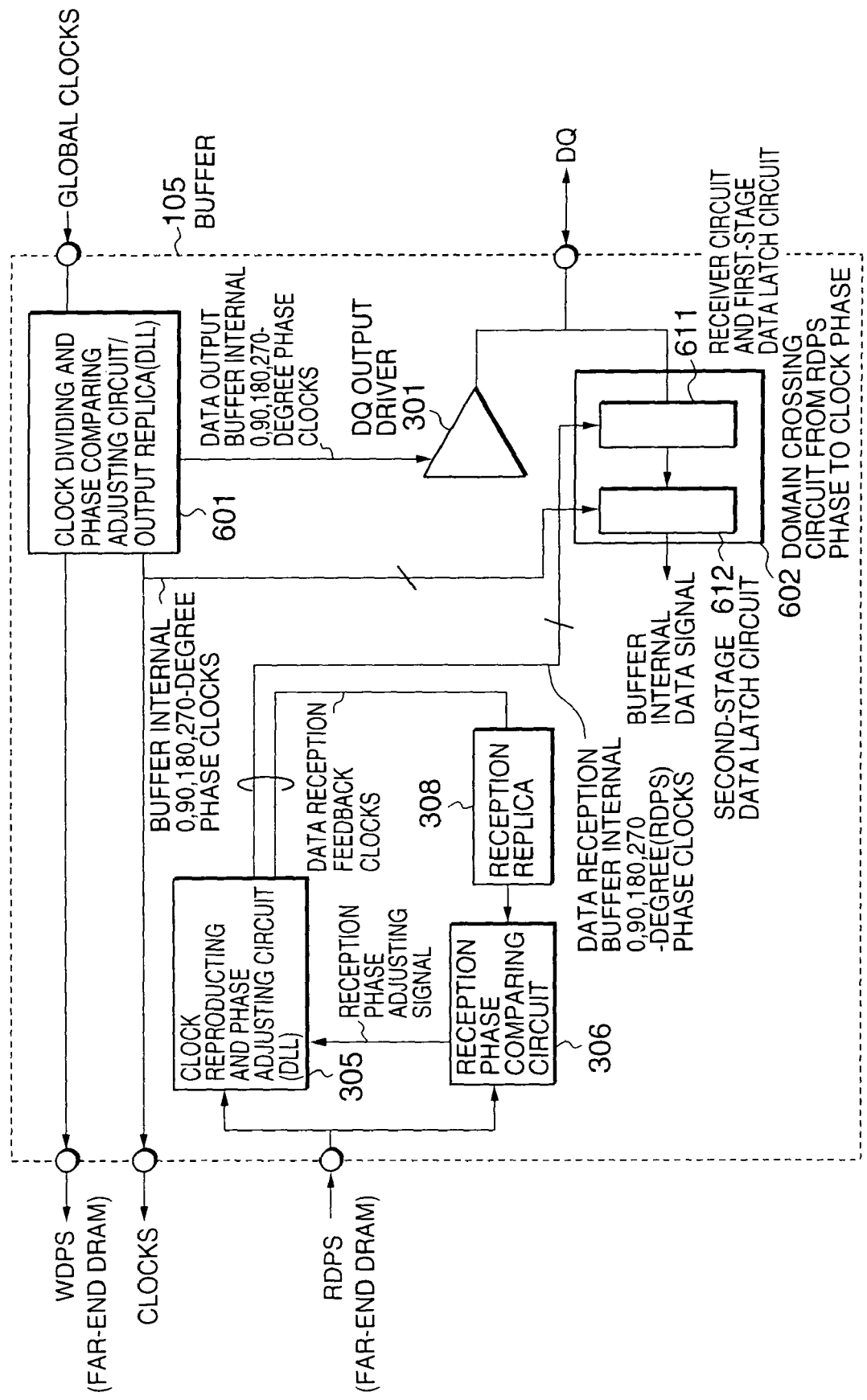
FIG. 53 is a block diagram showing a buffer forming the second example of the present invention cooperatively with the DRAM shown in FIG. 51.

Referring to FIG. 53, there is shown a specific example of the buffer 105 that is used while being connected to the foregoing DRAM 110. A clock dividing/phase comparing adjusting circuit 601 included in the shown buffer 105 feeds buffer internal four-phase phase clocks to a domain crossing circuit 602, and further outputs data output buffer internal four-phase clocks to a DQ output driver 301, which differs from the buffer 105 shown in FIG. 44. Further, the shown domain crossing circuit 602 is given data reception buffer internal four-phase clocks produced based on the RDPS from a clock reproducing/phase adjusting circuit 305.

Figure 54:
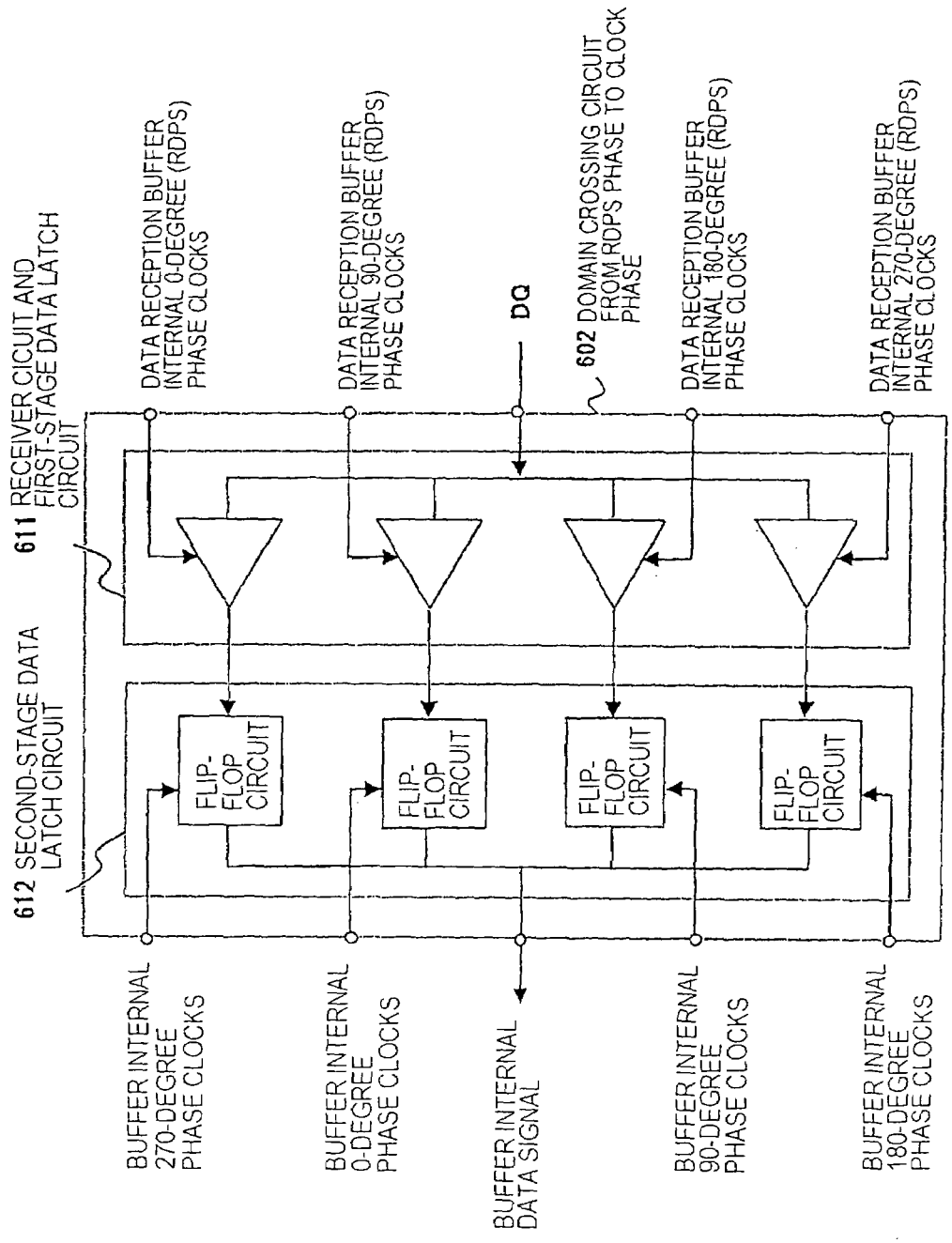
FIG. 54 is a block diagram showing a concrete configuration of a domain crossing circuit used in the buffer shown in FIG. 53.

Referring also to FIG. 54, a first-stage data latch circuit 611 of the domain crossing circuit 602 shown in FIG. 53 comprises four receivers for receiving a data signal (DQ) according to the four-phase data reception buffer internal phase clocks and latching it, and outputs of the respective receivers are fed to four flip-flop circuits forming a second-stage data latch circuit 612, respectively. These flip-flop circuits latch the outputs of the first-stage data latch circuit according to the four-phase buffer internal phase clocks. As shown in the figure, the outputs received and latched in the first-stage data latch circuit 611 according to the 0, 90, 180 and 270-degree data reception buffer phase clocks, i.e. the clocks representing the RDPS, are latched in the second-stage data latch circuit 612 according to the 270, 0, 90 and 180-degree internal phase clocks, respectively, and therefore, it is understood that the data signal is latched by the different phase clocks. In other words, in the shown example, it is seen that shifting to a 90-degree advanced phase is performed in the phase of the buffer clock signal.

Figure 55:
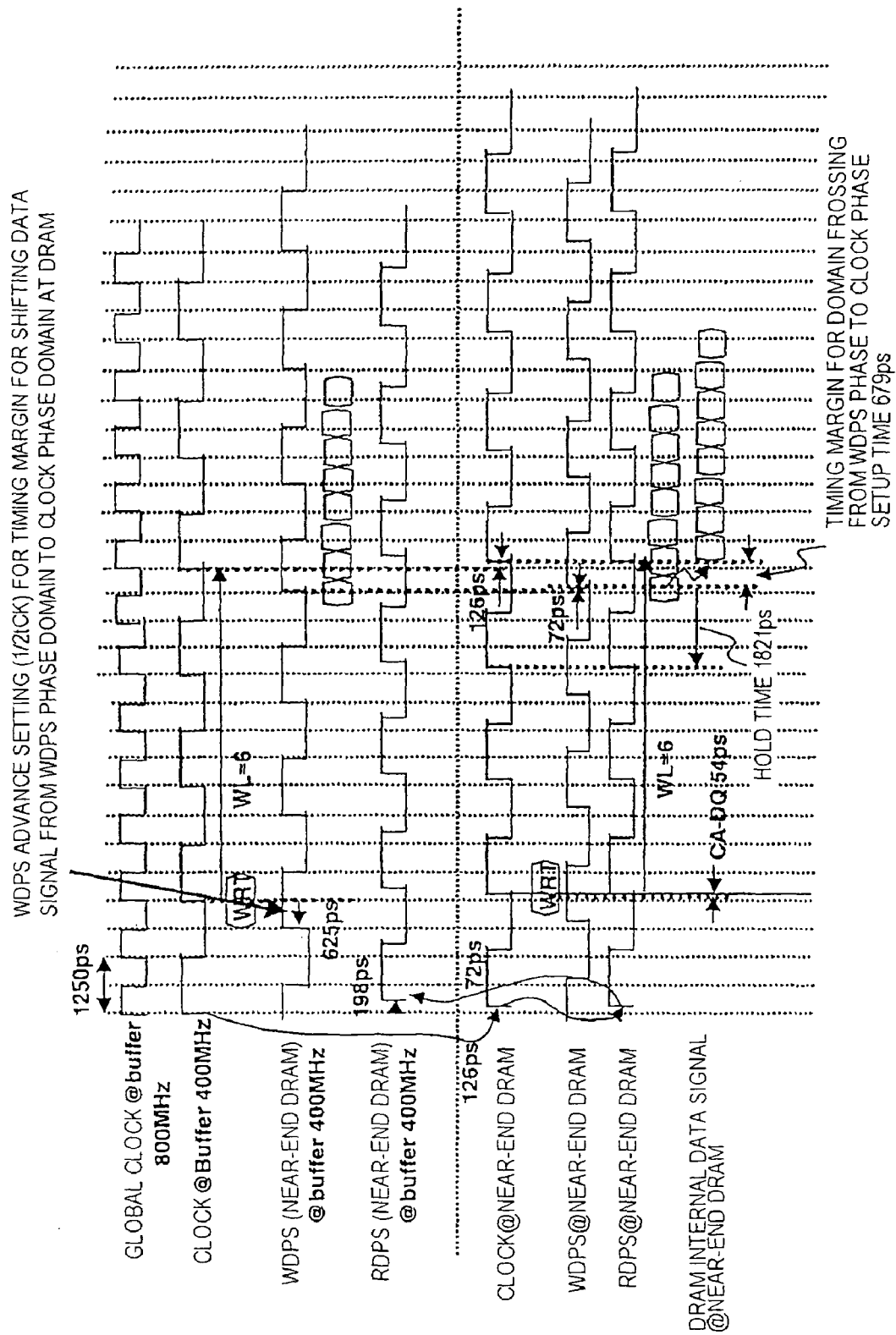
FIG. 55 is a timing chart for explaining a write operation between the buffer and the near-end DRAM in the second example.

Referring to FIG. 55, description will be given about a write operation between the buffer 105 and the near-end DRAM 110N. The buffer 105 outputs a WDPS to the near-end DRAM 110N. For ensuring a time margin for shifting a data signal (DQ) from WDPS phase domain to clock phase domain in the DRAM 110, the WDPS has a phase that is advanced by 90 degrees (½ clock in terms of global clocks; 625 ps) relative to the buffer clock signal.

In the figure, a write command (WRT) is outputted to the near-end DRAM 110N from the buffer 105 synchronously with the buffer clocks. On the other hand, after a write latency corresponding to six clocks of the global clocks, the data signal (DQ) is outputted from the buffer 105 synchronously with the WDPS.

The buffer 105 outputs the buffer clocks and the write command (WRT) synchronous with the buffer clocks, and further outputs the WDPS while matching it with the buffer clocks.

In this event, the write command (WRT) and the WDPS (i.e. DQ) are received at the near-end DRAM 110N while having a propagation delay difference of 54 ps therebetween.

After 6 WL (write latency) from the received write command, when the data signal (DQ) is outputted from the buffer 105 synchronously with the WDPS, it is inputted into the DRAM 110N according to the data phase clocks produced from the WDPS, and delivered to the phase clocks produced from the buffer clock signal. Herein, a hold time and a setup time for domain crossing from the data phase to the clock phase are 1821 ps and 679 ps, respectively. The shown near-end DRAM 110N outputs the RDPS to the buffer 105 at the timing of the received buffer clocks. After 72 ps, i.e. after 198 ps from a corresponding phase of the global clocks, the RDPS is inputted into the buffer 105.

Figure 56:
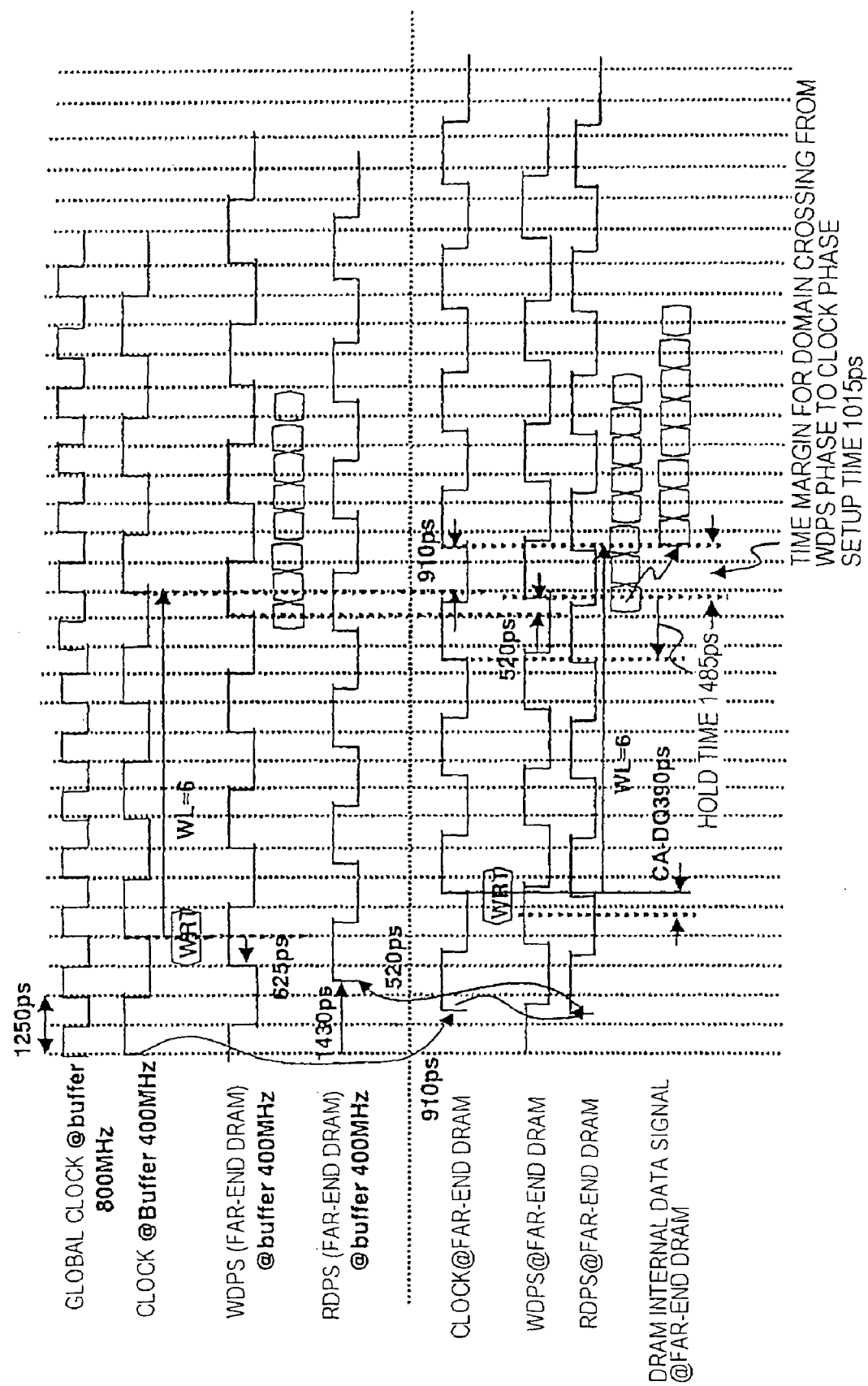
FIG. 56 is a timing chart for explaining a write operation between the buffer and the far-end DRAM in the second example.

Referring to FIG. 56, there is shown a write operation relative to the far-end DRAM 110F. In this case, assuming that there exists a skew propagation delay time difference of 390 ps between a write command (WRT) and a data signal (DQ) which are received at the far-end DRAM 110F, there also exists a like skew between buffer clocks and a WDPS. Taking this into account, the phase of the WDPS is advanced by 90 degrees, and domain crossing from the WDPS phase to the buffer clock phase is carried out. As a result, even in the far-end DRAM 110F, as shown in the figure, a hold time of 1485 ps and a setup time of 1015 ps are ensured for domain crossing from the data phase to the clock phase, so that a sufficient timing margin is obtained.

Figure 57:
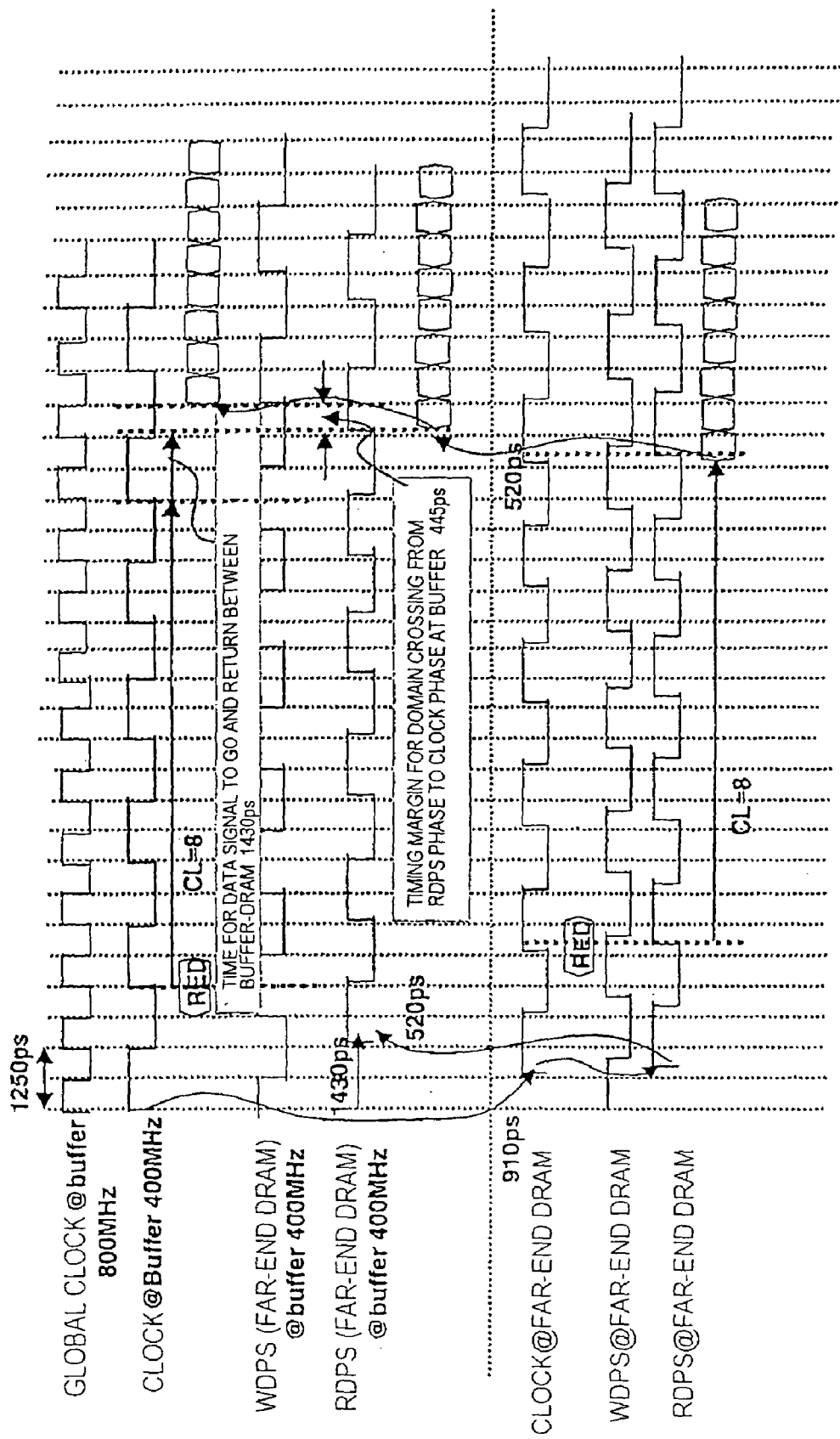
FIG. 57 is a timing chart for explaining a read operation between the buffer and the far-end DRAM in the second example.

Further, upon reading, as shown in FIG. 57, the DRAM 110 transmits an RDPS to the buffer 105 so as to be in phase with the buffer clock phase, and a data signal (DQ) is transmitted to the buffer 105 while being matched with the RDPS. The buffer 105 takes in the data signal according to a phase clock signal produced from the RDPS. In this manner, by delivering the data signal to the phase clock signal produced based on the clock signal within the buffer 105, it is possible to match it with the clock phase in the buffer 105.

In the buffer 105, for allowing the phase of the RDPS in the buffer 105 to allocate margins to a setup time and a hold time relative to the phase of the delivery-destination clocks, the delivery is carried out such that 0 degrees to the RDPS correspond to 270 degrees of the clock signal.

Figure 58:
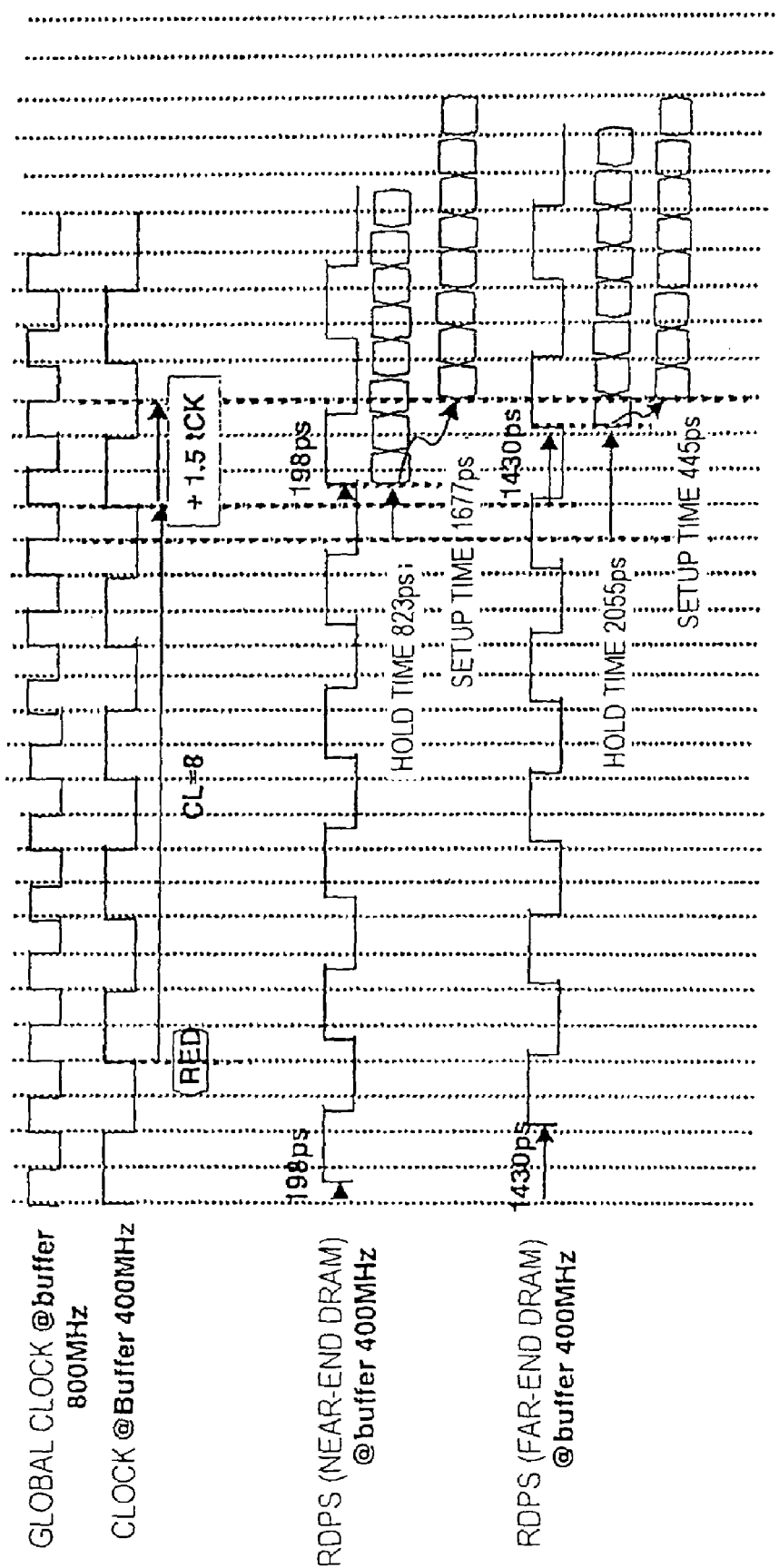
FIG. 58 is a timing chart for explaining an operation of the buffer when processing read data signals from the near-end and far-end DRAMs.

Through this operation, as shown in FIG. 58, when the read data from the near-end and far-end DRAMs are received at the buffer 105, a sufficient setup time and hold time can be ensured. In the shown example, a hold time of 823 ps and a setup time of 1677 ps can be ensured in the near-end DRAM 110N, while a hold time of 2055 ps and a setup time of 445 ps can be ensured in the far-end DRAM 110F. In the shown example, in the data signal reading operation, the total latency is equal to the sum of a read-out time and 1.5 clocks in the DRAM.

As clear from the foregoing, the command/address reception clock generating circuits 500 and 521, the domain crossing circuits 501, and the clock reproducing/phase adjusting circuits 205 in the DRAMs 110 shown in FIGS. 42 and 51 operate as DRAM side circuits for absorbing a skew between the data signal and the command/address signal, while the clock dividing/phase comparing adjusting circuits 601, the domain crossing circuits 602, and the clock reproducing/phase adjusting circuits 305 in the buffer 105 shown in FIGS. 44 and 52 operate as buffer side circuits for absorbing the skew.

In the foregoing two examples, the clock signal and the data phase signal (W/RDPS) fed to each DRAM are produced in the buffer 105 by 2-dividing (dividing to half or dividing by 2) the system clock signal (i.e. global clocks) in frequency. Further, in each DRAM and the buffer 105, the clock phase signal and the data phase signal are produced per ½ phase in case of the command/address signal and per ¼ phase in case of the data signal. Further, the clock phase signal and the data phase signal internally produced and having different phases are associated with each other to thereby shift the timing of the received signal between the clocks. In this case, since the period of each of the associated signal is twice that of the system clock signal, margins to the setup time and the hold time can be ensured relative to the delivery-destination phase signal as described above.

In this case, the margins to the setup time and the hold time are ideally such that edges of the phase signal taking in the signal to be delivered are located just at the middle positions between edges of the delivery-destination phase signal. However, in case of signal transmission from the buffer to the DRAM, an adjustment may be performed to retard or advance the phase of the WDPS in the buffer relative to the clock signal, thereby to more approximate it.

Further, when matching the DQ signals from the DRAMs in the buffer, a delivering-side phase signal may be selected such that edges of the RDPS from the far-end and near-end DRAMs approximate the middle positions of the WDPS or the clock signal serving as the delivery-destination phase signal. In the foregoing examples, it is clear that the 270-degree phase signal of the WDPS or the clock signal is set to correspond to the 0-degree phase signal of the RDPS, thereby to achieve matching of the timing of the DQ signals from the DRAMs.

Further, a flight time that is not synchronous with clocks on the module until the DQ signal is transferred to the buffer from the DRAM becomes a time for the data signal to go and return between the buffer and the DRAM in case of the first example, while it becomes the sum of a time for the read command to be transmitted from the buffer to the DRAM and a time for the data signal to be transmitted from the DRAM to the buffer in case of the second example. It becomes 1040 ps at maximum (in case of the far-end DRAM) in the first example, while it becomes 1430 ps at maximum in the second example. By 2-dividing the system clock signal in frequency, it becomes possible to perform the processing (matching with the original clock phase on the buffer) in one cycle (2500 ps).

Figure 59:
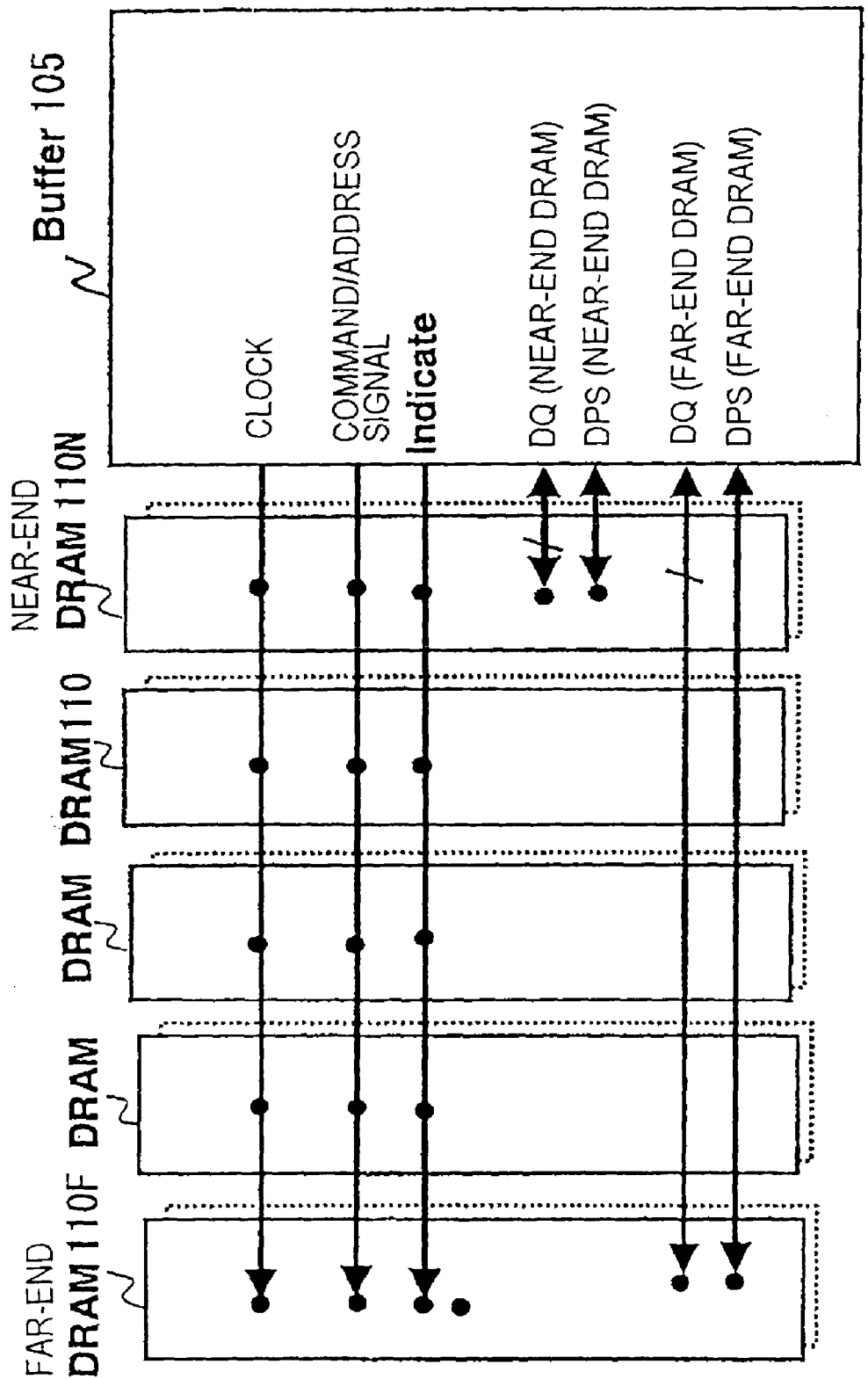
FIG. 59 is a block diagram for explaining a memory system according to a third example of the present invention.

Referring to FIG. 59, description will be given about a memory system according to a third example of the present invention. In this example, a DPS (Data Phase Signal) is used and, while suppressing the increase of the number of wirings, transmission/reception of a DPS of a differential signal is made possible. This example differs from the other examples in that an RDPS transmitted from each DRAM and a WDPS transmitted from a buffer 105 are transmitted/received via a common signal line, and a control signal (indicate) is transmitted to the DRAMs 110 from the buffer 105. This control signal (indicate) is a signal for switching, on the side of the DRAM 110, between a time period for receiving a data phase signal (WDPS) from the buffer 105 and a time period for transmitting a data phase signal (RDPS) to the buffer 105. On the other hand, the buffer 105 switches reception/transmission of a data phase signal (DPS) in the buffer 105 according to a control signal (indicate) of itself.

As shown in FIG. 59, since the control signal can be shared among the DRAMs 110 on the memory module, wiring for the control signal (indicate) is increased only by one.

In the memory system (i.e. memory module 103) according to the foregoing third preferred embodiment, it is necessary to configure the driver circuit in open-drain mode when the signal line is shared with the RDPS and WDPS. However, in this example, it may also be a CMOS push-pull driver, or a differential signal may be used, so that the timing accuracy can be improved.

Figure 60:
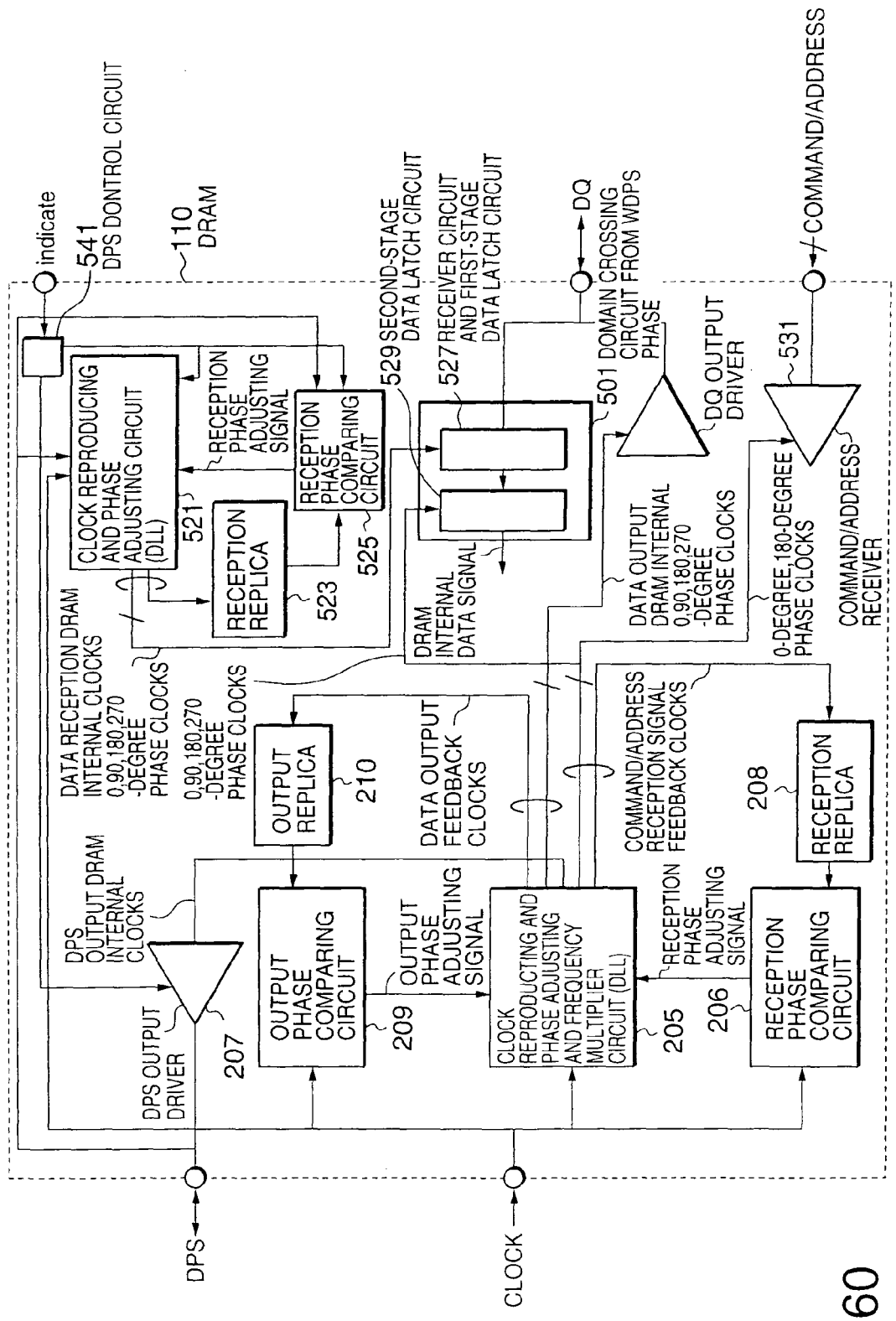
FIG. 60 is a block diagram showing a configuration of a DRAM that is used in the example shown in FIG. 59.
Figure 61:
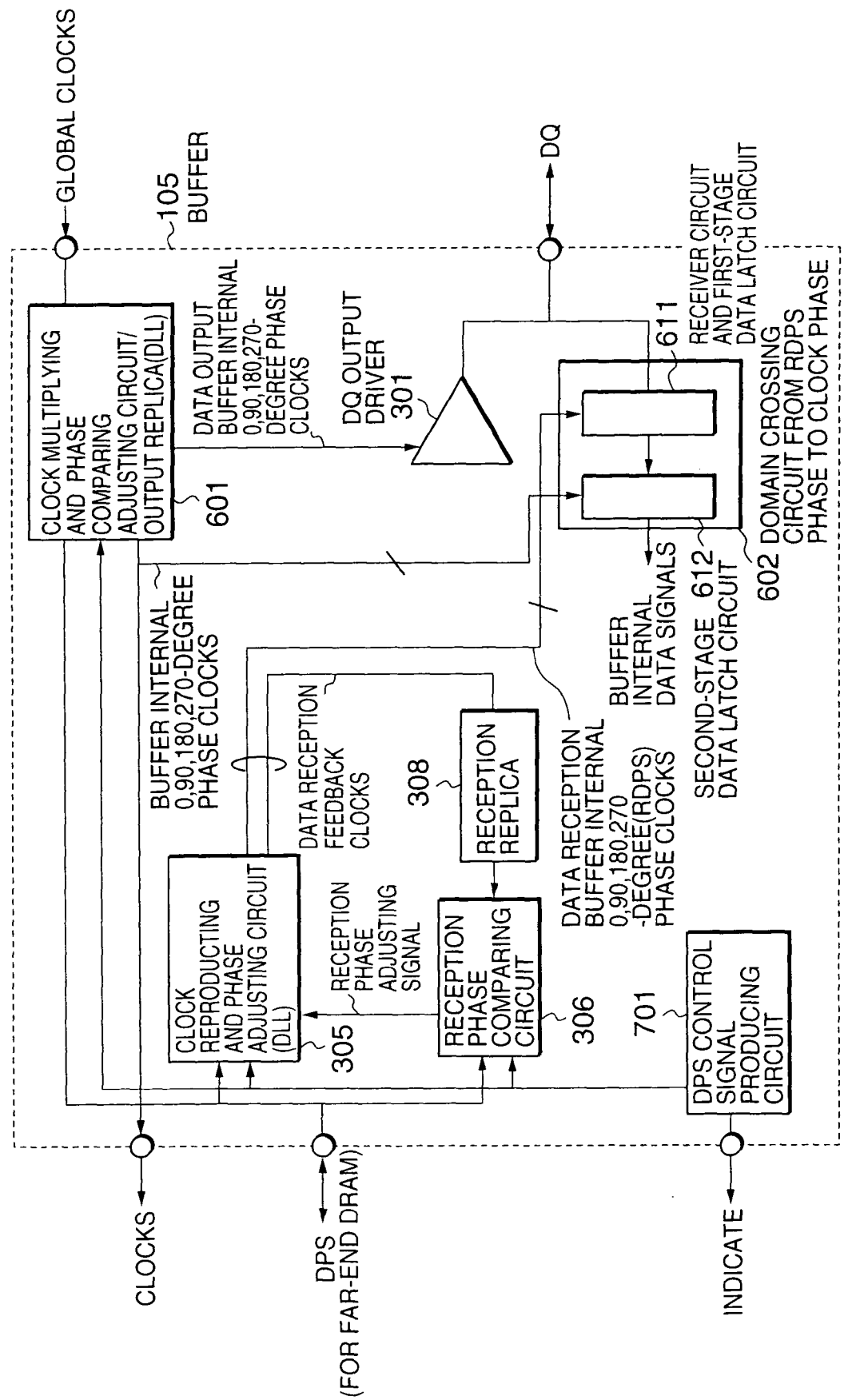
FIG. 61 is a block diagram showing a configuration of a buffer used in the third example.

Referring to FIG. 60, there is shown a configuration of the DRAM 110 that is used in this example, while FIG. 61 shows a configuration of the buffer 105 likewise used in this example. As clear from FIG. 61, the buffer 105 is provided with a DPS control signal producing circuit 701, and a control signal (indicate) is transmitted to the DRAMs 110 from the DPS control signal producing circuit 701, while an internal control signal is outputted to a clock dividing/phase comparing adjusting circuit 601, a clock reproducing/phase adjusting circuit 305, and a reception phase comparing circuit 306 from the DPS control signal producing circuit 701.

On the other hand, the DRAM 110 shown in FIG. 60 is provided with a DPS control circuit 541 that, in response to reception of the control signal (indicate), switches a mode of a DPS driver 207, and changes the state of a clock reproducing/phase adjusting circuit 521 and a reception phase comparing circuit 525. Inasmuch as the other components have already been explained, no details thereof are given here.

Figure 62:
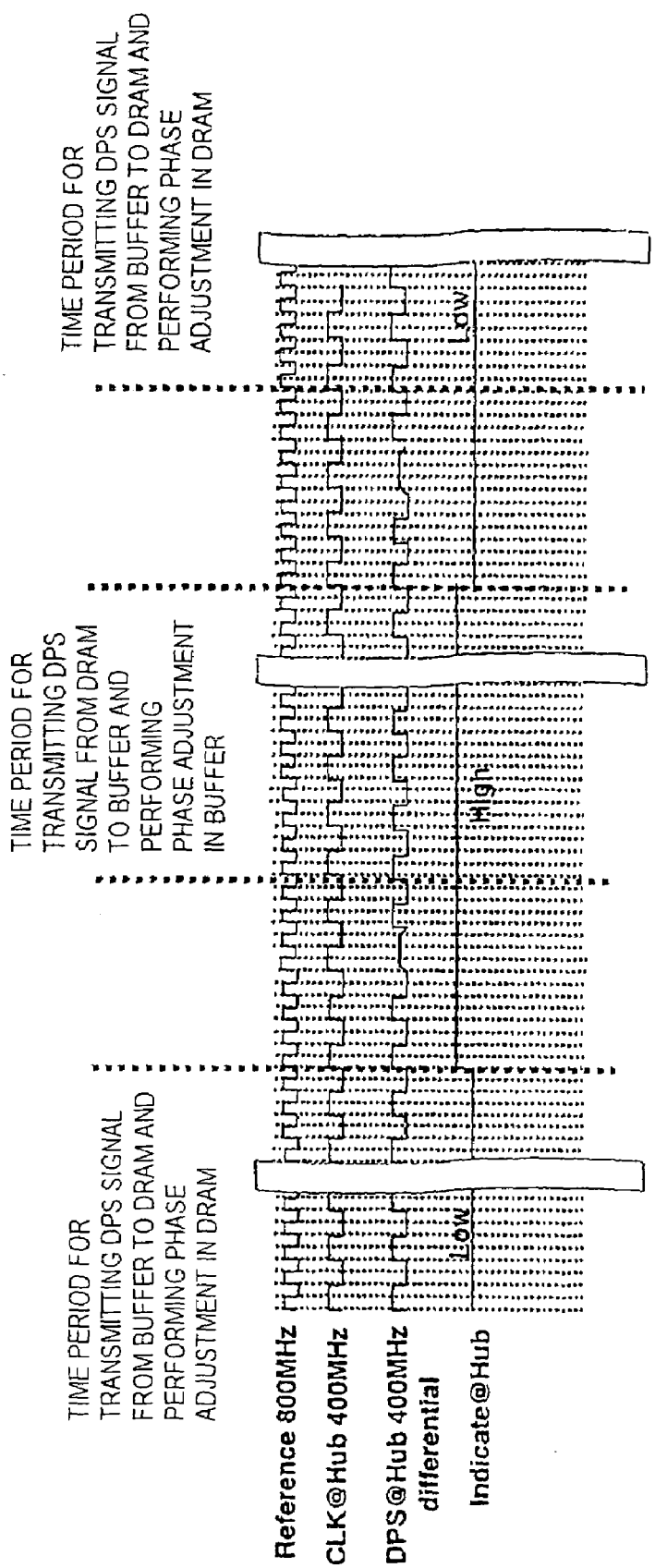
FIG. 62 is a timing chart for explaining an operation in the third example.

Referring to FIG. 62, there is shown timing for switching between a time period for transmitting the data phase signal from the buffer 105 according to the control signal (indicate) transmitted from the buffer 105, and a time period for transmitting the data phase signal from the DRAM according to the control signal. In the shown example, both time periods are switched alternately.

Figure 63:
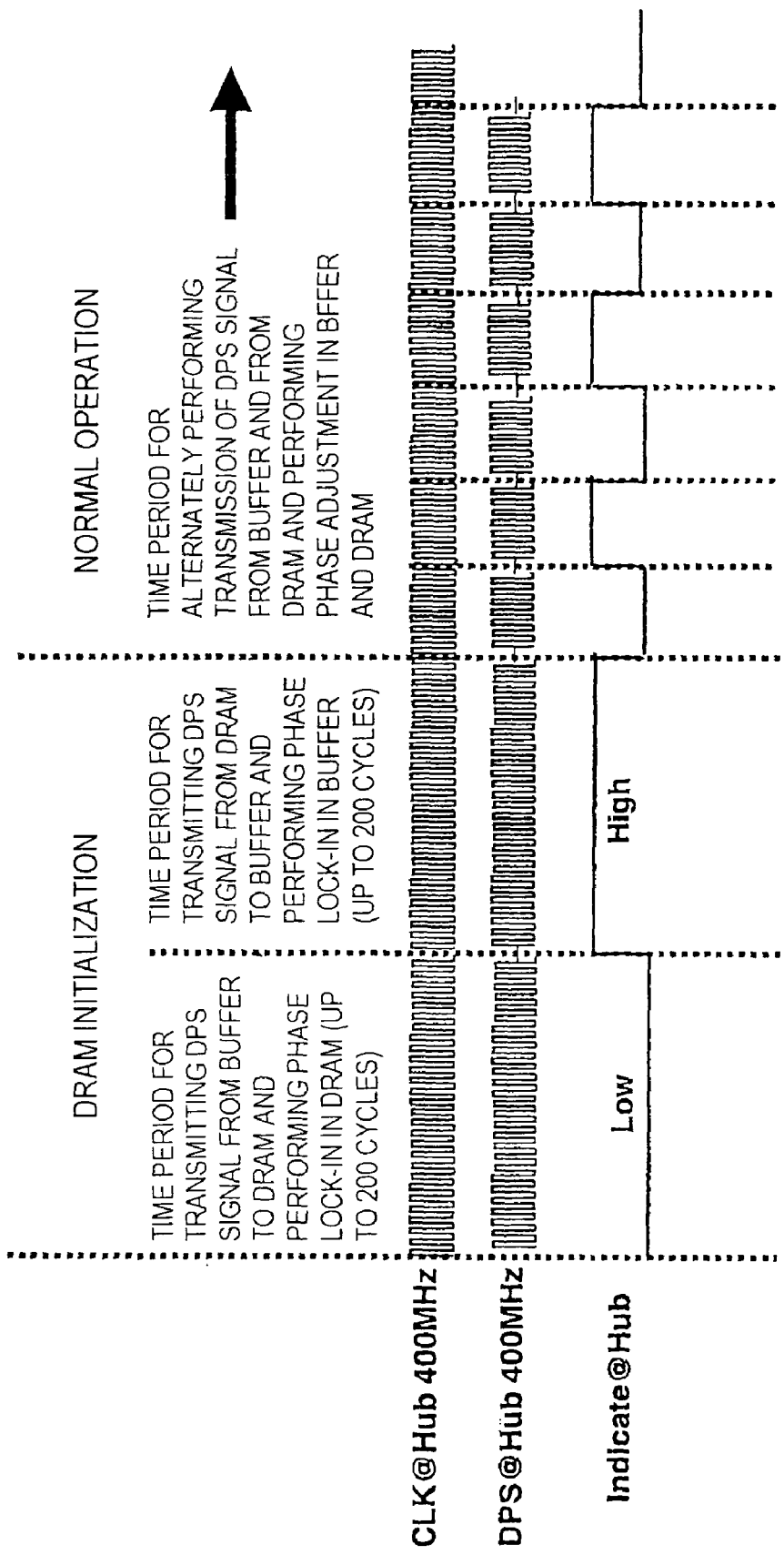
FIG. 63 is a timing chart for explaining a case wherein an operation during initialization of the DRAM and an operation during a normal operation thereof differ from each other in the third example.

FIG. 63 shows a case wherein a switching time period of the indicate is set long during initialization for allowing the DLLs to lock on, while the switching time period is set shorter during a normal operation for fine adjustment as compared with that during the initialization. In this manner, the buffer 105 can set the switching time period to be long during the initialization to thereby allow the DLLs to lock on, while it can set the switching time period to be shorter during the normal operation as compared with that during the initialization to thereby deal with fluctuation caused by operation noise. In this configuration, although a phase locking time at the DRAM becomes long during the initialization that requires fine adjustment, inasmuch as variation in phase due to operation noise is small, no problem is raised.

In the foregoing examples, the setup time and the hold time are estimated assuming that the period, i.e. the effective operation frequency, of the global clocks is 800 MHz. If the frequency is relaxed, the setup time and the hold time are also relaxed correspondingly, and therefore, the foregoing phase adjustment may be performed with the maximum frequency expected upon designing the memory module.

In the foregoing examples, the description has been given only about the memory systems in which the buffer is provided on the memory module. In other words, the description has been given only about the memory systems that can increase the number of memory modules. However, the present invention is also applicable to a memory system having a configuration in which a single memory module mounted thereon with no buffer is controlled by a memory controller. In the memory system of this type, the functions of the buffers in the foregoing examples may be implemented by the memory controller.

Figure 64:
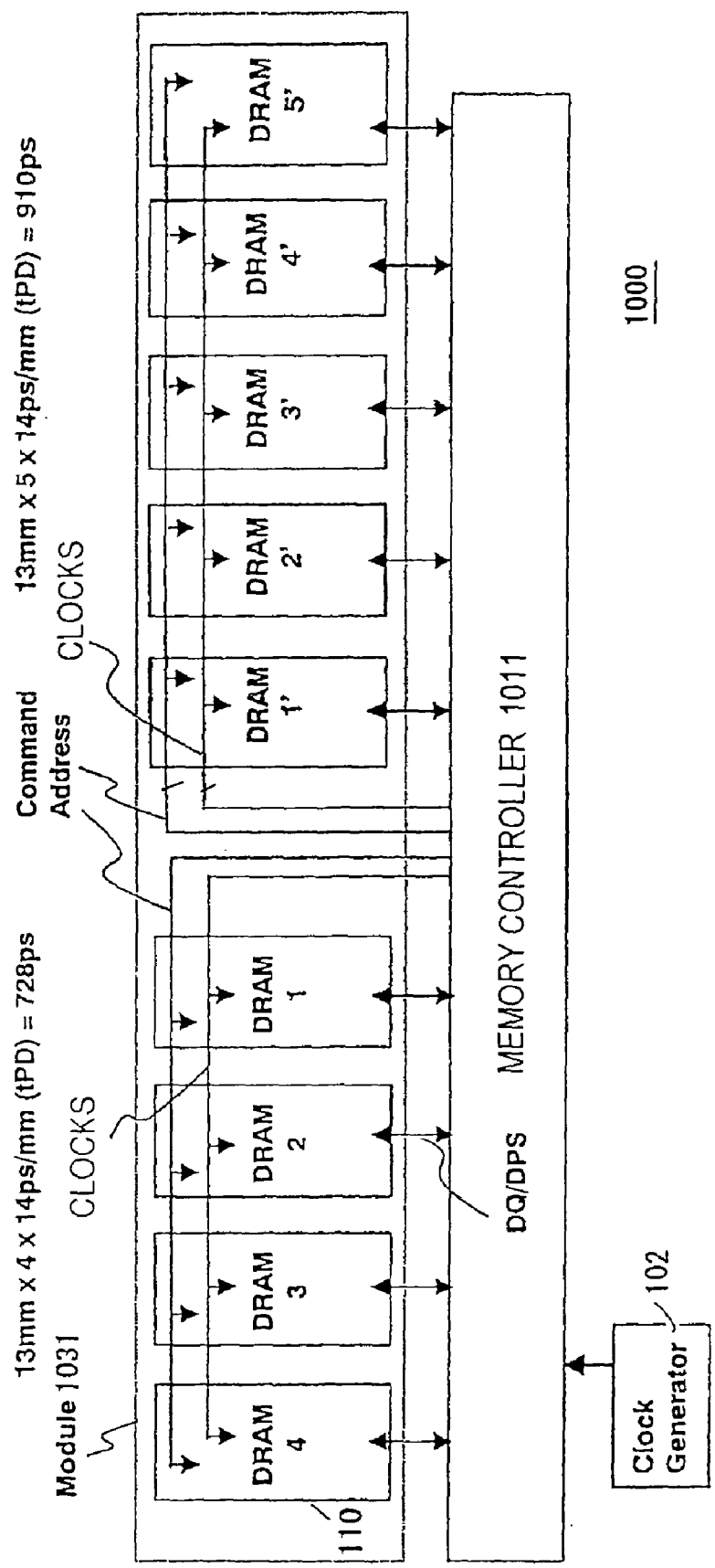
FIG. 64 is a block diagram for explaining a memory system according to a fourth example of the present invention.

Referring to FIG. 64, there is shown one example of the foregoing memory system as still another example of the present invention. The shown memory system 1000 comprises a memory controller 1011, a clock generator 102, and a single module 1031 on which four DRAMs 110 (1 to 4) and five DRAMs 110 (1' to 5') are mounted on the left side and the right side, respectively. In other words, the shown memory system 1000 is substantially the same as each of the memory systems shown in other figures wherein the memory controller 1011 is provided instead of the buffer 105. In the shown example, the memory controller 1011 and the DRAMs 110 are respectively connected to each other via data wirings DQ having the same length, and arrival times of data signals DQ from the memory controller 1011 at the respective DRAMs 110 are substantially the same.

On the module 1031, the left-side four DRAMs 110 (1 to 4) are connected to the memory controller 1011 via common clock wiring and common command/address wiring, while the right-side five DRAMs 110 (1' to 5') are also connected to the memory controller 1011 via other common clock wiring and common command/address wiring. That is, it is seen that the left-side DRAMs 110 (1 to 4) and the right-side DRAMs 110 (1' to 5') are connected to the memory controller 1011 via the separate clock wirings and command/address wirings.

With respect to the DRAMs 110 (4) and (5') disposed at far ends in the memory system having the shown topologies, there are large differences in wiring length between the clock wiring and the address/command wiring relative to the memory controller 1011, and the data wiring DQ relative to the memory controller 1011.

Therefore, a propagation delay difference between the clock signal (command/address signal) and the data signal DQ from the memory controller 1011 at the DRAMs 110 (4) and (5') becomes larger than that in the foregoing modules.

For example, in the shown example, assuming that a DRAM pitch is 13 mm and a signal unit propagation time tPD is 14 ps/mm, a delay of the command/address signal on the module 1031 becomes 728 ps (13×4×14) at the DRAM 110 (4), while it becomes 910 ps (13×5×14) at the DRAM 110 (5'). Assuming that propagation delays of the clock and command/address signals and the data signal DQ from the memory controller 1011 to input terminals of the module 1031 are equal to each other, the foregoing delays on the module 1031 become skew differences between the command/address signal and the data signal DQ, respectively.

Figure 65:
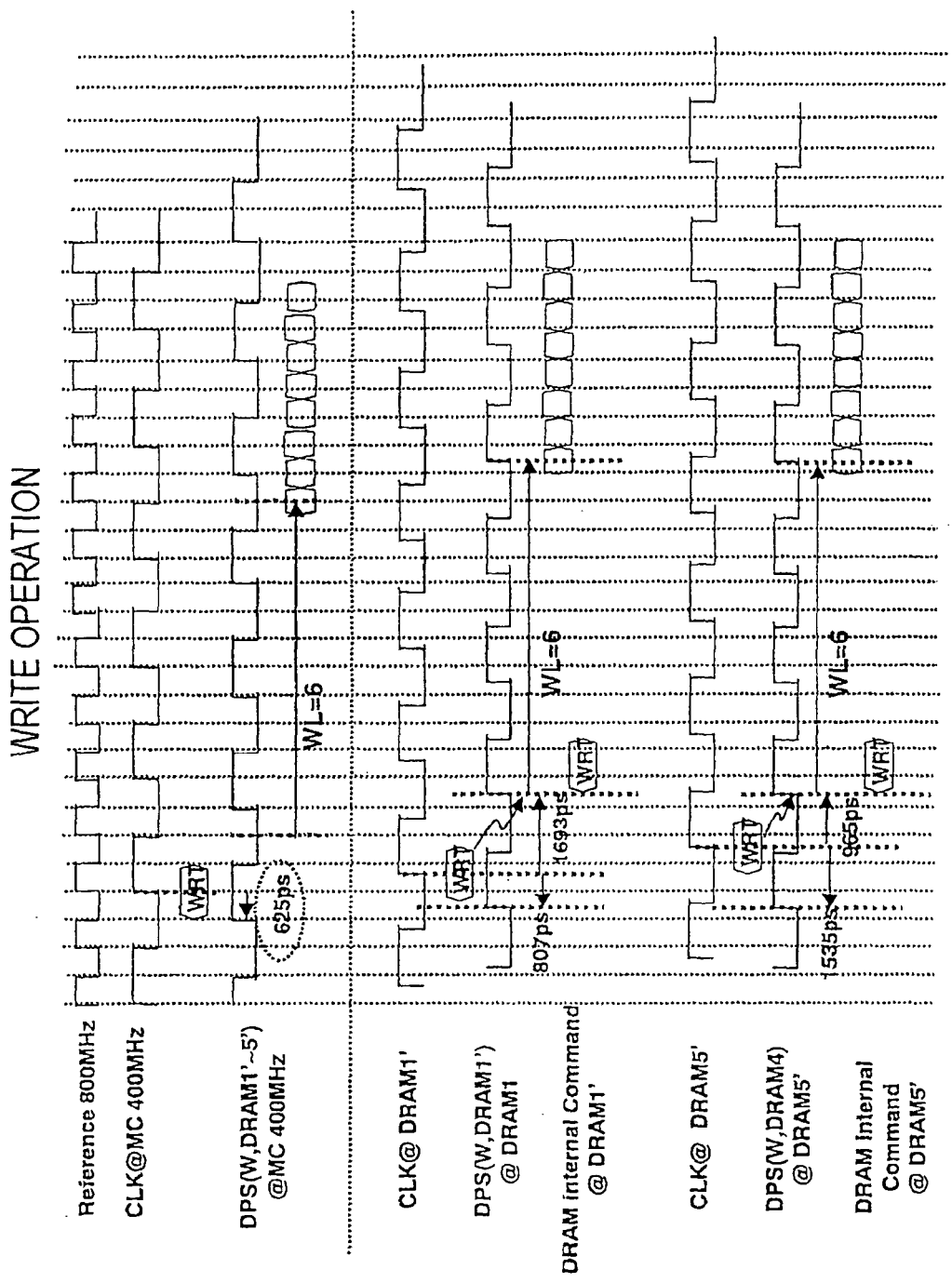
FIG. 65 is a time chart for explaining a write operation in the memory system shown in FIG. 64.

The memory system 1000 according to the fourth example of the present invention processes those skew differences using the domain crossing technique that employs the foregoing DPS (Data Phase Signal). Referring to FIG. 65, there is shown a write operation in the memory system 1000 shown in FIG. 64. First, the clock generator 102 generates reference clocks (i.e. system clocks) of 800 MHz and feeds them to the memory controller 1011. The memory controller 1011 divides the reference clocks (system clocks) to half in frequency to produce system clocks of 400 MHz, while produces a write command (WRT) synchronously with the produced system clocks.

Further, in the memory controller 1011 shown in FIG. 64, a DPS (WDPS) advanced by 90 degrees relative to the clock signal is produced, and this WDPS is transmitted to the DRAMs 110. In FIG. 65, there is shown a case wherein the WDPS is transmitted only to the DRAMs 110 (1' to 5'). By producing the DPS having an advanced phase relative to the clock signal, there can be ensured margins to a setup time and a hold time for domain-crossing a command/address signal from the clock phase to the DPS phase, i.e. the data signal DQ phase in the DRAM 110. That is, by using the DPS with the shifted phase relative to the clock signal, it is possible to perform timing adjustment for the domain crossing.

In FIG. 65, when the write command (WRT) is received at the DRAM 110 (1') synchronously with the clock signal, the WRT is caused to match with the DPS received at the DRAM 110 (1') so as to be produced as a DRAM internal command signal (DRAM internal Command). After a lapse of 6 write latency time subsequently to the production of the DRAM internal command signal, a data signal write operation is implemented in the DRAM 110 (1').

On the other hand, the clock signal and the WRT are given to the DRAM 110 (5') with a delay as compared with the DRAM 110 (1'), and the DPS is also given thereto with a delay of 965 ps relative to the clock signal. In this state, at the DRAM 110 (5'), the WRT is caused to match with the DPS so as to be produced as an internal command signal (DRAM internal Command). As clear from FIG. 65, it is understood that, by implementing the foregoing domain crossing, a sufficient setup time and hold time are ensured in the DRAMs 110 (1') and (5').

Figure 66:
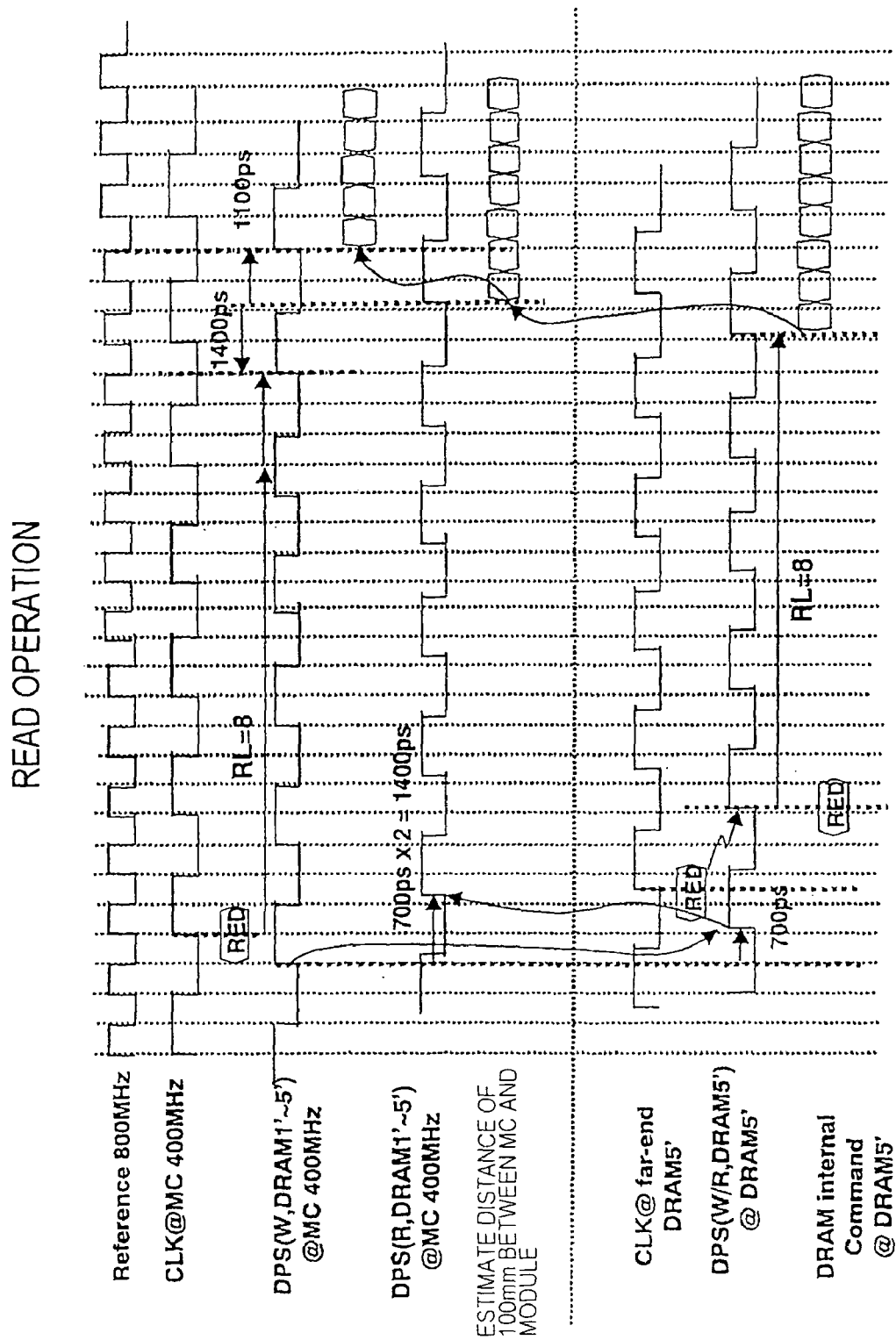
FIG. 66 is a time chart for explaining a read operation in the memory system shown in FIG. 64.

Referring to FIG. 66, there is shown a read operation in the memory system 1000 shown in FIG. 64. Like in the write operation, the memory controller (MC) 1011 produces a read command (RED) synchronously with the clock signal of 400 MHz. Further, the memory controller (MC) 1101 produces a DPS (RDPS) having a phase advanced by 90 degrees relative to the clock signal.

The clock signal (CLK) and the read command (RED) from the memory controller 1011 arrive at the DRAMs 110 (1' to 5') after mutually different propagation delay times, while the DPS arrives at the DRAMs 110 (1' to 5') at substantially the same timing via the equal-length data wirings.

Taking the far-end DRAM 110 (5') as an example, the DRAM 110 (5') receives the read command (RED) synchronously with the clock signal, and further receives the DPS. Like the DPS given to the other DRAMs 110, the subject DPS is fed to the far-end DRAM 110 (5') after a lapse of a delay time of 700 ps subsequently to the production thereof at the memory controller (MC). In the far-end DRAM 110 (5'), the RED received synchronously with the clock signal is caused to match with the DPS received at the far-end DRAM 110 (5'), so as to be produced as an internal command signal (DRAM internal Command). In this manner, the domain crossing is carried out from the timing of the clock signal to the timing of the DPS.

On the other hand, in the memory system 1000 shown in FIG. 64, arrival times of data signals DQ from the memory controller 1011 at the respective DRAMs 110 are substantially the same. However, in the memory controller 1011, it is necessary to identify a data signal DQ received from each DRAM 110 as to which of the read commands (RED) the received data DQ corresponds to. Accordingly, the memory controller 1011 receives the DPS from each DRAM 110 and causes the timing of the received DPS to match with the timing of a WDPS of the memory controller (MC), i.e. performs the domain crossing. At the memory controller (MC) 1011, a data signal DQ read from the DRAM 110 is received synchronously with a DPS(R) from the DRAM 110, and caused to match with the timing of the DPS(W) of the memory controller (MC) 1011. That is, at the memory controller (MC) 1011, the data signal DQ received at the phase of the DPS(R) is shifted to the phase of the DPS(W), i.e. returned to the phase of the clock signal.

Therefore, in the memory controller (MC) 1011, by counting the number of clocks from the issuance of the read command (RED), it is possible to identify the data signal DQ as to which of the read commands (RED) it corresponds to.

In FIG. 66, it is assumed that an interval between the memory controller (MC) 1011 and the module 1031 is 100 mm. In this case, a delay time from transmission of a DPS(W) to reception of a DPS(R) having a corresponding phase at the memory controller (MC) 1011 is 1400 ps, and a setup time and a hold time for domain crossing in this case become 1400 ps and 1100 ps, respectively, so that a sufficient timing margin can be obtained.

In FIG. 66, the DPS(W) is transmitted to the DRAMs 110 from the memory controller (MC) 1011, and the DPS(R) having the same phase as the received DPS(W) is transmitted from the DRAMs 110 to the memory controller (MC) 1011.

Therefore, it is understood that this embodiment employs the system wherein the DPS is transmitted bidirectionally on the same DPS wiring. Thus, actually, the configuration is employed wherein the memory controller (MC) 1011 and each DRAM 110 transmit the DPS alternately, and the internal clock signal is reproduced based on the received DPS.

Further, in the example shown in FIG. 64, two pairs of command/address signals and clock signals are produced from the memory controller (MC) 1011 relative to the memory module 1031. On the other hand, like operations can be achieved when a pair of command/address signal and clock signal are produced from the memory controller (MC) 1011.

Figure 67:
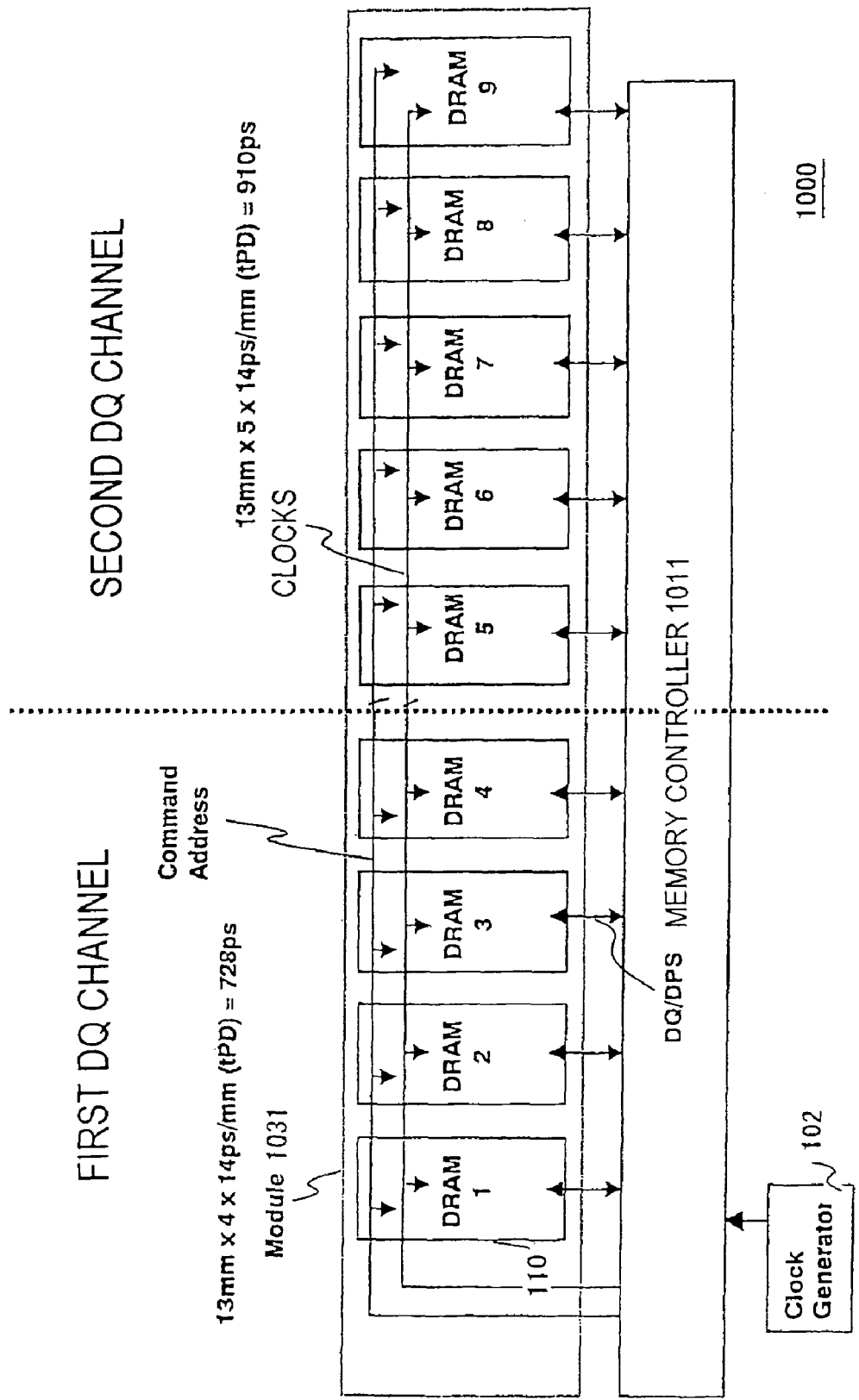
FIG. 67 is a block diagram for explaining a memory system according to a fifth example of the present invention.

Referring to FIG. 67, a memory system 1000 according to a fifth example of the present invention is provided with a configuration in which nine DRAMs 110 (1) to (9) are mounted on a module 1031 like in FIG. 64, wherein a command/address signal and a clock signal that are common to all the DRAMs 110 are fed from a memory controller 1011 to those nine DRAMs 110 via a left end of the module 1031. That is, the nine DRAMs 110 share the command/address signal and the clock signal. In this case, assuming that the propagation delay occurs like in FIG. 64, a propagation delay difference of (728+910) ps (=1638 ps) occurs in the command/address signal and the clock signal relative to a data signal DQ at the farthest end DRAM 110 (9). Even if the domain crossing is implemented with the period of 2500 ps of the clock signal subjected to the frequency division to half, it is difficult to ensure a timing margin for domain crossing that is sufficient for dealing with such a large propagation delay difference. For ensuring a timing margin for sufficient domain crossing, it is considered to use clocks having a period that is longer than that obtained by the frequency division to half.

On the other hand, as another technique to ensure a sufficient time margin necessary for domain crossing while using the clocks subjected to the frequency division to half, it is considered to divide the DRAMs 110 on the module 1031 into two groups (herein called "first and second DQ channels") as shown in FIG. 67. In this case, in the memory controller (MC) 1011, phases of DPS(W) given to the first and second DQ channels are mutually shifted relative to the clock signal. That is, in the shown memory controller (MC) 1011, phase offset values of the DPS(W) relative to the clock signal are set to values suitable for the first and second DQ channels.

In the shown example, the phase of the DPS(W) is advanced by 90 degrees relative to the clock signal for the first DQ channel, while the DPS(W) is transmitted in phase with the clock signal for the second DQ channel.

Figure 68:
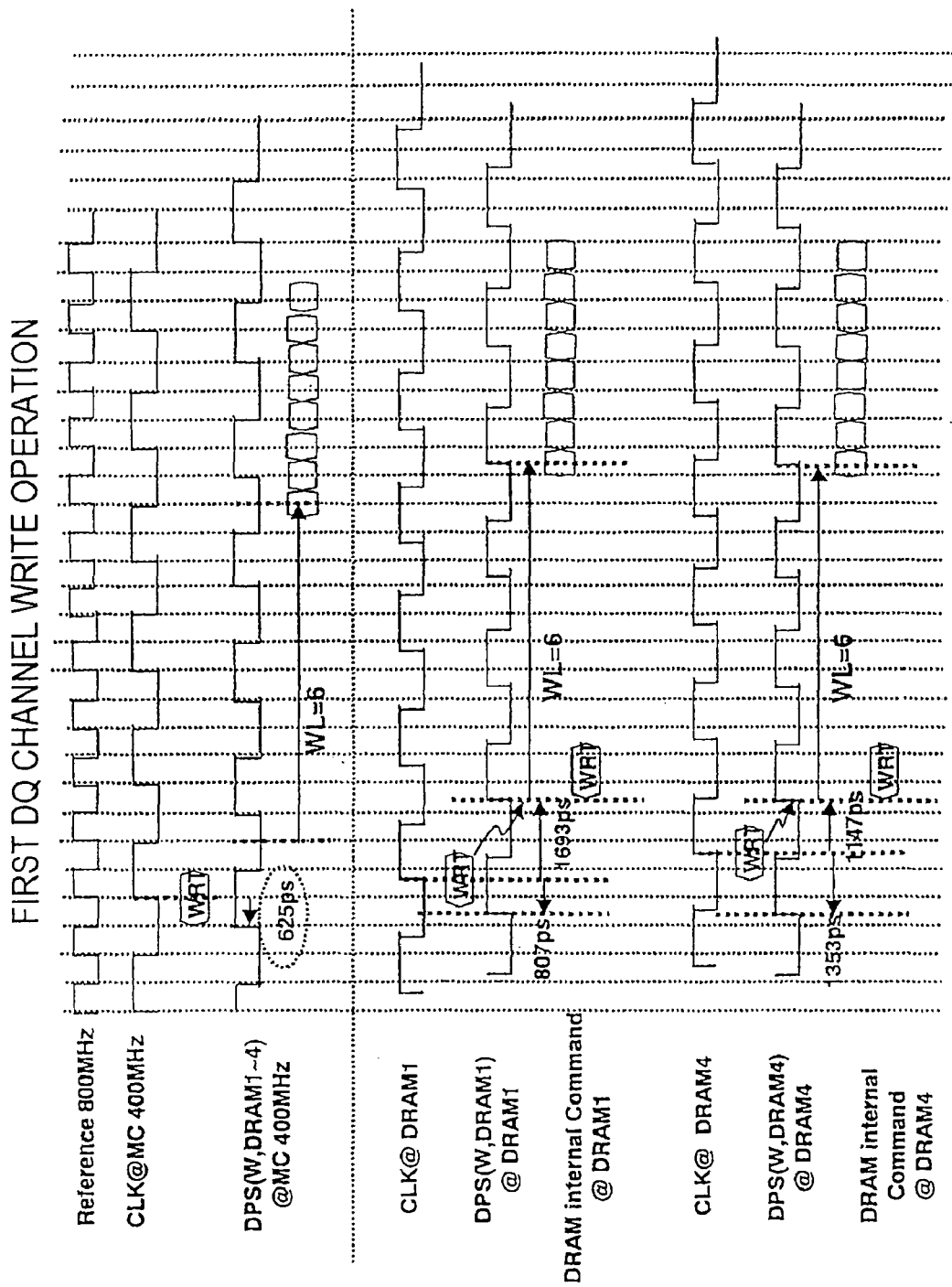
FIG. 68 is a time chart for explaining a write operation of a first DQ channel portion in the memory system shown in FIG. 67.

Referring to FIG. 68, description will be given about a write operation in the DRAMs 110 (1) to (4) belonging to the first DQ channel. First, the memory controller (MC) 1011 divides to half in frequency a reference clock signal of 800 MHz generated by a clock generator 102, thereby to produce a clock signal of 400 MHz. This clock signal is fed to the DRAMs 110 (1) to (4) belonging to the first DQ channel via clock wiring. The memory controller (MC) 1011 further feeds a write command WRT onto command/address wiring synchronously with the produced clock signal.

On the other hand, DPS(W) are fed to the DRAMs 110 (1) to (4) of the first DQ channel via DPS wirings each having a length of about 100 mm. In this case, as clear from FIG. 68, the phase of the DPS(W) is advanced by 90 degrees (i.e. 625 ps) relative to the phase of the clock signal.

The DPS(W) produced at the memory controller (MC) 1011 arrive at the DRAMs 110 (1) to (4) of the first DQ channel via the DPS wirings. On the other hand, the clock signal and the write command (WRT) arrive at the DRAMs 110 (1) to (4) of the first DQ channel via the clock wiring and the command/address wiring. Inasmuch as the clock wiring and the command/address wiring are each longer than the DPS wiring, a propagation delay time of the clock signal and the write command (WRT) becomes long, so that a propagation delay time difference between the DPS and the write command (WRT) is increased to 807 ps at the DRAM 110 (1). At the DRAM 110 (1), a DRAM internal command is produced at a time instant where 1693 ps has elapsed after reception of the WRT. This means that, at the DRAM 110 (1), the write command (WRT) matched with the clock signal is caused to match with the timing of the received DPS.

Further, among the DRAMs 110 belonging to the first DQ channel, a propagation delay time difference between the DPS(W) and the clock signal at the far-end DRAM 110 (4) becomes 1353 ps. Also in this case, by matching the write command (WRT) with the timing of the DPS, a time margin of 1147 ps can be ensured. With this time margin, it is possible to ensure a setup time and a hold time necessary for domain crossing.

Figure 69:
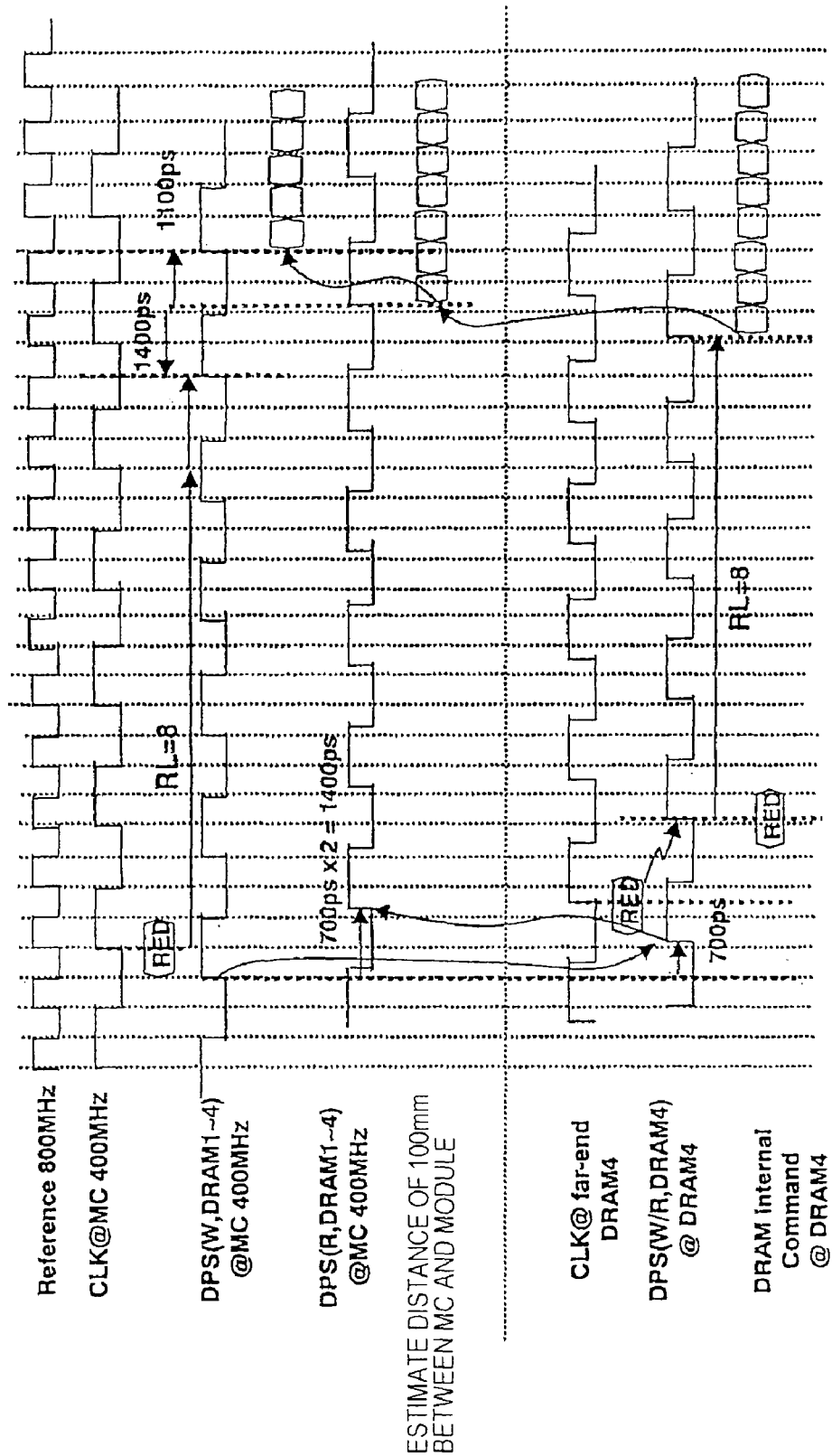
FIG. 69 is a time chart for explaining a read operation of the first DQ channel portion.

Referring to FIG. 69, there is shown a read operation in the DRAMs 110 (1) to (4) belonging to the first DQ channel. Also in this example, a read command (RED) is fed to the DRAMs 110 (1) to (4) from the memory controller (MC) 1011 synchronously with the clock signal, and a DPS is produced as being advanced by 90 degrees relative to the clock signal, which is like the case of the write operation. Here, assuming that a distance between the memory controller (MC) 1011 and the module 1031 is 100 mm, and a signal unit propagation time tPD is 7 ps/mm, the DPS arrives at the DRAM 110 (4) after 700 ps. The DRAM 110 (4) causes the read command (RED) to match with the DPS to thereby produce an internal read command, and transmits a DPS(R) to the memory controller (MC) 1011. This DPS(R) is received at the memory controller (MC) 1011 after a lapse of 1400 ps subsequently to the production of the DPS(W). A data signal DQ from the DRAM 110 (4) is received at the memory controller (MC) 1011 at timing matched with the DPS(R).

By domain-crossing the timing of the received DPS(R) to the timing of the DPS(W), the memory controller (MC) 1011 causes the timing of the data signal DQ to match with the timing of the DPS(W). By this, a time margin of (1400+ 1100), i.e. 2500 ps, can be obtained also during the read operation.

Figure 70:
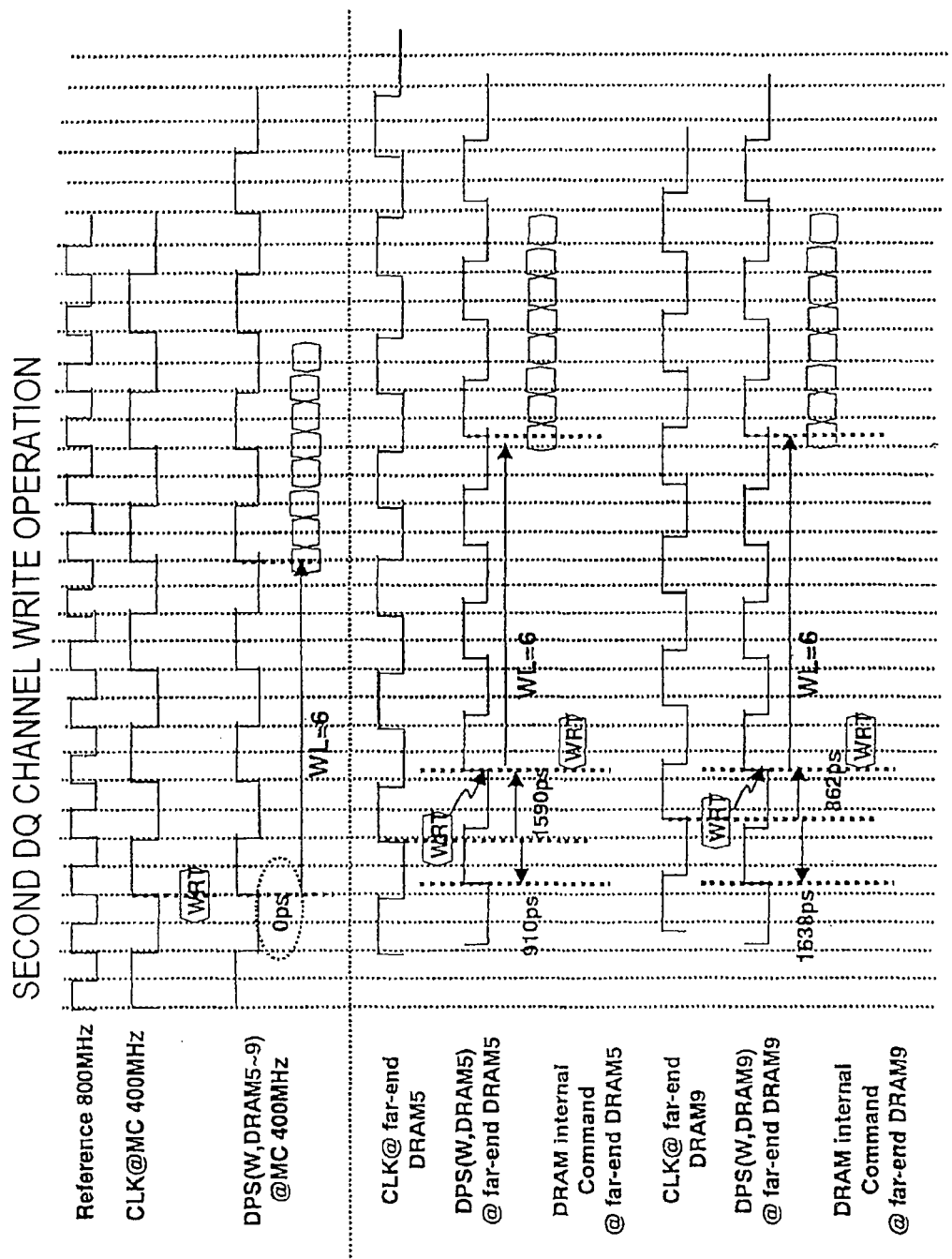
FIG. 70 is a time chart for explaining a write operation of a second DQ channel portion in the memory system shown in FIG. 67.

Now, referring to FIG. 70, description will be given about a write operation of the DRAMs 110 (5) to (9) belonging to a second DQ channel in the memory system 1000 shown in FIG. 67. As clear from FIG. 70, with respect to the second channel, the memory controller (MC) 1011 produces a clock signal of 400 Hz and a write command WRT matched with the clock signal, and further produces a DPS(W) having the same phase as the clock signal. In this manner, in this example, an offset value corresponding to 90 degrees of the clock signal is set between the DPS(W) for the DRAMs 110 (5) to (9) belonging to the second DQ channel and the DPS(W) for the DRAMs 110 (1) to (4) belonging to the first DQ channel, thereby to enable domain crossing even if there is a large propagation delay difference between the clock signal and the data signal DQ.

Specifically, the clock signal (CLK) and the WRT from the memory controller (MC) 1011 arrive at the DRAMs 110 (5) to (9) of the second DQ channel via the long wirings, while the DPS(W) are given to the DRAMs 110 (5) to (9) via the relatively short DPS wirings. In FIG. 70, operations of only the DRAMs 110 (5) and (9) are shown.

As clear from FIG. 67, the DPS(W) reaches the DRAM 110 (5) 910 ps earlier than the clock signal and the WRT and, after 1590 ps, is caused to match with the DPS(W) received at the DRAM 110 (5). Therefore, at the DRAM 110 (5), it is possible to ensure a setup time and a hold time necessary for domain crossing.

On the other hand, as clear from FIG. 67, the clock signal and the WRT, after having been produced at the memory controller (MC) 1011, arrive at the DRAM 110 (9) with a delay of 1638 ps relative to the DPS(W). At the farthest-end DRAM 110 (9), the received WRT is caused to match with the received DPS(W), thereby to produce an internal command. In this event, since there is a time margin of 862 ps between the WRT and DPS(W), it is seen that a setup time and a hold time necessary for domain crossing are ensured.

Figure 71:
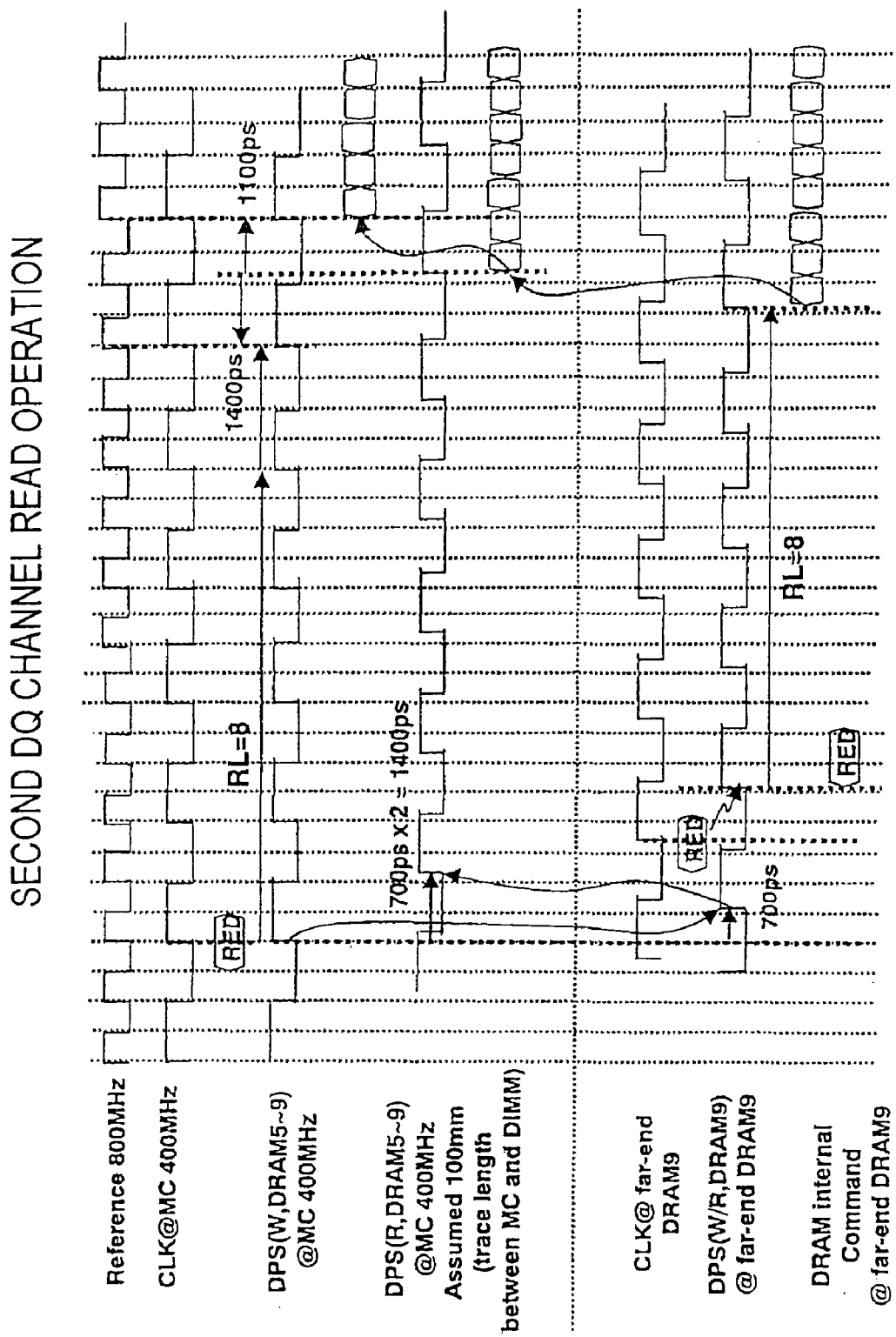
FIG. 71 is a time chart for explaining a read operation of the second DQ channel portion.

Referring to FIG. 71, description will be given about a read operation in the DRAMs 110 (5) to (9) of the second DQ channel. Also in this case, a clock signal and a read command (RED) are transmitted, in phase with DPS(W), to the DRAMs 110 (5) to (9) from the memory controller (MC) 1011.

Among the DRAMs 110 of the second DQ channel, the DPS(W) arrives at the farthest-end DRAM 110(9) 1638 ps earlier than the RED like in case of the WRT. As a result, the RED is caused to shift from the timing of the clock signal to the timing of the DPS(W) received at the DRAM 110 (9).

On the other hand, when the DPS(W) is produced at the memory controller (MC) 1011, the DPS(W) reaches the DRAM 110 (9) after a lapse of 700 ps, and the received DPS(W) is, as it is, transmitted to the memory controller (MC) 1011 from the DRAM 110 (9) as a DPS(R), so that a DPS(R) delayed by 1400 ps is produced at the memory controller (MC) 1011.

A data signal DQ from the DRAM 110 (9) is transmitted to the memory controller (MC) 1011 at timing of the DPS(R). At the memory controller (MC) 1011, as shown in FIG. 71, the data signal DQ transmitted at the timing of the DPS(R) is caused to match with the timing of the DPS(W) in the memory controller (MC) 1011. A time margin at this time is, as shown in the figure, 2500 ps, and therefore, it is seen that a time margin sufficient for performing domain crossing can be ensured.

As described above, although a time difference corresponding to the offset is generated between the channels with respect to the read data signals DQ in the memory controller (MC) 1011, a time margin necessary for domain crossing from the DPS(R) to the clock phase is sufficiently ensured.

As described above, since the memory controller 1011 operates in response to the system clocks from the clock generator 102 so as to achieve the operations like the buffer in the first to third examples, the global clocks and the system clocks given to the buffer and the memory controller 1011 can be collectively called main clocks.

In the present invention, a memory system includes a memory controller and a module mounted with memory circuits and a buffer. Wiring including data wiring between the memory controller and the memory circuits on the module is achieved via the buffer, and wiring including data wiring connects buffers on modules in case mode. Accordingly, it is not necessary to branch the wiring per module, and therefore, reflections caused by impedance mismatching can be prevented to enable a system that can operate at high speed at high frequencies. Further, according to the present invention, a transmission speed between the memory controller and the buffer is set to be higher than a transmission speed between the buffer and the memory circuits. This makes it possible to increase the number of modules to be connected to the memory controller. Further, it is possible to configure a system that does not rely on a write/read speed of the memory circuits.

According to one embodiment of the present invention, not only the data wiring, but also the clock wiring and the command/address wiring connect buffers on the modules from the memory controller. This can make substantially equal distances between the memory controller and the respective memory circuits mounted on the module. Therefore, timing differences caused by a different delay time per wiring can be avoided. Further, according to another embodiment of the present invention, by providing a plurality of buffers on each module and connecting each buffer to memory circuits on the module, a load applied to each buffer and the wiring can be dispersed. Further, according to another embodiment of the present invention, memory circuits to be selected simultaneously are disposed over a plurality of modules, and a buffer of each module is individually connected to a memory controller. This makes it possible to disperse a load applied to each buffer, without increasing the number of buffers.

What is claimed is:

1. A data transmission method for transmitting/receiving data bidirectionally between a first and a second device, said first device receiving data according to first internal clocks, and said second device receiving data according to second internal clocks, wherein a first and a second data phase signal are continuously transmitted bidirectionally on the same wiring between said first and second devices at timing that avoids collision therebetween, said first device refers to timing of said first data phase signal to thereby transmit data to said second device, while said second device refers to timing of said second data phase signal to thereby transit data to said first device.

2. A data transmission method according to claim 1, wherein said second device produces said second internal clocks according to the received first data phase signal and receives the data from said first device according to said second internal clocks, while said first device produces said first internal clocks according to the received second data phase signal, produces said second data phase signal according to said first internal clocks, and receives the data from said second device according to said first internal clocks.

3. A data transmission method according to claim 1, wherein said first device suppresses said first data phase signal outputted from said first device from said first and second data phase signals transmitted bidirectionally, while said second device suppresses said second data phase signal outputted from said second device in said first and second data phase signals transmitted bidirectionally.

4. A data transmission method according to claim 1, wherein said first and second devices are a buffer and a DRAM, respectively, and said DRAM is given external clocks and produces said second internal clocks based on said external clocks and said received first data phase signal.

5. A data transmission method according to claim 1, wherein said first and second devices produce said first and second internal clocks from said second and first data phase signals using DLLs.

6. A data transmission system for transmitting/receiving data between a first and a second device, wherein a transmission side of said first and second devices has means for transmitting, upon transmission of said data, a data phase signal representing a predetermined phase of said data continuously irrespective of transmission of said data, and a reception side of said first and second devices has means for reproducing internal clocks of said reception side based on said data phase signal and receiving said data according to the reproduced internal clocks.

7. A data transmission system for transmitting/receiving data bidirectionally between a first and a second device, wherein each of said first and second devices has transmission means for transmitting, upon transmission of said data, a data phase signal representing a predetermined phase of said data continuously irrespective of transmission of said data, and transmitting said data based on said data phase signal, and reception means for reproducing data reception internal clocks based on said data phase signal and receiving said data according to the reproduced internal clocks.

8. A data transmission system according to claim 7, wherein said first and second devices are a buffer and a DRAM, respectively, the transmission means of said buffer has means for outputting a write data phase signal to said DRAM as said data phase signal, the reception means of said buffer has means for receiving a read data phase signal from said DRAM as said data phase signal, the reception means of said DRAM has means for reproducing said data reception internal clocks from said write data phase signal, and the means for receiving said data according to said reproduced internal clocks, and the transmission means of said DRAM has means for outputting a read data phase signal as said data phase signal at timing relying on said received write data phase signal.

9. A data transmission system according to claim 8, wherein said write data phase signal and said read data phase signal are bidirectionally transmitted onto the same signal line at mutually different timing.

10. A data transmission system according to claim 8, wherein said write data phase signal and said read data phase signal are bidirectionally transmitted onto mutually different signal lines at mutually different timing.

11. A data transmission system according to claim 8, wherein said read data phase signal reception means of said buffer has means for reproducing data reception buffer internal clocks based on buffer internal clocks and said read data phase signal, and said read data phase signal output means of said DRAM has means for reproducing DRAM internal clocks for outputting said read data phase signal, based on external clocks and said write data phase signal.

* * * * *